(12) United States Patent
Yamazaki

(10) Patent No.: US 6,862,247 B2
(45) Date of Patent: Mar. 1, 2005

(54) PSEUDO-STATIC SYNCHRONOUS SEMICONDUCTOR MEMORY DEVICE

(75) Inventor: Akira Yamazaki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/670,394

(22) Filed: Sep. 26, 2003

(65) Prior Publication Data

US 2004/0165472 A1 Aug. 26, 2004

(30) Foreign Application Priority Data

Feb. 24, 2003 (JP) ......................................... 2003-046109

(51) Int. Cl.[7] ............................................... G11C 8/00
(52) U.S. Cl. ................. 365/233; 365/233.5; 365/230.01
(58) Field of Search .............................. 365/233, 233.5, 365/230.01, 230.04

(56) References Cited

U.S. PATENT DOCUMENTS 5,513,327 A * 4/1996 Farmwald et al. .......... 710/305
6,714,479 B2 * 3/2004 Takahashi et al. ....... 365/233.5

FOREIGN PATENT DOCUMENTS

JP          2-87399          3/1990

* cited by examiner

*Primary Examiner*—Connie C. Yoha
(74) *Attorney, Agent, or Firm*—McDermott Will & Emery LLP

(57) ABSTRACT

For a pseudo-SRAM (Static Random Access Memory) macro operating in synchronization with a clock signal, a page operation instructing signal instructing a page operation and a page close instructing signal instructing completion of the page operation are prepared as control signals designating operation modes. A pseudo-SRAM can be selectively operated in a page mode in accordance with the page operation instructing signal and the page close instructing signal, and an operation of row-related circuitry in each clock cycle can be inhibited so that an average power consumption can be reduced. The power consumption of the pseudo-SRAM can be reduced without lowering an operation speed.

10 Claims, 29 Drawing Sheets

| MNEMONIC | CONTROL SIGNAL | | | | | FUNCTION |
|---|---|---|---|---|---|---|
| | RE | WE | REF | PM | PC | |
| NOP | L | L | L | L | L | NO OPERATION |
| RE | H | L | L | L | L | READ, THEN CLOSE PAGE |
| REPM | H | L | L | H | L | READ, THEN KEEP PAGE OPEN |
| REPC | H | L | L | L | H | READ WHILE PAGE IS OPEN, THEN CLOSE PAGE |
| WE | L | H | L | L | L | WRITE, THEN CLOSE PAGE |
| WEPM | L | H | L | H | L | WRITE, THEN KEEP PAGE OPEN |
| WEPC | L | H | L | L | H | WRITE WHILE PAGE IS OPEN, THEN CLOSE PAGE |
| PC | L | L | L | L | H | CLOSE OPEN PAGE |
| REF | L | L | H | L | L | AUTO-REFRESH |

| MNEMONIC | RE | WE | REF | PM | PC | FUNCTION |
|---|---|---|---|---|---|---|
| MRS | H | H | H | H | H | MODE REGISTER SET |

|  | A[16:1] | A[0] |
|---|---|---|
| WITHOUT PAGE FUNCTION | DON'T CARE | L |
| WITH PAGE FUNCTION | DON'T CARE | H |

PSEUDO-STATIC SYNCHRONOUS SEMICONDUCTOR MEMORY DEVICE

BACKGROUND OF THE INVENTION

1. Field of the Invention

The present invention relates to a synchronous semiconductor memory device taking in external signals and transferring data in synchronization with a clock signal, and particularly, to a DRAM (Dynamic Random Access Memory) integrated on a semiconductor substrate together with a logic. More particularly, the invention relates to a structure for reducing power consumption of a DRAM operating, in a pseudo manner, as an SRAM (Static Random Access Memory), i.e., a pseudo-SRAM.

2. Description of the Background Art

In recent years, a system LSI having a processor, a memory and others integrated on a single semiconductor chip to implement one system with one semiconductor chip, has been widely used for reducing a system size and required power. In such system LSI, a storage capacity of an on-chip memory has been increased with improvement in function and performance of the system. Conventionally, a high speed SRAM is used as the on-chip memory of the system LSI, and is used as a primary cache memory of a processor supported in the system LSI. As a main storage, an off-chip DRAM is used. As described above, even in the system LSI, a hierarchical structure of the memories is employed for the following reasons. As is well known, a gap in operation frequency between a processor and a DRAM is increasing year after year. Therefore, when the processor directly accesses the DRAM, the processor must wait an increased time for data transmission, and this causes a bottleneck to degrade the system performance.

Thus, localization of data access of the processor is utilized, a high speed SRAM is internally arranged, and a part of a DRAM memory space of the main storage is buffered in the high speed SRAM. The processor accesses the internal SRAM so that the wait time can be reduced and the system performance can be improved. However, when the processor accesses a portion outside the range of the memory space buffered in the internal SRAM, then the following procedure is required. Data buffered in the internal SRAM are transferred to the off-chip DRAM for rewriting (i.e., a copy-back operation is performed), and the data in a new memory space required by the processor are transferred from the DRAM to the internal SRAM to rewrite the data in the memory space buffered in the internal SRAM.

A data bus coupling the system LSI and the off-chip DRAM has a width ranging from 16 bits to 32 bits or so due to restriction on the number of pins of a system LSI package. Therefore, the data transfer must be performed by a relatively small bit width, and data transfer between the internal SRAM and the off-chip DRAM is performed being divided into a plurality of number of times of transferring data. Consequently, the data transfer becomes a bottleneck, which also lowers the system performance.

As a method for overcoming the problem in the system structure with DRAM of a main storage off-chip, recently such an architecture attracts a strong attention that a DRAM is embedded in the system LSI to expand the DRAM data bus width to 256 bits or more, and the data are transferred between the SRAM and the DRAM at a time. This large bus width significantly overcomes the problem associated with the bus bottleneck. However, the processor must be kept in a standby state during a period of data transfer between the SRAM and the DRAM accompanying the hierarchy of the memories. This still lowers the system performance.

As one of measures of overcoming the problem of performance deterioration due to the memory hierarchization, it can be considered to increase the memory capacity of the internal SRAM up to as large as the capacity of the main storage. In the case of a full CMOS structure, an SRAM cell is formed of six MOS transistors (insulated gate field effect transistors). However, a memory cell in the DRAM is generally formed of one capacitor and one MOS transistor. Therefore, the cell area of the SRAM is greater in cell area than the DRAM so that it is impossible with an on-chip SRAM to increase sufficiently the memory capacity of the on-chip memory.

Conversely, with a system structure, in which only a processor and a DRAM are employed, and no SRAM is employed, the system performance deteriorates due to a gap in operation frequency between the processor and the DRAM. For overcoming this, research has been actively conducted on a fast pseudo-SRAM using DRAM memory cells. The fast pseudo-SRAM includes memory cells formed of DRAM cells, but operates similarly to the SRAM when viewed externally. Therefore, a fast memory of a large storage capacity is supported on the system LSI on-chip, to eliminate the hierarchical structure of the memories, for aiming to improve the system performance. The structure of such a pseudo-SRAM is disclosed, e.g., in a prior art reference 1 (Japanese Patent Laying-Open No. 2-87399).

In the pseudo-SRAM disclosed in the prior art reference 1, a chip enable signal /CE is used for an external access control signal, similarly to a conventional SRAM. Further, row and column address signals are applied in parallel, and chip enable signal /CE is activated to internally activate row and column selecting operations in a predetermined sequence.

For refreshing data stored in the DRAM cells, a pin terminal not used in the SRAM or an output enable signal terminal is utilized as an input terminal of a refresh control signal /RFSH.

By toggling chip enable signal /CE, an access cycle is determined, and the row and column accesses are executed in accordance with activation of chip enable signal /CE so that this pseudo-SRAM can be operated similarly to the SRAM when viewed externally.

A fast pseudo-SRAM operates in synchronization with a clock signal, and internally completes activation and deactivation of the row- and column-related circuits in a self-timed manner within one clock cycle.

DRAM cells are arranged in rows and columns. Word lines are arranged corresponding to memory cell rows, respectively, and bit line pairs are arranged corresponding to memory cell columns, respectively. A sense amplifier for sensing, amplifying and latching data of a memory cell is arranged for each bit line pair. When row-related circuitry for row selection operates, a word line arranged corresponding to a row designated by a row address signal is driven to a selected state, and the sense amplifiers sense, amplify and latch the data of the memory cells connected to the selected word line. In this sensing operation, therefore, the sense amplifiers, which are equal in number to the memory cells in one row, operate at the same time.

When the column-related circuitry related to the column selection and data access (write/read of data) operates, a memory cell in a column designated by the column address signal is selected from the memory cells connected to the selected word line, and data access (write/read of the data)

is performed. In the column select operation, all the memory cells on the selected word line are not selected. The number of the selected memory cells depends on the number of data bits accessed by the processor (logic) at a time, and thus depends on a width of an external data bus of the pseudo-SRAM. For example, memory cells of 2 K bits are selected in the row select operation, and corresponding sense amplifiers latch the data of the selected memory cells. Then, memory cells (sense amplifiers) of 128 bits are selected, and data access is made.

In the fast pseudo-SRAM, the row and column select operations are completed within one clock cycle. In the operation of successive accessing to the fast pseudo-SRAM, therefore, the sense amplifiers charge and discharge the bit lines in each clock cycle. Therefore, if a selected row includes the memory cells of 2 K bits, 2K sense amplifiers simultaneously perform the charging and discharging operations in parallel. The data bits required by the processor (logic) is, e.g., 128 bits, and the data access is made to 128 sense amplifiers. The other sense amplifiers maintain the latching state with no data access, and merely restore the storage data of the DRAM cells in the corresponding columns. Therefore, the bit lines other than the bit lines accessed for data are also charged or discharged by associated sense amplifiers in each clock cycle, resulting in wastage of current. Particularly, if the above structure is used in a battery-powered device such as a portable device, it is desired to reduce current consumption in view of battery life.

The foregoing prior art reference 1 discloses a structure, in which a test is performed by setting a page mode under a condition of "/RFSH before /CE", similar to "CAS before RAS" condition of a standard DRAM, in a counter check mode of checking an address counter producing a refresh address. A refresh instructing signal /RFSH is lowered to an L level logical low level), and a word line is activated in accordance with a refresh address provided from an internal address counter. Then, a chip enable signal /CE is set to an L level to set the page mode, and the external column access is activated while maintaining the word line active. In this state, the column access is performed in accordance with an output enable signal /OE or write enable signal /WE. By toggling chip enable signal /CE, the column select operation is performed in accordance with an external column address. Refresh instructing signal /RFSH is set to an H level (logical high level), to complete the page mode operation.

In the structure of the prior art reference 1, a row designated by the refresh address is kept in the selected state, and the columns are successively selected in accordance with external column addresses to perform the data access. The column-related circuitry is tested by utilizing a counter check mode for testing an operation of the refresh address counter.

In the structure of the prior art reference 1, a timing condition, which is inhibited on the specification, is used to set the page mode in the test, for performing the test. A row to be selected is designated by the refresh address generated by the refresh address counter, and cannot be externally designated. Accordingly, this operation manner of the prior art reference 1 cannot be used for the data access in the normal operation mode.

In this prior art reference 1, the data access cycle is determined in accordance with toggling of chip enable signal /CE, and no consideration is given to how to internally activate and deactivate the row- and column-related circuits in a the self-timed manner within each clock cycle in the clock synchronous operations, i.e., operations synchronized with the clock signal.

This prior art stands on the premise that the page mode of changing the column address while fixing the row address could not be inherently supported on the pseudo-SRAM and merely intends to separate the refresh operation and the data input/output operation from each other. No consideration is given to the reduction of the power consumption in the normal operation mode, in which the data access is made, and particularly, in the clock synchronous operation, in which the data access is made in synchronization with the clock signal.

SUMMARY OF THE INVENTION

An object of the invention is to provide a synchronous semiconductor memory device operating SRAM-wise with low power consumption.

Another object of the invention is to provide a clock synchronous pseudo-SRAM allowing data access in a page mode.

A synchronous semiconductor memory device according to the invention includes: a plurality of dynamic memory cells arranged in rows and columns; a signal input circuit for taking in an external operation control signal in synchronization with a clock signal, and producing an internal operation instructing signal; a row select circuit for selecting, when activated, a row of the memory cells in accordance with an external row address signal; a column-related circuit for selecting, when activated, a column of the memory cells in accordance with an external column address signal, and performing data access to the selected column; and a control circuit for controlling operations of the row select circuit and the column-related circuit in accordance with an internal operation instructing signal received from the signal input circuit.

This control circuit operates in accordance with a first internal operation instructing signal provided from the signal input circuit to activate and deactivate successively the row select circuit and the column-related circuit within one clock cycle of the clock signal in a predetermined sequence, operates in accordance with a second internal operation instructing signal provided from the signal input circuit to inhibit deactivation of the row select circuit and maintain the row select circuit in the active state, and operates in accordance with a third internal operation instructing signal provided from the signal input circuit to deactivate the row select circuit maintained in the active state.

By internally inhibiting the deactivation of the row select circuit in accordance with the second internal operation instructing signal, the column select operation can be executed by externally and successively applying the column address signal while maintaining a row in the selected state. In the operation of successively accessing the columns, it is not necessary to operate row-related circuitry and particularly, it is not necessary to deactivate sense amplifiers. Consequently, it is possible to eliminate the charging/discharging currents of the row-related circuitry and particularly the sense amplifiers, and accordingly the current consumption can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
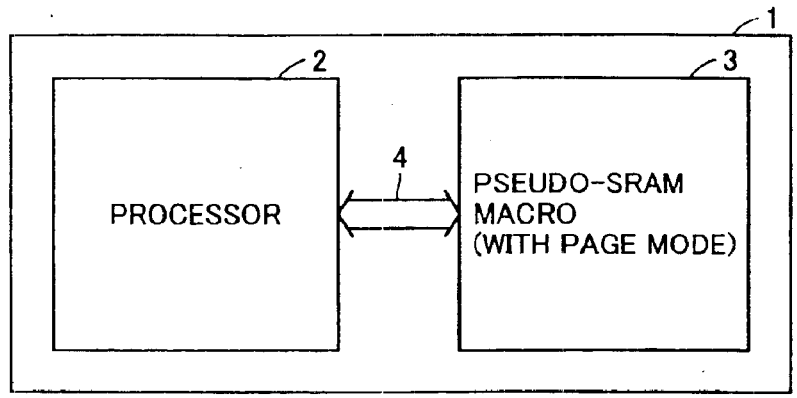
FIG. 1 schematically shows a structure of a system LSI including a pseudo-SRAM according to the invention.

FIG. 1 schematically shows a structure of a system LSI incorporating a synchronous semiconductor memory device according to the present invention. In FIG. 1, a system LSI 1 includes a processor 2 and a pseudo-SRAM macro 3 storing data required at least by processor 2. Processor 2 externally transmits and receives signals and data and executes required processing. Processor 2 may be a circuit dedicated to a predetermined processing, or may be a general-purpose processor.

Pseudo-SRAM macro 3 communicates data with processor 2 via an internal data bus 4. Pseudo-SRAM macro 3 can operate in a page mode, and processor 2 can access pseudo-SRAM macro 3 in a page mode for transferring data.

System LSI 1 is integrated on a common semiconductor chip. Internal data bus 4 is formed of on-chip interconnection lines, and can have a sufficiently large bus width without suffering from a restriction by pin terminals.

Since pseudo-SRAM macro 3 can operate in the page mode, precharging of the row-related circuitry is not required in each access cycle (clock cycle), and the row-related circuitry for the row selection maintains the active state. Therefore, current consumption by the row-related circuitry can be saved.

Figure 2:
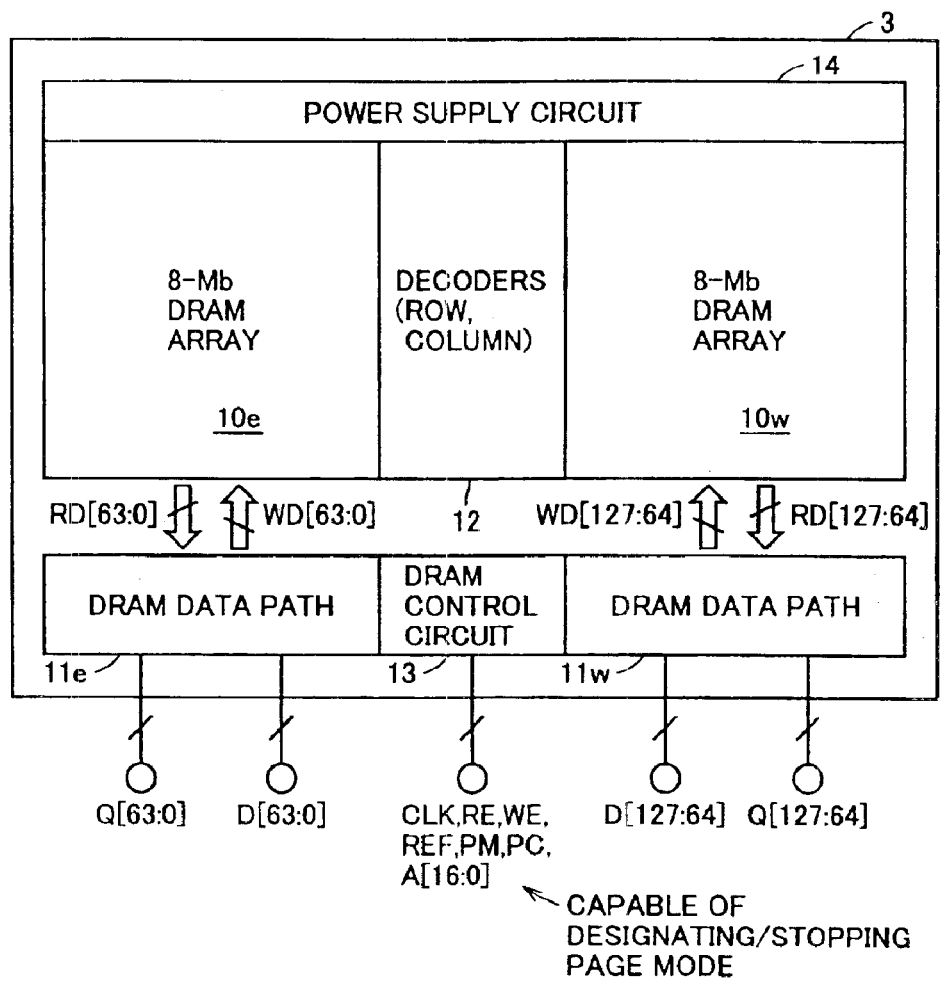
FIG. 2 schematically shows a whole structure of the pseudo-SRAM macro shown in FIG. 1.

FIG. 2 schematically shows a whole structure of pseudo-SRAM macro 3 shown in FIG. 1. In FIG. 2, pseudo-SRAM macro 3 includes DRAM arrays 10e and 10w each having a plurality of DRAM cells arranged in rows and columns, DRAM data paths 11e and 11w for transferring-internal data to and from DRAM arrays 10e and 10w, respectively, a decoder 12 for selecting the memory cell rows and memory cell columns in DRAM arrays 10e and 10w, a DRAM control circuit 13 for controlling an internal operation of pseudo-SRAM macro 3, and a power supply circuit 14 arranged on one end side of each of DRAM arrays 10e and 10w for producing an internal power supply voltage and various internal voltages.

Each of DRAM arrays 10e and 10w has a storage capacity of 8 M bits as an example.

Each of DRAM data paths 11e and 11w includes a write driver performing writing of internal data, a preamplifier reading internal data and an input/output buffer circuit for performing externally inputting/outputting of data. DRAM data path 11e transfers internal read data RD[63:0] of 64 bits and internal write data WD[63:0] of 64 bits to and from DRAM array 10e. DRAM data path 11e also transfers read data Q[63:0] of 64 bits and write data D[63:0] of 64 bits to and from external processor 2 shown in FIG. 1 via an outside-memory data bus.

DRAM data path 11w transfers internal read data RD[127:64] of 64 bits and internal write data WD[127:64] of 64 bits to and from DRAM array 10w. DRAM data path 11w also transfers read data Q[127:64] of 64 bits and write data D[127:64] of 64 bits to and from external processor 2 via an outside-memory data bus.

Decoder 12 includes row decoders and column decoders, which are aligned to each other. The row decoder drives a word line corresponding to an addressed row to the selected state, and the column decoder drives a column select line corresponding to an addressed column to the selected state. In accordance with a column select signal on the column select line, a memory cell column (sense amplifier) is selected and connected to the internal data bus.

In the arrangement shown in FIG. 2, therefore, the column select lines connected to the column decoder extend in the same direction as the word lines. The column and row decoders are arranged in the same direction in decoder 2 so that the column select lines can be arranged extending in the row direction. Therefore, the data bus lines transferring data RD[127:0] and WD[127:0] extending in the column direction can be arranged above DRAM arrays 10w and 10e so that multi-bit data can be transferred without increasing an area occupied by the bus.

DRAM control circuit 13 receives externally applied signals, i.e., a clock signal CLK, a read operation instructing signal RE, a write operation instructing signal WE, a refresh operation instructing signal REF, a page mode operation instructing signal PM, a page close instructing signal PC and an address signal A[16:0] of 17 bits. By utilizing page mode operation instructing signal PM and page close instructing signal PC, pseudo-SRAM macro 3 can be selectively operated in the page mode. DRAM control circuit 13 takes in these externally applied signals RE, WE, REF, PM and PC in synchronization with clock signal CLK, and produces an internal operation instructing signal designating an internal operation. In addition, DRAM control circuit 13 produces required control signals in accordance with the internal operation instructing signal. Specifically, DRAM control circuit 13 determines the designated operation mode according to the logic states of instructing signals RE, WE, REF, PM and PC, e.g., at the rising edge of clock signal CLK, and produces the control signals for executing the corresponding internal operation.

Figures 3, 4:
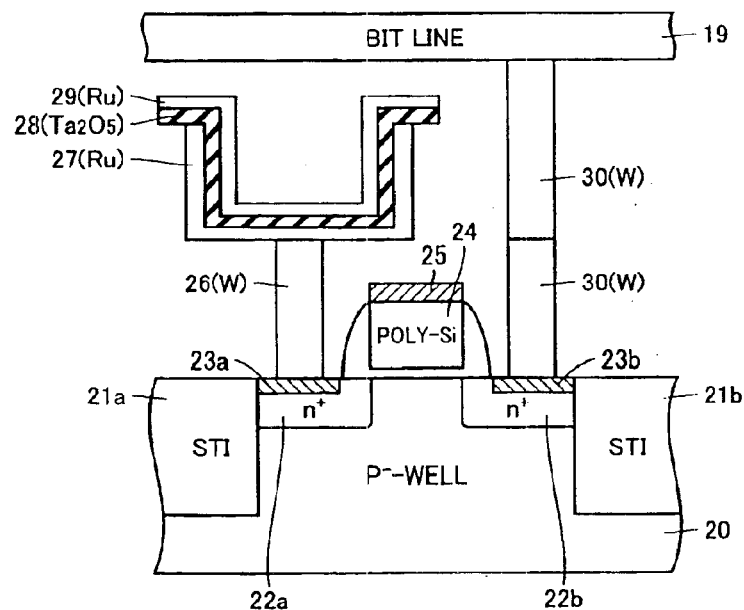
FIG. 3 is a list of commands of the pseudo-SRAM shown in FIG. 2.
FIG. 4 schematically shows a structure of a memory cell included in the pseudo-SRAM macro shown in FIG. 2.

FIG. 3 shows, in a list form, operation modes designated by externally applied instructing signals RE, WE, REF, PC, PM and REF. In FIG. 3, the same reference characters are used in the control signals and mnemonic for designating the same operation contents. For the control signals, these reference characters are referred to as operation instructing signals. For the mnemonic, these reference characters are referred to as commands.

When instructing signals RE, WE, REF, PM and PC are all set to the L level, a NOP command NOP is set, and no new operation is performed. When NOP command NOP is applied, pseudo-SRAM macro 3 usually maintains the standby state (precharge state).

When read operation instructing signal RE is set to the H level and the other instructing signals RE, WE, REF, PM and PC are set to the L level, read command RE is set. When read command RE is designated, the data read is performed within one clock cycle, and the opened page (selected row) is closed after completion of the read operation. Therefore, when read command RE is applied, the operations of activating and deactivating the row-related circuitry and column-related circuitry are completed in a predetermined sequence within one clock cycle.

When read operation instructing signal RE and page mode operation instructing signal PM are both set to the H level and the other instructing signals WE, REF and PC are set to the L level, a page mode read command (page read command) REPM is designated. When page mode read command REPM is designated, the read operation for reading data within this clock cycle is performed. Even after completion of this read operation, the opened page is maintained open. The column-related circuitry returns back to the inactive state after the data reading.

When read operation instructing signal RE and page close instructing signal PC are set to the H level and the other instructing signals WE, REF and PM are set to the L level, a read command with auto-precharge, i.e., auto-precharge read command REPC is set. When this auto-precharge read command REPC is designated, the operation of reading data is performed by performing the column access on the open page. After the read operation is completed, the open page is closed, and the row-related circuitry and column-related circuitry return to the precharge state.

When write operation instructing signal WE is set to the H level and the other instructing signals RE, REF, PM and PC are set to the L level, write command WE is set. When write command WE is designated, writing of data is performed within one clock cycle. After completion of the data writing, the open page is closed, and the row-related circuitry returns to the standby state.

When write operation instructing signal WE and page mode operation instructing signal PM are set to the H level and the other instructing signals RE, REF and PC are set to the L level, a page mode write/read command (page write command) WEPM is designated. When this page mode write/read command WEPM is designated, the opened page maintains open (i.e., the row-related circuitry is kept active) even after data writing is completed and the column-related circuitry return to the inactive state.

When write operation instructing signal WE and page close instructing signal PC are set to the H level and the other instructing signals RE, REF and PM are set to the L level, a write command with auto-precharge (i.e., precharge write command) WEPC is set. When this auto-precharge write command WEPC is designated, data is written by making data access to the open page, and the page is closed (the row-related circuitry returns to the inactive state) after the write operation is completed.

When page close instructing signal PC is set to the H level and the other instructing signals RE, WE, REF and PM are set to the L level, precharge command PC is set. When this precharge command PC is designated, the open page is closed. Thus, the word line in the selected state is driven to the unselected state so that row-related circuitry returns to the standby state.

When refresh operation instructing signal REF is set to the H level and the other instructing signals RE, WE,PM and PC are set to the L level, an auto-refresh command REF is set. When auto-refresh command REF is designated, the refresh operation is executed in accordance with a refresh address produced from an internal address counter.

By utilizing page mode operation instructing signal PM and page close instructing signal PC, as shown in FIG. 3, the setting and completion of the page mode operation can be performed when the read or write operation instructing signal RE or WE is active. Further, by setting precharge command PC by page close instructing signal PC alone, the open page can be closed when it is not necessary to perform writing and reading of data, to complete the page mode operation.

When the read or write operation instructing signal RE or WE becomes active, the column selecting operation and the operation of reading or writing data are internally executed within one clock cycle, and then the column-related circuitry (i.e., column select circuit and data write/read circuit) returns to the inactive state.

A page represents a row designated by the row address signal, and the number of word lines forming the page changes depending on the configuration of DRAM arrays 10e and 10w.

FIG. 4 schematically shows a sectional structure of a DRAM cell arranged in DRAM array 10e and 10w shown in FIG. 2. In FIG. 4, the DRAM cell includes an access transistor formed in a region defined by cell isolation regions 21a and 21b in a P well 20. The cell isolation regions 21a and 21b each have Shallow Trench Isolation (STI) structure, in which etching is effected on the surface of P well 20, and then an isolation oxide film is formed on the substrate surface. As compared with an ordinary structure utilizing a thermal oxide film, the STI structure employed for the cell isolation reduces the area occupied by the cell isolation regions, flattens the surface of the isolation region and reduces a step of an interconnection of a word line formed on the cell isolation region.

The access transistor includes impurity regions 22a and 22b formed at the surface of P well 20, metal layers 23a and 23b formed at the surfaces of respective impurity regions 22a and 22b, a polycrystalline silicon layer 24 formed on a surface portion of P-well 20 between impurity regions 22a and 22b with a gate insulating film laid thereunder, and a metal layer 25 formed in a self-aligned manner on the surface of polycrystalline silicon layer 24.

These metal layers 23a, 23b and 25 are formed of, e.g., cobalt silicide ($CoSi_2$), reduce contact resistance of impurity regions 22a and 22b, and also reduce a resistance of the word line formed of polycrystalline silicon 24. This metal layers 23a, 23b and 25 are formed by applying a salicide process (self-aligned silicide process), which is used in process steps of producing transistors in a logic. Impurity region 22a is formed of a heavily-doped N-type impurity region, and reduces a resistance of a portion connected to a storage node. This salicide process is also applied to transistors in peripheral circuitry of the pseudo-SRAM macro, and the transistors in the peripheral circuitry have the same structure as the transistors in the logic. This suppresses increase in number of manufacturing steps.

In the salicide process, impurity regions 22a and 22b are formed in a self-aligned manner with respect to polycrystalline silicon layer 24, and metal layers 23a and 23b are formed in a self-aligned manner with respect to a side-wall insulating film formed on polycrystalline silicon layer 24.

The memory cell further includes a storage node contact 26 electrically connected to metal layer 23a, a U-shaped storage node layer 27 formed above storage node contact 26, and a cell plate layer 29 opposing to storage node layer 27 with a capacitor insulating film 28 laid in between. Storage node layers 27 and 29 are made of metal interconnection material, e.g., of rubidium (Ru), and storage node contact 26 is made of a metal interconnection material, e.g., of tungsten (W). Capacitor insulating film 28 is made of, e.g., tantalum pentoxide ($Ta_2O_5$). In an MIM (Metal-Insulator-Metal) capacitor structure, a capacitor insulating film of a high dielectric constant is utilized, to achieve a memory cell capacitor with a small occupation area and a large capacitance value and a fast responsibility. The metal interconnection, e.g., of tungsten (W) used as storage node contact 26 reduces a resistance of this storage node.

A metal layer 23b formed at the surface of impurity region 22b is electrically connected to bit line 19 via a bit line contact 30. Bit line contact 30 is formed of a metal interconnection, e.g., of tungsten, and bit line 19 is formed of a metal interconnection, e.g., of copper (Cu). The metal interconnection used as bit line contact 30 reduces a resistance of the bit line contact. By using the metal interconnections as storage node contact 26 and bit line contact 30, metal layers 23a and 23b can be formed at the surfaces of impurity regions 22a and 22b, respectively, to reduce the contact resistances. Since impurity region 22a is connected to the metal interconnection, the impurity concentration thereof can be sufficiently increased.

In the DRAM cell, therefore, resistances of all the internal interconnection lines can be small, and the moving speed of charges in the memory cells can be increased so that the memory cell data can be read fast. Therefore, the row cycle of 36 ns (nanoseconds) can be set to 10 ns or shorter, and the high speed pseudo-SRAM can be achieved.

Figure 5:
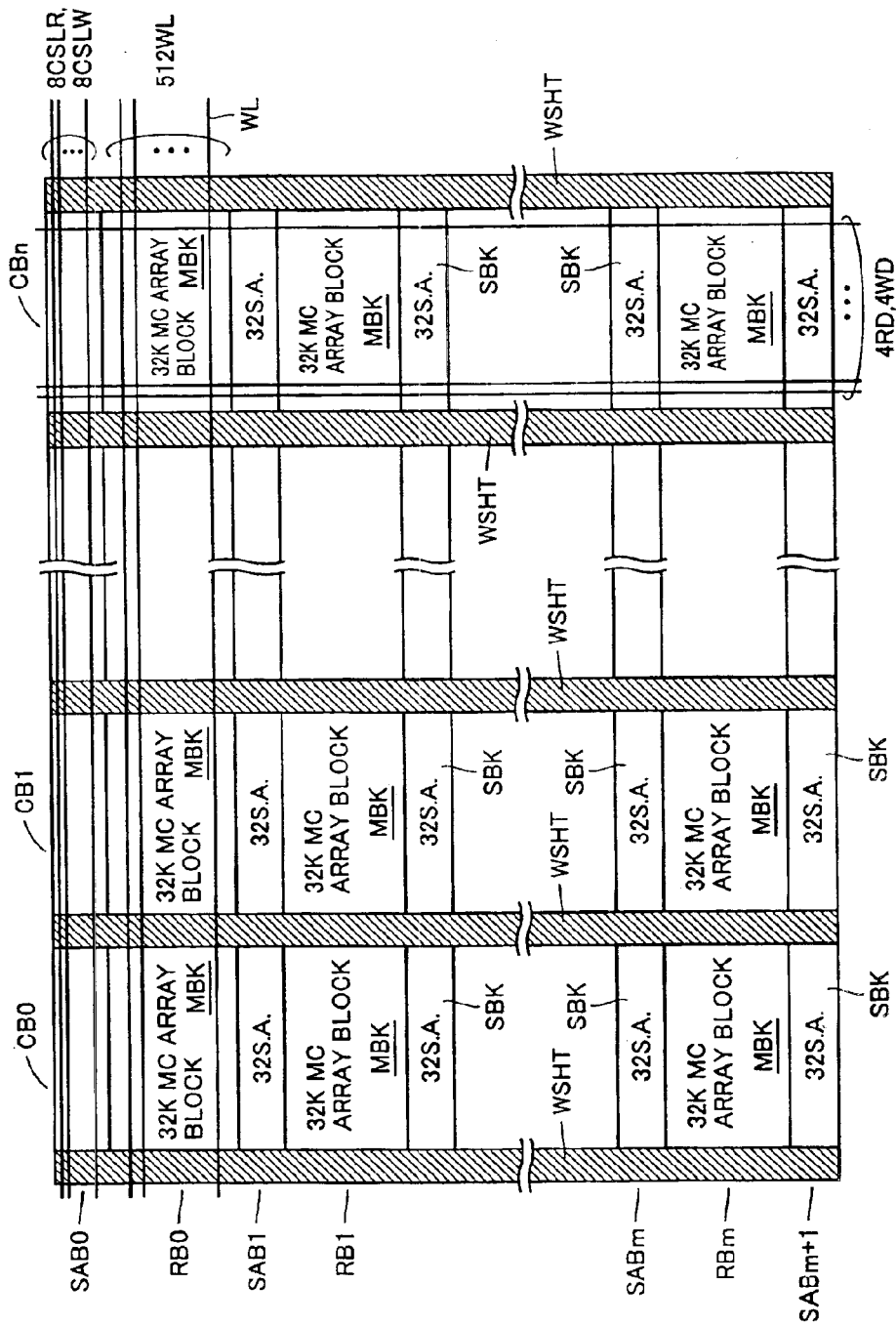
FIG. 5 schematically shows a structure of a DRAM array shown in FIG. 2.

FIG. 5 schematically shows a structure of DRAM array 10e or 10w shown in FIG. 2. Since DRAM arrays 10e and 10w have the same array structure, FIG. 5 representatively shows the structure of only one of these DRAM arrays. In FIG. 5, the DRAM array is divided in the row and column directions into array blocks MBK each having memory cells MC of 23 K bits. The array blocks aligned in the row direction form a row block, and the array blocks aligned in the column direction form a column block. In FIG. 5, the DRAM array is divided into row blocks RB0–RBm, and into column blocks CB0–CBn. For example, the DRAM array is divided into sixteen array blocks in each of the row and column directions, and thus is divided into sixteen row blocks and sixteen column blocks.

Sense amplifier bands SAB1–SABm are arranged between row blocks RB0–RBm, and sense amplifier bands SAB0 and SABm+1 are arranged outside row blocks RB0 and RBm, respectively. In these sense amplifier bands SAB0–SABm+1, a sense block SBK including 32 sense amplifiers is arranged for each array block MBK. The sense amplifiers in each of sense amplifier bands SAB1–SABm are shared by the array blocks on the opposite sides, in the column direction, of the sense amplifier band.

In each of row blocks RB0–RBm, word lines WL are arranged corresponding to the memory cell rows, respectively. Each of row blocks RB0–RBm includes 512 word lines WL. Word line WL is electrically connected to a conductor of a low resistance in a word line shunt region WSHT arranged between the column blocks, to equivalently reduce the resistance of the word line made of polycrystalline silicon.

Instead of the structure having the word line shunt structure implemented by word line shunt region WSHT, such a hierarchical word line structure may be used that word line WL has a hierarchical structure formed into a main word line and sub-word lines, and the sub-word lines are driven by a corresponding word line sub-decoder and the signal on the main word line.

In each of sense amplifier bands SAB0–SABm+1, read column select line CSLR and write column select line CSLW are arranged. In array block MBK, the memory cells are arranged in sixty-four columns, and each column is connected to corresponding one of thirty-two sense amplifiers arranged on each of the opposite sides in the column direction. In each sense block SBK, for selecting four sense amplifiers out of the thirty-two sense amplifiers, eight read column select lines and eight write select lines are arranged. Read column select line CSLR is driven to the selected state in accordance with a column address signal in data read operation, and write column select line CSLW is driven to the selected state in accordance with a column address signal in data write operation.

Over each of column blocks CB0–CBn, read data lines RD and write data lines WD are arranged in the column direction. In column selection in this embodiment, four sense amplifiers are selected in each column block, and therefore, four read data lines RD and four write data lines WD are employed. Each of read data lines RD and write data lines WD is formed of a signal line pair transmitting complementary signals. For the sake of simplicity, however, each signal line pair is represented as a signal line of a single end in FIG. 5. These write and read data lines WD and RD are coupled to the data path.

Figure 6:
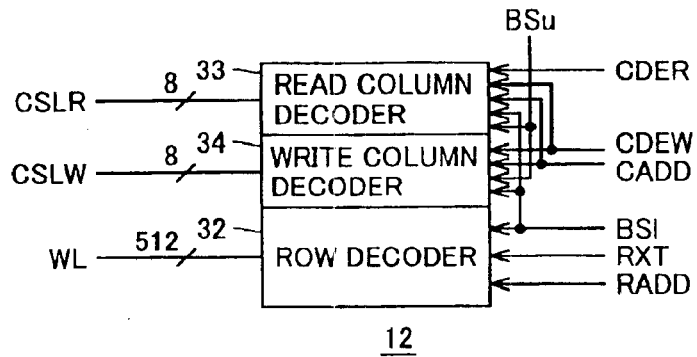
FIG. 6 schematically shows a structure of a portion of a decoder shown in FIG. 2.
Figure 12:
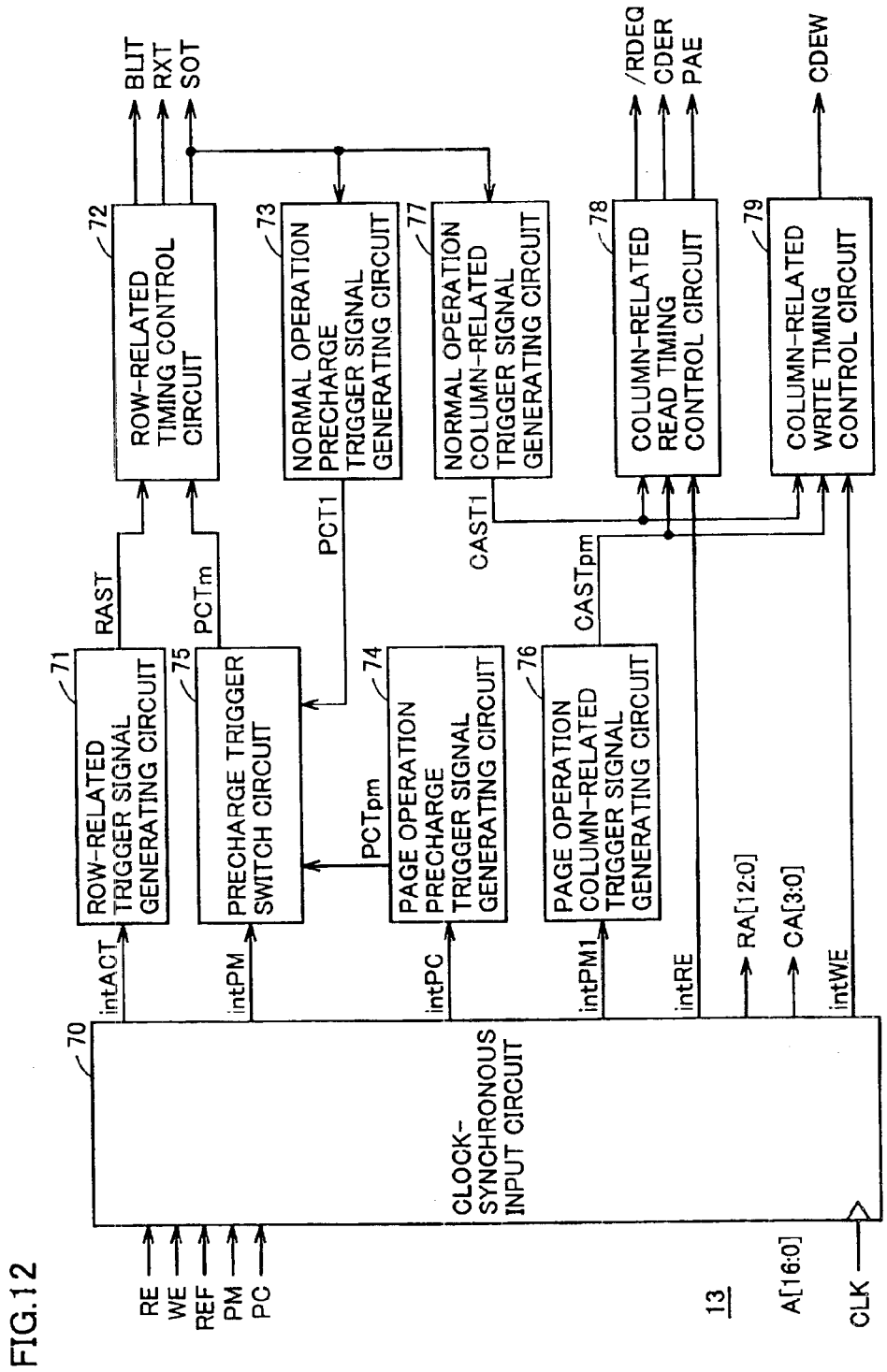
FIG. 12 schematically shows a structure of a DRAM control circuit shown in FIG. 2.

FIG. 6 schematically shows a structure of decoder 12 shown in FIG. 12. FIG. 6 shows a structure of a portion arranged corresponding to one row block and one sense amplifier band in decoder 12.

In FIG. 6, decoder 12 includes a row decoder 32 for driving word line WL corresponding to the row at an designated address in accordance with a block select signal BS1 designating a corresponding row block, a word line activation timing signal RXT and a row address signal RADD, a write column decoder 34 for driving a write column select line CSLW to the selected state by performing a decoding operation in accordance with block select signals BSl and BSu, a column address signal CADD and a write column decoder enable signal CDEW, and a read column decoder 33 for driving a read column select line CSLR to the selected state by performing a decoding operation in accordance with block select signals BSu and BSl, column address signal CADD and a read column decoder enable signal CDER.

Block select signal BSu designates the row block adjacent to the row block designated by block select signal BSl, and the memory blocks specified by these block select signals BSu and BSl share the sense amplifier band.

When block select signal BSl is active, row decoder 32 decodes row address signal RADD, and drives a selected word line WL to the selected state in accordance with word line activation timing signal RXT. Read column decoder 33 is enabled, when one of block select signals BSu and BSl is active, to decode a received column address signal CADD in accordance with activation of read column decoder enable signal CDER, and drives read column select line CSLR designated in the eight column select lines to the selected state.

Write column decoder 34 is enabled, when one of block select signals BSu and BSl is active, to decode a received column address signal CADD in accordance with activation of write column decoder enable signal CDEW, for driving one of eight write column select lines CSLW to the selected state.

In the structure of the decoder shown in FIG. 6, row decoder 32 is supplied with row address signal RADD. However, row decoder 32 may be supplied with a predecode signal instead of row address signal RADD. Likewise, read and write column decoders 33 and 34 may be supplied with the predecode signals instead of column address signal CADD.

In the pseudo-SRAM, row and column address signals RADD and CADD are applied in parallel. After word line drive timing signal RXT is rendered active and the row select operation by row decoder 32 is completed (i.e., after the sensing operation by the sense amplifier is completed), one of column decoder enable signals CDER and CDEW is rendered active, and the column select operation is performed. In the array configuration shown in FIG. 5, one of the row blocks is selected, and the row select operation and the column select operation are performed in the selected row block.

Figure 7:
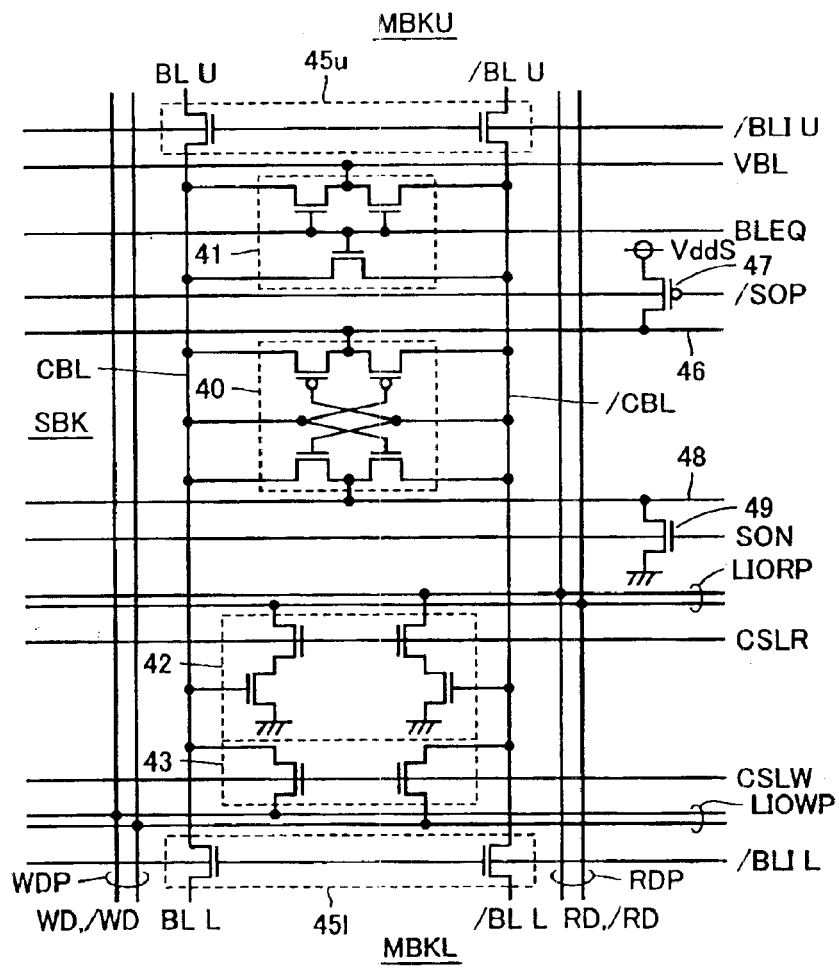
FIG. 7 specifically shows a structure of a sense amplifier band shown in FIG. 5.

FIG. 7 specifically shows a configuration of sense block SBK in the sense amplifier band. FIG. 7 shows a configuration of a portion related to one sense amplifier. In FIG. 7, sense block SBK is shared between array blocks MBKU and MBKL. Array block MBKU includes bit lines BLU and /BLU. Array block MBKL includes bit lines BLL and /BLL. Bit lines BLU and /BLU are coupled to common bit lines CBL and /CBL respectively via a bit line isolation gate 45u, and bit lines BLL and /BLL are coupled to common bit lines CBL and /CBL respectively through a bit line isolation gate 45l.

When bit line isolation instructing signal /BLIU is active (L level), bit line isolation gate 45u turns off to isolate bit lines BLU and /BLU from common bit lines CBL and /CBL, respectively. When bit line isolation instructing signal /BLIL is active (L level), bit line isolation gate 45l turns off to isolate bit lines BLL and /BLL from common bit lines CBL and /CBL, respectively.

Sense amplifier 40 is provided to common bit lines CBL and /CBL. Sense amplifier 40 includes cross-coupled P-channel MOS transistors and cross-coupled N-channel MOS transistors, and, when active, differentially amplifies the potentials on common bit lines CBL and /CBL.

For activating sense amplifier 40, there are provided, in sense block SBK, a P-channel MOS transistor 47 for sense activation, which transmits a sense power supply voltage VddS onto sense power supply line 46 in accordance with sense amplifier activating signal /SOP, and an N-channel MOS transistor 49 for sense activation, which transmits a ground voltage onto a sense ground line 48 in accordance with a sense amplifier activating signal SON. When power supply voltage VddS and the ground voltage are transmitted onto sense power supply line 46 and sense ground line 48, respectively, sense amplifier 40 turns active. Each of sense amplifier activation transistors 47 and 48 is arranged for each predetermined number of sense amplifiers 40.

In sense block SBK, there are further provided a precharge/equalize circuit 41 for precharging common bit lines CBL and /CBL to a level of a precharge voltage VBL in accordance with activation of a bit line equalize instructing signal BLEQ, a read gate 42 which is activated in accordance with a read column select signal CSLR, to drive read local I/O line pair LIORP in accordance with the potentials on common bit lines CBL and /CBL, and a write gate 43 which is activated in accordance with activation of write column select signal CSLW, to couple common bit lines CBL and /CBL to respective I/O lines of a write local I/O line pair LIOWP.

Read gate 42 includes differential stage transistors coupled to common bit lines CBL and /CBL, and read transistors which are selectively turned on in accordance with read column select signal CSLR to couple these differential stage transistors to the respective I/O lines of read local I/O line pair LIORP. Read local I/O line pair LIORP is precharged to a peripheral power supply voltage level by a precharge circuit (not shown). Read local I/O line pair LIORP is coupled to a read data line pair RDP, and write local I/O line pair LIOWP is coupled to a write data line pair WDP.

In the data write operation, write data is transmitted from write data line pair WDP to local I/O line pair LIOWP by a write drive circuit, and write column select gate 43 couples write local I/O line pair LIOWP to common bit lines CBL and /CBL in accordance with the write column select signal, and accordingly common bit lines CBL and /CBL are set to potential levels corresponding to the write data.

In the data read operation, read column select signal CSLR turns active to enable read column select gate 42. On common bit lines CBL and /CBL, sense amplifier 40 latches complementary signals at the levels of power supply voltage VddS and the ground voltage. Therefore, when read column select gate 42 is selected, the differential stage transistors differentially drive the local I/O lines of local I/O line pair LIORP, to drive the corresponding read data line pair RDP.

Figure 8:
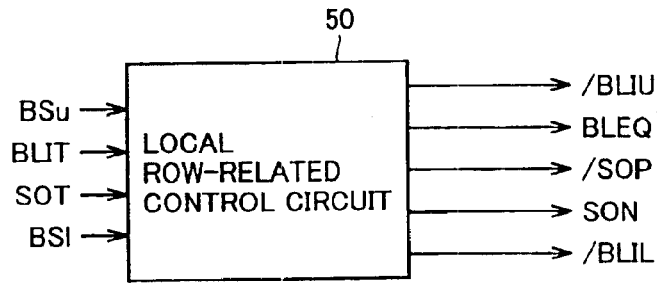
FIG. 8 schematically shows a structure of a control circuit arranged for a row block in FIG. 5.

FIG. 8 shows input and output signals of a local row-related control circuit 50 arranged for each sense amplifier band. Local row-related control circuit 50 produces bit line isolation instructing signals /BLIU and /BLIL, bit line equalize instructing signal BLEQ and sense amplifier activating signals SON and /SOP. in accordance with a bit line isolation timing signal BLIT, sense activation timing signal SOT and block select signals BSu and BSl applied from DRAM control circuit 13 shown in FIG. 1. In local row-related control circuit 50, when one of block select signals BSu and BSl is driven to the selected state, bit line isolation instructing signal /BLIU or /BLIL corresponding to the unselected array block becomes active in accordance with bit line isolation timing signal BLIT, and equalize instructing signal BLEQ is driven to the inactive state in accordance with bit line isolation timing signal BLIT. Further, sense amplifier activating signals SON and /SOP are activated in accordance with sense activation timing signal SOT. That is, local row-related control circuit 50 is enabled when the corresponding array block is selected, and activates or deactivates the corresponding row-related control signals in a predetermined sequence in accordance with timing signals applied from the DRAM control circuit.

Figure 9:
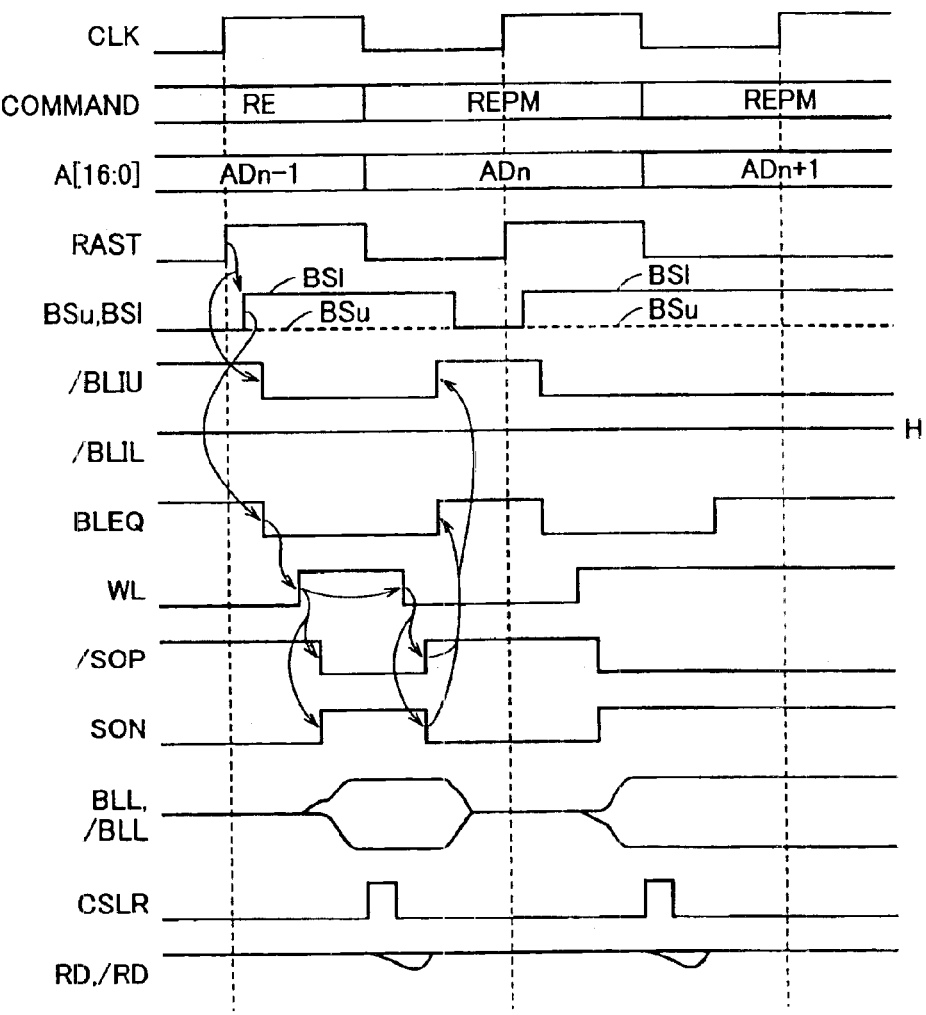
FIG. 9 is a signal waveform diagram representing an operation of the pseudo-SRAM macro shown in FIGS. 2 to 7.

FIG. 9 is a timing chart representing an operation of the circuits in the sense amplifier band shown in FIG. 7. Referring to FIG. 9, operations of the circuits shown in FIG. 7 will now be described.

When read command RE is applied, DRAM control circuit 13 shown in FIG. 2 sets and keeps row-related trigger signal RAST at the H level for a predetermined period (e.g., a period of the H level of clock signal CLK) on a rising edge of clock signal CLK. Row-related trigger signal RAST, which will be described later in detail, is rendered active when the row select operation is designated, or when one of the write command, read command and refresh command is applied.

In accordance with the activation of row-related trigger signal RAST, externally applied address signal A[16:0] is taken in, an internal address signal is produced, and block select signal BSl corresponding to the row block designated by address signal ADn−1 is driven to the selected state.

When block select signal BSl is driven to the selected state, local row-related control circuit 50 shown in FIG. 8 drives bit line isolation instructing signal /BLIU to the L level in accordance with row-related trigger signal RAST and block select signal BSl. Bit line isolation instructing signal /BLIL maintains the H level. Thereby, bit line isolation gate 45u shown in FIG. 7 turns nonconductive to isolate common bit lines CBL and /CBL from bit lines BLU and /BLU. Meanwhile, bit line isolation gate 45l maintains the conductive state, and connects common bit lines CBL and /CBL to bit lines BLL and /BLL, respectively.

Then, word line activation timing signal RXT shown in FIG. 6 is rendered active at a predetermined timing, and row decoder 32 drives a selected word line WL to the H level. When word line WL is activated, memory cell data is read onto bit lines BLL and /BLL. FIG. 9 illustrates signal waveforms in the case where H level data is read onto bit lines BLL or /BLL.

After word line WL is driven to the selected state, sense amplifier activating signals SON and /SOP are made active for a predetermined period at predetermined timings, and sense amplifier 40 shown in FIG. 7 performs the sensing operation to drive common bit lines CBL and /CBL as well as bit lines BLL and /BLL to the power supply voltage level and the ground voltage level in accordance with the memory cell data, and to latch the amplified potentials.

When sense amplifier 40 completes the sensing operation and latches the voltage levels on common bit lines CBL and /CBL, read column decoder 33 shown in FIG. 6 is then activated to decode the address signal, and corresponding read column select line CSLR is set and kept at the H level for a predetermined period. Thereby, read column select gate 42 is enabled, and drives read data bus lines RD and /RD via local read data line pair LIORP in accordance with the potentials on common bit lines CBL and /CBL. This column select operation is internally performed in a self-timed manner. When a predetermined period elapses, column decoder 33 is deactivated (i.e., column decoder enable signal CDER is deactivated), and read column select line CSLR is driven to the unselected state again so that read select gate 42 is disabled.

When read command RE is applied, the active period of sense amplifier activating signals SON and /SOP is set in a self-timed manner. When a predetermined time elapses, sense amplifier activating signals SON and /SOP are rendered inactive, and then word line WL in the selected state is driven to the unselected state. Thereafter, bit line isolation instructing signal /BLIU attains the H level, and equalize instructing signal BLEQ is driven to the H level. Thereby, common bit lines CBL and /CBL are connected to bit lines BLU and /BLU via bit line isolation gate 45e. Moreover, bit line precharge/equalize circuit 41 turns active in accordance with activation of bit line equalize instructing signal BLEQ, to precharge and equalize bit lines BLU and /BLU, common bit lines CBL and /CBL, and bit lines BLL and /BLL to a level of an intermediate voltage VBL. Block select signal BS1 is driven to the unselected state in accordance at a predetermined timing.

When page mode read command REPM is applied in the next clock cycle, row-related trigger signal RAST is set to kept for a predetermined period at the H level in synchronization with the rising of clock signal CLK. Similarly to the case of applying the read command, block select signal BS1 is driven to the selected state, and bit line isolation instructing signal /BLIU and bit line equalize instructing signal BLEQ are driven to the L level. Subsequently, word line WL is driven to the selected state in accordance with the row address signal, and the memory cell data is read onto bit lines BLL and /BLL. At a timing when the bit line potentials are sufficiently developed, sense amplifier activating signals /SOP and SON are activated. When the bit line potentials become definite after activation of the sense amplifier, the column select operation is enabled, and read column select line CSLR is activated at a predetermined timing. Responsively, read data lines RD and /RD are driven in accordance with the latch data of the sense amplifier corresponding to the selected column.

When page mode read command REPM is applied, the column select operation is performed in a self-timed manner, and read column select line CSLR is driven to the inactive state after elapsing of a predetermined period, and the column select operation ends. Meanwhile, bit line isolation timing signal BLIT and sense amplifier activation timing signal SOT are not deactivated, and block select signal BS1 maintains the latched state. In the page mode, even after the column selecting operation by the column select circuitry and the data read operation are completed, the circuitry related to the row selection are not reset, and sense amplifier activating signals SON and /SOP maintain the active state. The selected word lines WL maintain the selected state.

Therefore, when page mode read command REPM is applied in the next clock cycle, the row selecting operation is not performed, and only the column selecting operation is performed. Thus, the same word line (i.e., the region designated by the same row address, or the page) can be successively accessed so that the power consumption required for the operation of the row-related circuitry can be saved.

In the data write operation, in the timing chart of FIG. 9, write data lines WD and /WD, instead of read data lines RD and /RD, are driven by a write driver, and common bit lines CBL and /CBL are driven via write column select gate 43, and the writing of data is performed.

Figure 10:
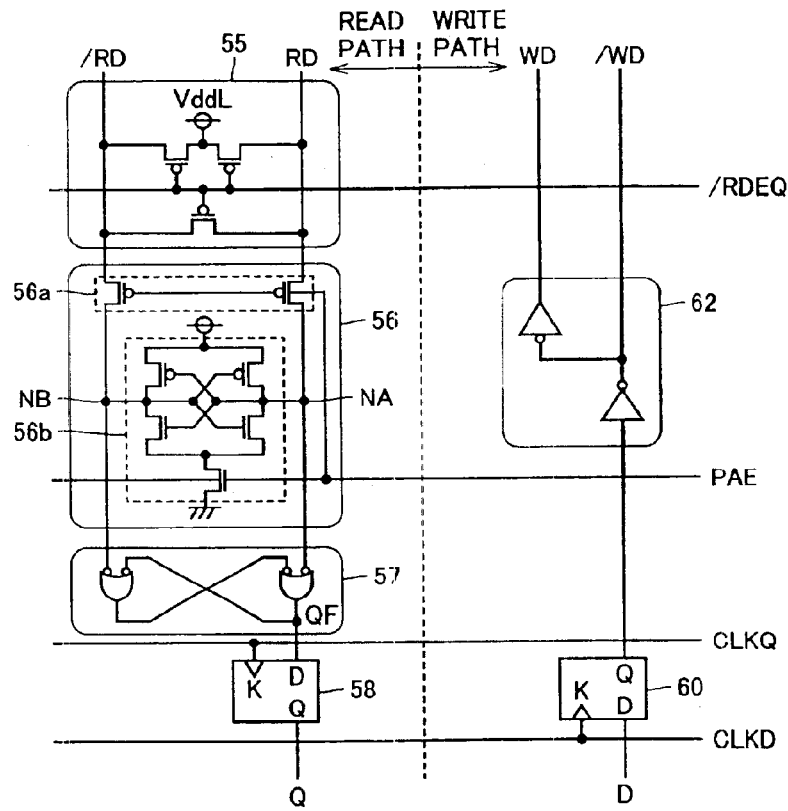
FIG. 10 shows, by way of example, a structure of a DRAM data bus shown in FIG. 2.

FIG. 10 shows a configuration of data paths 11e and 11w shown in FIG. 2. Since data paths 11e and 11w have the same configuration, FIG. 10 representatively shows the structure of the data path transferring one bit of internal data. This data path includes a read path producing output data Q in accordance with internal signals on read data lines RD and /RD, and a write path for producing a write data signal in accordance with externally applied input data D and driving write data lines WD and /WD.

The read path includes a bus precharge/equalize circuit 55, which is activated to precharge and equalize read data lines RD and /RD to the level of a peripheral power supply voltage VddL when a read data bus equalize instructing signal /RDEQ is active at the L level, a preamplifier circuit 56 for amplifying the internal read signal read onto read data lines RD and /RD in a charge-confinement manner when a preamplifier activating signal PAE is active, a latch circuit 57 for latching the data amplified by preamplifier circuit 56, and a D-flip-flop 58 taking in, latching and outputting latch data QF of latch circuit 57 in synchronization with a clock signal CLKQ.

Bus precharge/equalize circuit 55 includes an equalizing MOS transistor for electrically short-circuiting internal read data lines RD and /RD in accordance with activation of read data bus equalize instructing signal /RDEQ, and precharging MOS transistors for transmitting a peripheral power supply voltage VddL onto internal read data lines RD and /RD when read data bus equalize instructing signal /RDEQ is active. Peripheral power supply voltage VddL is supplied from a power source different from the power source of power supply voltage VddS supplied to the sense amplifiers. Transistors in the peripheral circuitry have substantially the same structures as transistors in the logic integrated on the same chip. The access transistor in a memory cell has a threshold voltage generally made high for reducing a leakage current in the off state, but is formed utilizing the process steps of manufacturing the logic transistors, similarly to the transistors in the peripheral circuitry. For preventing dielectric breakdown due to an electric field applied across the capacitor insulating film of the memory cell, and for preventing a power supply noise in the sensing operation from adversely affecting the peripheral circuitry, array power supply voltage VddS and peripheral power supply voltage VddL are supplied via separate routes, and are set to optimal voltage levels, respectively.

Preamplifier circuit 56 includes a confinement gate 56a for isolating read data lines RD and /RD from internal nodes NA and NB of preamplifier circuit 56 when preamplifier activating signal PAE is active, and a preamplifier 56b for amplifying the potentials on internal nodes NA and NB of preamplifier circuit 56 in response to activation of preamplifier activating signal PAE.

Preamplifier 56b includes cross-coupled P-channel MOS transistors, cross-coupled N-channel MOS transistors and an activating MOS transistor for coupling a common source node of these N-channel MOS transistors to a ground node in accordance with preamplifier activating signal PAE. In preamplifier 56b, the common source node of the P-channel MOS transistors is always coupled to the power supply node. Therefore, preamplifier 56b, when activated, discharges internal node NA or NB of preamplifier circuit 56.

Confinement gate 56a includes P-channel MOS transistors provided for read data lines RD and /RD, respectively, and receiving preamplifier activating signal PAE on their gates. Confinement gate 56a is used to isolate internal nodes NA and NB of preamplifier circuit 56 from read data lines RD and /RD while preamplifier circuit 56 operates, to mitigate the load on preamplifier 56b for achieving a high speed amplifying operation.

Latch circuit 57 is formed of an NAND type flip-flop, and provides output data QF at the H level when internal node NA of preamplifier circuit 56 is at the L level. When internal nodes NA and NB of preamplifier circuit 56 are at the H- and L levels, respectively, latch circuit 57 provides output QF at the L level. When both internal nodes NA and NB are at the power supply voltage level, latch circuit 57 maintains the latching state.

D-flip-flop 58 operates in synchronization with data read clock signal CLKQ, and provides output data Q in synchronization with the rising edge of read clock signal CLKQ.

Figure 11:
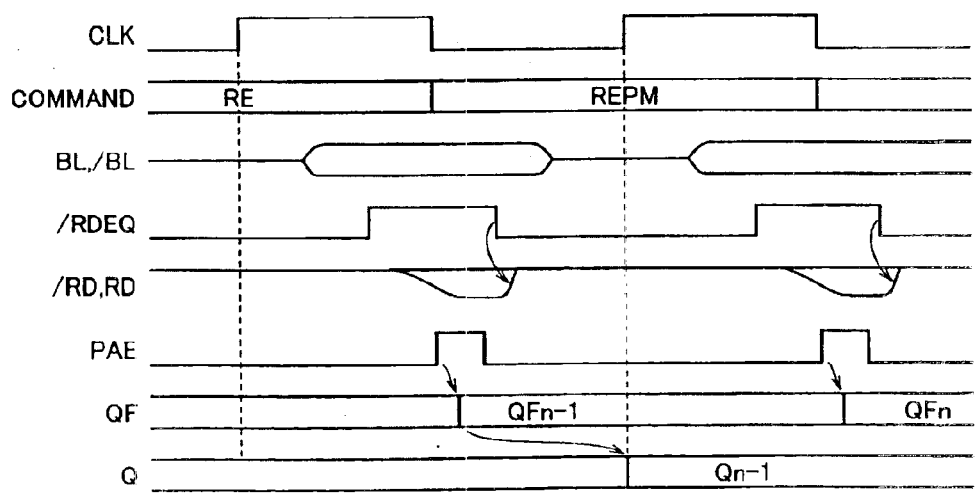
FIG. 11 is a signal waveform diagram representing an operation of the data bus shown in FIG. 10.

The write path includes a D-flip-flop 60, which takes in externally applied input data D and provides the input data in synchronization with the rising of a write clock signal CLKD, and a write driver 62 driving write data lines WD and /WD in accordance with the output signal of D-flip-flop 60. Write driver 62 includes an inverter receiving the output signal of D-flip-flop 60 to drive write data line /WD, and an inverter receiving the output signal of that inverter to drive write data line WD. Therefore, write data lines WD and /WD transmit complementary signals of the CMOS level as the internal write data provided from write driver 62. Referring to a timing chart of FIG. 11, the operation of the data path for data reading will now be briefly described.

Read command RE is applied in synchronization with clock signal CLK so that the row-related circuitry operates, and the data in the selected memory cell is transmitted onto bit lines BL and /BL. After the sense amplifier in this row-related circuitry completes the sensing operation, read data bus equalize instructing signal /RDEQ attains the H level, and the precharging and equalizing of read data lines RD and /RD to power supply voltage VddL are completed. Then, the read column select line CSLR shown in FIG. 7 rises to the H level, and the memory cell data latched by the sense amplifier is transmitted onto read data lines RD and /RD via read gate 42 shown in FIG. 7. When the potentials on read data lines RD and /Rd change to cause a sufficient potential different between preamplifier internal nodes NA and NB, preamplifier activating signal PAE turns active at a predetermined timing.

In preamplifier circuit 56, confinement gate 56*a* turns nonconductive to isolate internal nodes NA and NB from read data lines RD and /RD. In this state, preamplifier 56*b* is activated to drive internal node at a lower potential out of nodes NB and NA to the ground potential level. By this amplifying operation of this preamplifier 56*b*, the signal potentials on internal nodes NA and NB are latched by latch circuit 57, and output QF thereof is made definite.

When read clock signal CLKQ rises to the H level, D-flip-flop 58 produces output data Q(Qn−1) in accordance with output QF(QFn−1) of latch circuit 57.

Upon completion of amplification by preamplifier circuit 56, read data bus equalize instructing signal /RDEQ attains the L level at a predetermined timing, and read bus precharge/equalize circuit 55 is activated so that read data lines RD and /RD are precharged and equalized to the power supply voltage level.

Even when preamplifier circuit 56 becomes inactive, latch circuit 57 is in the latching state, and D-flip-flop 58 maintains its output Q for a period of one clock cycle.

When page mode read command REPM is applied in the next clock cycle, the row-related circuitry similarly operates internally, so that a word line is selected, and the sense amplifier performs the sensing operation. Even when this page mode read command REPM is applied, the column-related circuitry operates in the same manner, and read data bus equalize instructing signal /RDEQ attains the H level at a predetermined timing after completion of the sensing operation so that precharging and equalizing of read data lines RD and /RD are completed. In this state, the column select operation is performed, and the potentials on read data lines RD and /RD change in accordance with the sense amplifier data on the selected column. Preamplifier activating signal PAE is activated again so that preamplifier circuit 56 performs the amplifying operation, and latch data QFn−1 of latch circuit 57 changes into data QFn. Thereafter, D-flip-flop 58 responds to the rising of read clock signal CLKQ to provide output data Q (Qn) according to latch data QF.

In the page mode, read data bus equalize instructing signal /RDEQ is likewise deactivated at a predetermined timing after preamplifier circuit 56 completes the preamplifier operation, and data bus precharge/equalize circuit 55 precharges and equalizes read data lines RD and /RD to the power supply voltage level.

In the data write operation, write clock signal CLKD is produced when the write command is applied, and D-flip-flop 60 operates in accordance with this write clock signal CLKD to produce the internal write data in accordance with externally applied data D. Write driver 62 drives write data lines WD and /WD in accordance with the internal data provided from D-flip-flop 60. D-flip-flop 60 maintains this state of write data lines WD and /WD for one clock cycle period in the write operation, since write driver 62 operates asynchronously with the clock signal.

In this data path, D-flip-flops 58 and 60 are arranged, and the data transfer is performed in accordance with internal clock signals CLKQ and CLKD. Owing to this synchronous operation, internal clock signals CLKQ and CLKD are produced in accordance with clock signal CLK, and thus the data can be transferred in synchronization with clock signal CLK.

In the page mode, the column-related circuitry completes the column access operation within one clock cycle, similarly to the operation in the normal operation mode. In the page mode, the row-related circuitry has a new operation stopped until the precharge instructing signal is applied.

FIG. 12 schematically shows a configuration of a DRAM control circuit 13 shown in FIG. 2. In FIG. 12, DRAM control circuit 13 includes a clock-synchronous input circuit 70, which receives externally applied operation instructing signals RE, WE, REF, PM and PC in synchronization with clock signal CLK, produces internal operation instructing signals intACT, intPM, intPC, intPMl, intRE and intWE, and produces an internal row address signal RA[12:0] and an internal column address signal CA[3:0] in accordance with externally applied address signal A[16:0].

Clock-synchronous input circuit 70 includes a command decode circuit, and decodes the states of externally applied operation instructing signals RE, WE, REF, PM and PC to output a result of the decoding in synchronization with the rising of clock signal CLK. Signal intACT (first internal operation instructing signal) is a row-related activation instructing signal, and is rendered active to activate the row-related circuitry in the precharge state for driving the row select operation when one of read operation instructing signal RE, write operation instructing signal WE and refresh operation instructing signal REF is active. Row-related activation instructing signal intACT corresponds to the first internal operation instructing signal.

Signal intPM is an internal page mode instructing signal, which indicates that the page mode is designated, and inhibits deactivation of the row-related circuitry in this cycle. Page mode operation instructing signal intPM corresponds to a second internal operation instructing signal.

Signal intPC is an internal precharge operation instructing signal (page operation completion instructing signal), and designates an operation of driving a selected row to the unselected state, or of closing the open page. Precharge operation instructing signal intPC corresponds to a third internal operation instructing signal.

Signal intPM1 is a delayed page mode instructing signal produced by delaying internal page mode instructing signal intPM by one clock cycle. This delayed page mode instructing signal intPM1 is set to the H level when internal page mode instructing signal intPM is at the H level on the rising edge of clock signal CLK. By utilizing this delayed page mode instructing signal intPM1, activation of the column-related circuitry in the page-mode operation is executed.

Signal intRE is an internal read operation instructing signal, and is rendered active to instruct the data reading when the read command is applied.

Signal intWE is an internal write operation instructing signal, and is rendered active to instruct the data writing when the write command is applied.

Clock-synchronous input circuit 70 decodes the applied command, and outputs a result of the decoding at the rising edge of clock signal CLK. The internal operation instructing signals for these operations are updated at each clock cycle.

Row address signal RA[12:0] includes a block address signal specifying a row block, and 4 bits of the row address signal designate one row block out of 16 row blocks. Further, 9 bits of the row address signal designate one word line out of 512 word lines.

Column address signal CA[3:0] specifies four sense amplifiers for each array block in the selected row block. One row block includes 16 array blocks so that the sense amplifiers of 64 in total are selected, and data of 64 bits are transferred.

DRAM control circuit 13 further includes a row-related trigger signal generating circuit 71 for activating row-related trigger signal RAST for a predetermined period in accordance with activation of row-related activation instructing signal intACT, a row-related timing control circuit 72 for activating bit line isolation timing signal BLIT, word line activation timing signal RXT and sense activation timing signal SOT in a predetermined sequence in accordance with activation of row-related trigger signal RAST, a normal operation precharge trigger signal generating circuit 73 for producing a normal mode precharge trigger signal PCT1 in accordance with activation of sense activation timing signal SOT, a page operation precharge trigger signal generating circuit 74 for producing a page mode precharge trigger signal PCTpm in accordance with activation of internal precharge operation instructing signal intPC, and a precharge trigger switch circuit 75 for producing a precharge trigger signal PCTm by selecting one of normal and page mode precharge trigger signals PCT1 and PCTpm in accordance with internal page mode instructing signal intPM.

In accordance with precharge trigger signal PCTm, row-related timing control circuit 72 deactivates bit line isolation timing signal BLIT, word line activation timing signal RXT and sense activation timing signal SOT in a predetermined sequence. In the description, the normal operation represents an operation in which a row and column selection operation is completed in one clock cycle of clock signal CLK.

Precharge trigger switch circuit 75 selects page mode precharge trigger signal PCTpm when internal page mode instructing signal intPM is active, and selects normal mode precharge trigger signal PCT1 when internal page mode instructing signal intPM is inactive. In this precharge trigger switch circuit 75, the precharge timing is selectively set in accordance with the operation mode, so that it is possible to prevent the driving of the row-related activation timing signal to the inactive state during the data access cycle under the page mode. In the normal operation, row-related timing signals BLIT, RXT and SOT are deactivated at predetermined timings after sense activation timing signal SOT is rendered active, so that the operation of the row-related circuitry is completed in one clock cycle. The circuits described above control the operations of the row-related circuits associated with the row selection.

DRAM control circuit 13 further includes a normal operation column-related trigger signal generating circuit 77 for producing a normal operation column trigger signal CAST1 in accordance with activation of sense activation timing signal SOT, a page operation column-related trigger signal generating circuit 76 for producing a page mode column-related trigger signal CASTpm in accordance with delayed internal page mode instructing signal intPM1 applied from clock-synchronous input circuit 70, a column-related read timing control circuit 78, enabled in response to activation of column-related trigger signal CAST1 or CASTpm, for performs activation and deactivation of read data bus equalize instructing signal /RDEQ, read column decoder enable signal CDER and preamplifier activating signal PAE in a predetermined sequence when internal read operation instructing signal intRE is active, and a column-related write timing control circuit 79, enabled in response to activation of column-related trigger signal CAST1 or CASTpm, for performing activation and deactivation of write-related column decoder enable signal CDEW at a predetermined timing when internal write operation instructing signal intWE is active. These circuits control the operations of column-related circuits associated with column selection.

Normal operation column-related trigger signal generating circuit 77 produces normal mode column-related trigger signal CAST1 in a one-shot pulse form in response to activation of the sense activation timing signal SOT. Therefore, when the page mode is set, sense activation timing signal SOT is kept active so that normal mode column-related trigger signal CAST1 is not produced. Page mode column-related trigger signal CASTpm is activated in response to activation of delayed internal page mode instructing signal intPM1. This delayed internal page mode instructing signal intPM1 is produced by delaying internal page mode instructing signal intPM by one clock cycle. Internal page mode instructing signal intPM is rendered active in accordance with activation of externally applied page mode operation instructing signal PM. In the page mode, therefore, in the clock cycle in which the page mode is first set, the column-related circuitry is activated and deactivation in accordance with a normal operation column-related trigger signal CST1. In the page mode operations in the subsequent clock cycles, activation and deactivation of timing control circuits 78 and 79 controlling the operations of the column-related circuits are controlled in accordance with a page mode operation column-related trigger signal CSTpm.

The operation activation triggering signal of the column-related circuitry is switched between the normal operation mode and the page mode. Accordingly, in the page mode operation, the data access can be performed in each clock cycle in accordance with an externally applied column address signal while maintaining the page open.

Figure 13:
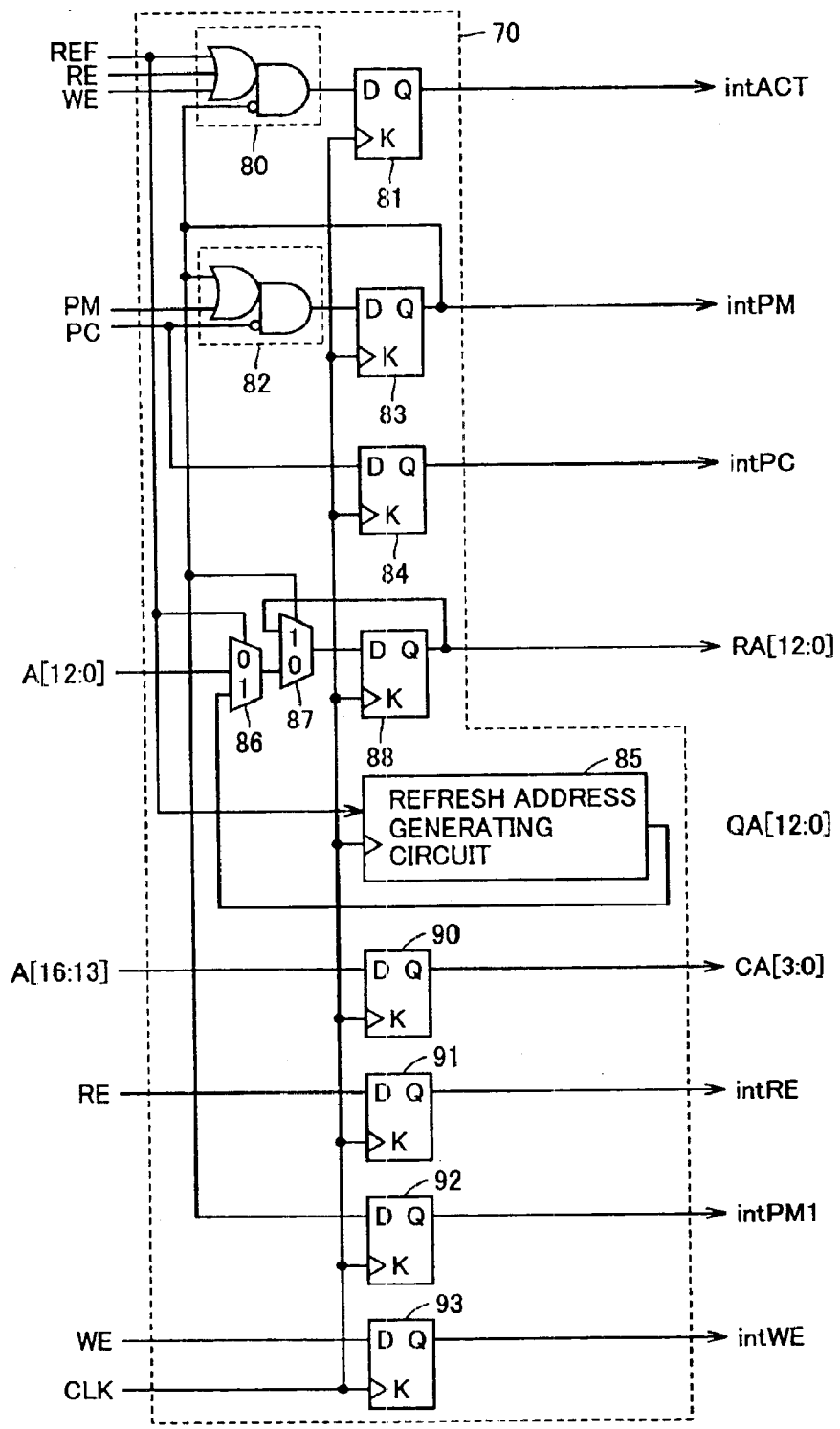
FIG. 13 shows, by way of example, a structure of a clock synchronous input circuit shown in FIG. 12.

FIG. 13 schematically shows an example of a configuration of the clock-synchronous input circuit 70 shown in FIG. 12. In FIG. 13, clock-synchronous input circuit 70 includes a composite gate 80 receiving refresh operation instructing signal REF, read operation instructing signal RE, write operation instructing signal WE and internal page mode instructing signal intPM, a D-flip-flop 81 taking in the output signal of composite gate 80 in synchronization with the rising of clock signal CLK, to provide the taken in signal as row-related activating signal intACT, a composite gate 82 receiving page mode operation instructing signal PM, page close instructing signal PC and internal page mode instructing signal intPM, a D-flip-flop 83 taking in the output signal of composite gate 82 in synchronization with the rising of clock signal CLK, to provide the taken in signal as internal page mode instructing signal intPM, a D-flip-flop 84 taking in page close instructing signal PC in synchronization with the rising of clock signal CLK, to provide the taken in signal as internal precharge instructing signal intPC, a refresh address generating circuit 85 counting refresh operation instructing signal REF to produce a refresh address QA[12:0], a multiplexer 86 selecting one of externally applied address signal A[12:0] and refresh address QA[12:0] in accordance with refresh operation instructing signal REF, a multiplexer 87 selecting the output signal of multiplexer 86 and internal row address signal RA[12:0] in accordance with internal page mode instructing signal intPM, and a D-flip-flop 88 taking in the output signal of multiplexer 87 in synchronization with the rising of clock signal CLK, to provide the taken in signal as internal row address signal RA[12:0].

Composite gate 80 equivalently includes an OR circuit receiving refresh operation instructing signal REF, read operation instructing signal RE and write operation instructing signal WE, and a gate circuit receiving internal page mode instructing signal intPM and the output signal of the OR circuit. This gate circuit operates as a buffer circuit when internal page mode instructing signal intPM is at the L level, and fixes its output at the L level when internal page mode instructing signal intPM is at the H level. When the page mode is designated, composite gate 80 inhibits the take-in of an externally applied operation instructing signal.

Composite gate 82 equivalently includes an. OR circuit receiving page mode operation instructing signal PM and internal page mode instructing signal intPM, and a gate circuit receiving the output signal of the OR circuit and page close instructing signal PC. This gate circuit operates as a buffer circuit, and transmits the output signal of the OR circuit when page close instructing signal PC is at the L level, and fixes the output to the L level when page close instructing signal PC is at the H level.

D-flip-flops 81, 83, 84 and 88 each may be formed of a normal D-flip-flop, which takes in and outputs an applied signal at the rising edge of clock signal CLK. Alternatively, D-flip-flops 81, 83, 84 and 88 each may be formed of latch circuits of two stages configured to take in the signal applied to input D when clock signal CLK is at the L level, and to output the taken signal in synchronization with the rising of clock signal CLK.

Multiplexer 86 selects refresh address signal QA[12:0] provided from refresh address generating circuit 85 when refresh operation instructing signal REF is active, and selects externally applied address signal A[12:0] when refresh operation instructing signal REF is inactive. Multiplexer 87 selects internal row address signal RA[12:0] when internal page mode instructing signal intPM is active, and selects the output address signal from multiplexer 86 when internal page mode instructing signal intPM is inactive. In the cycle following the cycle having the page mode designated, the address designating the selected page and latched by D-flip-flop 88, is continuously output.

Clock-synchronous input circuit 70 further includes a D-flip-flop 90 that takes in externally applied address signal A[16:13] in synchronization with the rising of clock signal CLK, to provide the taken in signal as column address signal CA[3:0], a D-flip-flop 91 that takes in read operation instructing signal RE in synchronization with the rising edge of clock signal CLK, to provide the taken in signal as internal read operation instructing signal intRE, a D-flip-flop 92 that takes in internal page mode instructing signal intPM at the rising edge of clock signal CLK, to provide the taken in signal as delayed page mode instructing signal intPM1, and a D-flip-flop 93 that takes in externally applied write operation instructing signal WE in synchronization with the rising edge of clock signal CLK, to provide the taken in signal as internal write operation instructing signal intWE. The output signals of these D-flip-flops 90–93 are updated in synchronization with the rising edge of clock signal CLK.

Delayed page mode instructing signal intPM1 provided from D-flip-flop 92 is the signal delayed from internal page mode instructing signal intPM by one clock cycle because D-flip-flop 92 takes in the signal applied on its input D and outputs the taken in signal at the rising edge of clock signal CLK.

Figure 14:
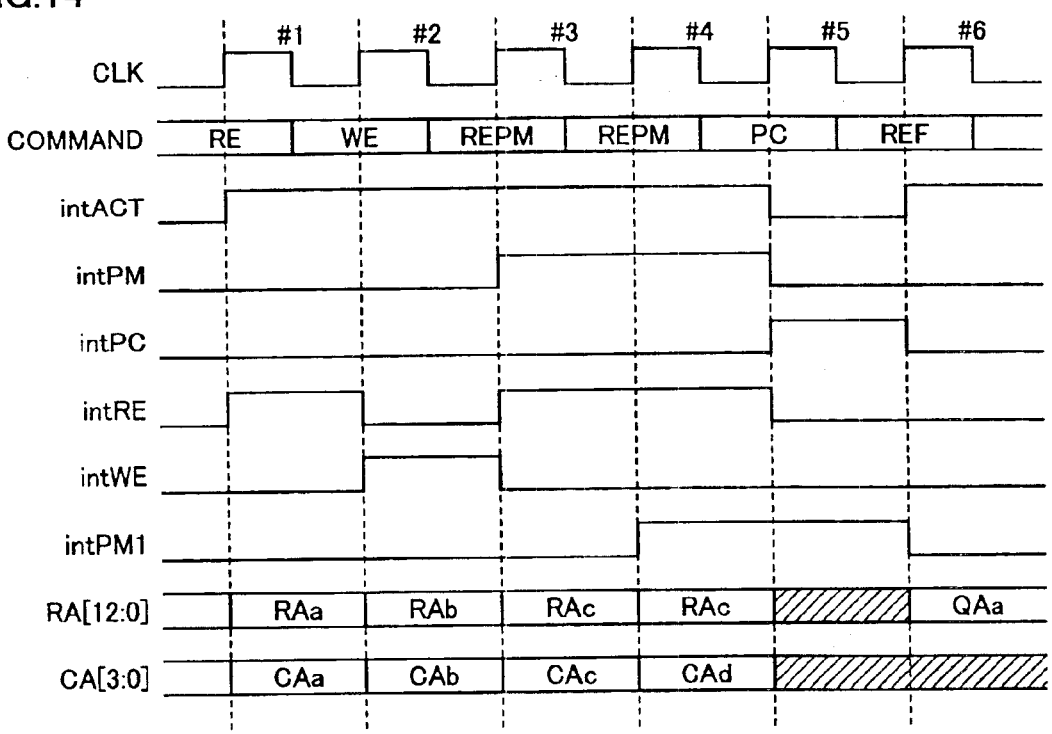
FIG. 14 is a timing chart representing an operation of the clock-synchronous input circuit shown in FIG. 13.

FIG. 14 is a timing chart representing an operation of the clock-synchronous input circuit shown in FIG. 13. Referring to FIG. 14, description will be given on the operation of the clock-synchronous input circuit shown in FIG. 13.

In a clock cycle #1, read command RE is set. When read command RE is set, read operation instructing signal RE is at the H level, and page mode operation instructing signal PM and page close instructing signal PC are at the L level. Further, read operation instructing signal RE is at the H level, and write operation instructing signal WE is at the L level. Therefore, the output signal of composite gate 80 is at the H level according to the H level of read operation instructing signal RE (internal page mode instructing signal intPM is at the L level), and responsively, row-related activating signal intACT rises to the H level in synchronization with the rising of clock signal CLK.

Internal page mode instructing signal intPM and internal precharge instructing signal intPC maintain the L level because page operation instructing signal PM and page close operation instructing signal PC are both at the L level. Internal read operation instructing signal intRE attains the H level in synchronization with the rising edge of clock signal CLK because read operation instructing signal RE is at the H level. In synchronization with the rising of clock signal CLK, internal row address signal RA[12:0] and column address signal CA[3:0] are produced in accordance with externally applied address signal A[16:0], and the row and column are internally selected and the data reading is executed. In clock cycle #1, the row and column selecting operations are completed.

In a clock cycle #2, write command WE is applied. When this write command is applied, the output signal of composite gate 80 is at the H level in accordance with the activation of write operation instructing signal WE, so that row-related activating signal intACT maintains the H level. Since page mode operation instructing signal PM and page close instructing signal PC are at the L level, both of internal page mode instructing signal intPM and internal precharge instructing signal intPC provided from D-flip-flops 83 and 84 likewise maintain the L level in clock cycle #2.

In clock cycle #2, since read operation instructing signal RE is at the L level, internal read operation instructing signal intRE provided from D-flip-flop 91 is at the L level, and internal write operation instructing signal intWE provided from D-flip-flop 93 attains the H level in synchronization with the rising of clock signal CLK. In this state, the memory cell selection is performed in accordance with externally applied address signals RAb and CAb in clock cycle #2, and writing of the data is performed.

In a clock cycle #3, page mode read command REPM is applied. In clock cycle #3, internal page mode instructing signal intPM attains the H level in synchronization with the rising edge of clock signal CLK. Further, internal read operation instructing signal intRE provided from D-flip-flop 91 attains the H level in synchronization with the rising of clock signal CLK in accordance with activation of read operation instructing signal RE. In clock cycle #3, write operation instructing signal intWE is at the L level because write operation instructing signal WE is at the L level. In clock cycle #3, the row and column selecting operations are performed in accordance with internal address signals RAc and CAc, which are produced from D-flip-flops 88 and 90 in accordance with the externally applied address signal, and the data reading is performed.

Since the page mode is designated, in accordance with internal page mode instructing signal intPM, the row-related circuitry is not reset, and the selected row (page) maintains the selected state. Sense activation timing signal SOT shown in FIG. 12 maintains the active state. The column-related circuitry is reset.

Delayed page mode instructing signal intPM1 maintains the L level in clock cycle #3 because internal page mode instructing signal intPM is at the. L level when clock signal CLK rises in clock cycle #3.

In a clock cycle #4, page mode read command REPM is provided again. In accordance with page mode read command REPM, row-related activating signal intACT maintains the H level in clock cycle #4 as well, and internal page mode instructing signal intPM also maintains the H level. Internal read operation instructing signal intRE maintains the H level in accordance with read operation instructing signal RE. Since multiplexer 87 shown in FIG. 13 selects the address provided in the last cycle, address signal RAc is used as the page address in cycle #4 as well. The column address turns to an address CAd in accordance with externally applied address signal A[16:3].

In accordance with internal page mode instructing signal intPM in clock cycle #3, delayed page mode instructing signal intPM1 attains the H level in synchronization with the rising of clock signal CLK.

In clock cycle #4, sense amplifier activating signal SOT is maintained in the active state continuously from clock cycle #3, and normal mode column-related trigger signal CAST1 shown in FIG. 12 is not activated. By activating delayed internal page mode instructing signal intPM1, page mode column-related trigger signal CASTpm provided from page operation column-related trigger signal generating circuit 76 shown in FIG. 12 is activated at a predetermined timing in accordance with clock signal CLK. Accordingly, the read column select operation is performed in accordance with internal read operation instructing signal intRE, and the data reading is performed.

In a clock cycle #5, precharge command PC is applied. When precharge command PC is applied, precharge operation instructing signal PC is at the H level, and the other operation instructing signals RE, WE, REF and EM are all at the L level. In this clock cycle #5, therefore, composite gate 82 provides the output signal at the L level, and internal page mode instructing signal intPM attains the L level in synchronization with the rising of clock signal CLK.

In accordance with precharge operation instructing signal PC, internal precharge instructing signal intPC attains and keeps the H level for one clock cycle period in synchronization with the rising of clock signal CLK. In accordance with internal page mode instructing signal intPM in clock cycle #4, delayed page mode instructing signal intPM1 becomes the H level for one clock cycle period. However, read and write operation instructing signals RE and WE are both at the L level so that internal read operation instructing signal intRE and internal write operation instructing signal intWE are not activated. In clock cycle #5, the column selecting operation is not performed even if the column-related trigger signal is produced, and only the precharging on the selected row is executed.

Refresh command REF is applied in a clock cycle #6. In accordance with refresh command REF, the output signal of composite gate 80 attains the H level, and responsively, internal row-related activating signal intACT provided from D-flip-flop 81 keeps the H level for one clock cycle period. In accordance with refresh operation instructing signal REF, multiplexer 86 selects refresh address signal QA[12:0] provided from refresh address generating circuit 85. Since internal page mode instructing signal intPM is already at the L level, multiplexer 87 selects the output signal of multiplexer 86 so that D-flip-flop 88 provides refresh address signal QAa in synchronization with the rising of clock signal CLK.

This refresh address signal QAa is used as the internal row address signal, and the row selecting operation is performed. In this refresh operation, read and write operation instructing signals RE and WE are both at the L level. Therefore, the column selecting operation is not performed in the refresh operation. In this case, such a structure may be employed that a refresh operation instructing signal is internally generated to inhibit the operation of column-related circuitry. In accordance with the internal refresh operation instructing signal, column-related trigger signals CAST1 and CASTpm are kept inactive, whereby the operation of the column-related circuitry can be inhibited during the refresh operation.

In each clock cycle, as shown in FIG. 13, the states of the internal operation mode instructing signals are set by the externally applied signals. In the page mode operation, since multiplexer 87 selects row address signal RA[12:0] applied in the last cycle, the same row address is continuously applied regardless of the external address during the page operation mode period. Thus, even if the row decoder is configured to perform statically the decoding operation, the same page, or the same word line can be accurately maintained in the selected state according to the same row address in the page mode.

Figure 15:
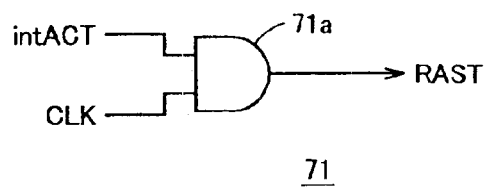
FIG. 15 shows by way of example a structure of a row-related trigger signal generating circuit shown in FIG. 12.

FIG. 15 shows an example of a configuration of row-related trigger signal generating circuit 71 shown in FIG. 12. In FIG. 15, row-related trigger signal generating circuit 71 includes an AND circuit 71a receiving internal row-related activating signal intACT and clock signal CLK to produce row-related trigger signal RAST. By utilizing AND circuit 71a, row-related trigger signal RAST can be activated in synchronization with the rising of clock signal CLK.

Figure 16:
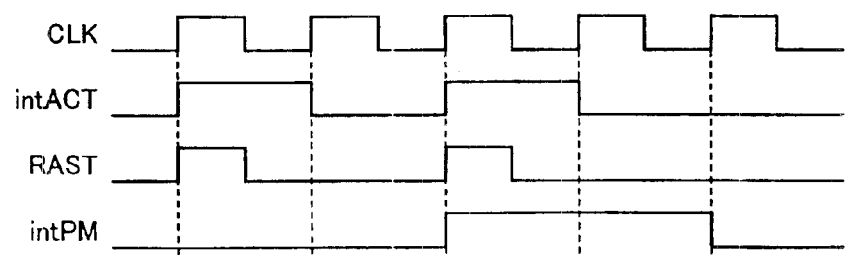
FIG. 16 is a timing chart representing an operation of the row-related trigger signal generating circuit shown in FIG. 15.

FIG. 16 is a timing chart representing an operation of row-related trigger signal generating circuit 71 shown in FIG. 15. Referring to FIG. 16, an operation of row-related trigger signal generating circuit 71 shown in FIG. 17 will now be described briefly.

Internal row-related activating signal intACT is produced from D-flip-flop 81 as shown in FIG. 13, and is kept active for one clock cycle period. Therefore, row-related trigger signal RAST is at the H level while clock signal CLK is at the H level.

When the page mode operation is set, internal row-related activating signal intACT maintains the H level in the first cycle of this page mode. Thereby, row-related trigger signal RAST becomes the H level for a period of half a clock cycle in synchronization with the rising of clock signal CLK. In and after the next cycle, internal page mode instructing signal intPM is set to the H level so that internal row-related activating signal intACT maintains the L level, and accordingly row-related trigger signal RAST maintains the L level to inhibit a new row selecting operation in the page mode. As will be described later in greater detail, when the page mode is set, no resetting is performed in row-related timing control circuit 72 shown in FIG. 12 so that the states of the row-related circuitry does not change even if row-related trigger signal RAST is fixed at the L level. The selected page maintains the open state.

Figure 17:
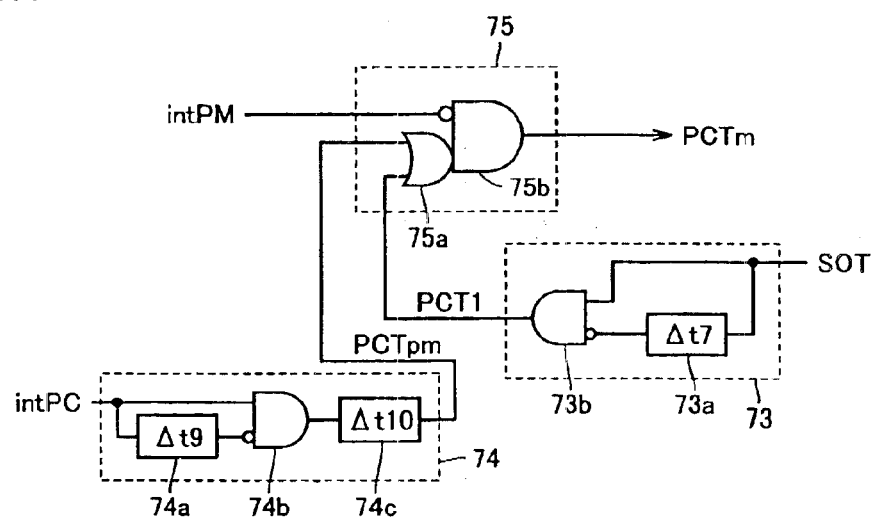
FIG. 17 shows, by way of example, structures of a precharge trigger switch circuit and a precharge trigger signal generating circuit shown in FIG. 12.

FIG. 17 shows, by way of example, configurations of normal operation precharge trigger signal generating circuit 73 and page operation precharge trigger signal generating circuit 74 shown in FIG. 12. In FIG. 17, normal operation precharge trigger signal generating circuit 73 includes a delay circuit 73a delaying sense activation timing signal SOT by a predetermined time $\Delta t7$, and a gate circuit 73b receiving the output signal of delay circuit 73a and sense activation timing signal SOT to produce normal precharge trigger signal PCT1.

Gate circuit 73b drives normal mode precharge trigger signal PCT1 to the H level when the output signal of delay circuit 73a is at the L level and sense activation timing signal SOT is at the H level. Therefore, normal operation precharge trigger signal generating circuit 73 produces, as normal operation precharge trigger PCT1, a one-shot pulse signal becoming the H level for a period of delay time $\Delta t7$ in accordance with activation of sense activation timing signal SOT.

Page operation precharge trigger signal generating circuit 74 includes a delay circuit 74a delaying internal precharge instructing signal intPC by a predetermined time $\Delta t9$, a gate circuit 74b receiving the output signal of delay circuit 74a and internal precharge instructing signal intPC, and a delay circuit 74c delaying the output signal of gate circuit 74b by a predetermined time $\Delta t10$ to produce page mode precharge trigger signal PCTpm.

Delay circuit 74a and gate circuit 74b form a one-shot pulse generating circuit, which generates a pulse of one shot in response to the rising of internal precharge instructing signal intPC. This one-shot pulse maintains the H level for a period determined by delay time $\Delta t9$ of delay circuit 74a. Delay circuit 74c has a delay time similar to the time required until activation of sense amplifier activation timing signal SOT. In the normal operation and in the page mode operation, the row-related circuitry is deactivated substantially at the same timing. An auto-precharge command, which designates both the precharge operation and the data access operation, may be applied in the last cycle of the page mode operation so that internal state can be internally and reliably restored to the precharge state after the column select operation, as in the normal operation mode.

Precharge trigger switch circuit 75 is equivalently formed of an OR gate 75a receiving precharge trigger signals PCT1 and PCTpm, and a logic gate 75b receiving the output signal of OR gate 75a and internal page mode instructing signal intPM. These gates 75a and 75b are formed into a composite gate.

When internal page mode instructing signal intPM is at the H level, precharge trigger switch circuit 75 fixes precharge trigger signal PCTm at the L level to inhibit the precharging (reset) of the row-related circuitry. When internal page mode instructing signal intPM is at the L level, precharge trigger signal PCTm is produced in accordance with precharge trigger signals PCT1 and PCTpm. In the page mode, sense activation timing signal SOT maintains the H level in the cycles other than the first cycle, and normal mode precharge trigger signal PCT1 is fixed at the L level. Therefore, when the page mode is released, precharge trigger signal PCTm is produced in accordance with page mode precharge trigger signal PCTpm.

Figure 18:
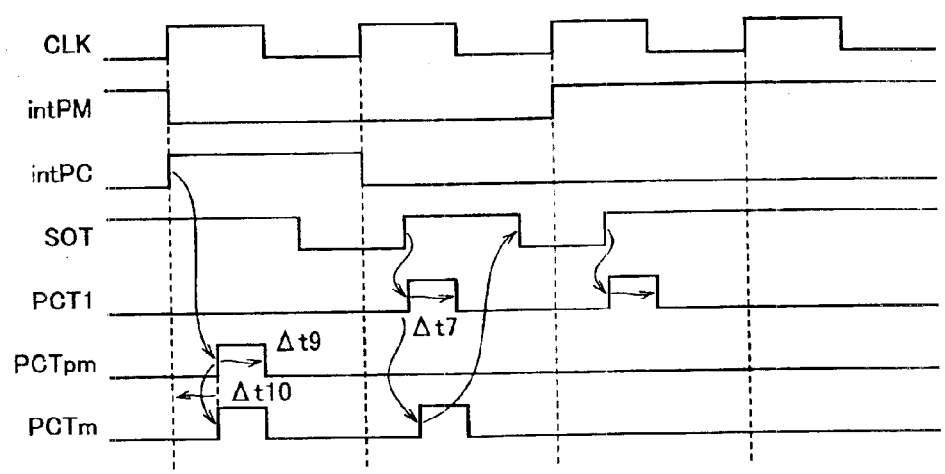
FIG. 18 is a timing chart representing an operation of the circuits shown in FIG. 17.

FIG. 18 is a timing chart representing an operation of the circuits shown in FIG. 17. Referring to FIG. 18, the operation of the row-related precharge circuitry shown in FIG. 17 will now be described. When the precharge command is applied and internal precharge instructing signal intPC rises to the H level, the internal page mode instructing signal intPM falls to the L level. When delay time $\Delta t10$ elapses after internal precharge instructing signal intPC rises, a pulse signal having a time width of $\Delta t9$ is produced, and page mode precharge trigger signal PCTpm is produced. Since internal page mode instructing signal intPM is at the L level, precharge trigger switch circuit 75 produces precharge trigger signal PCTm in accordance with page mode precharge trigger signal PCTpm. In accordance with precharge trigger signal PCTm, sense activation timing signal SOT is driven to the inactive state after a predetermined time elapses.

When the normal operation is performed in which the row and column selecting operations complete within one clock cycle, internal precharge instructing signal intPC and internal page mode instructing signal intPM are both at the L level. In this case, the row-related circuitry is activated in accordance with row-related trigger signal RAST provided from row-related trigger signal generating circuit 71 shown in FIG. 15, and sense activation timing signal SOT becomes active at a predetermined timing. In accordance with this activation of sense activation timing signal SOT, normal operation precharge trigger signal generating circuit 73 produces normal mode precharge trigger signal PCT1 in a one-shot pulse form. Therefore, precharge trigger switch circuit 75 produces precharge trigger signal PCTm in accordance with normal mode precharge trigger signal PCT1, and then sense activation timing signal SOT turns inactive after a predetermined time elapses.

When the page mode is designated and internal page mode instructing signal intPM is set to the H level in a certain cycle, sense activation timing signal SOT is driven to the active state at a predetermined timing in the same cycle. In accordance with the activation of sense activation timing signal SOT, normal operation precharge trigger signal generating circuit 73 generates normal mode precharge trigger signal PCT1. However, internal page mode instructing signal intPM is at the H level, and therefore, precharge trigger signal PCTm provided from precharge trigger switch circuit 75 is fixed at the L level.

When the page mode ends, therefore, precharge trigger signal PCTm is produced in accordance with page mode precharge trigger signal PCTpm produced according to internal precharge instructing signal intPC. In the normal operation, precharge trigger signal PCTm is produced in accordance with normal mode precharge trigger signal PCT1 produced according to sense activation timing signal SOT.

Figure 19:
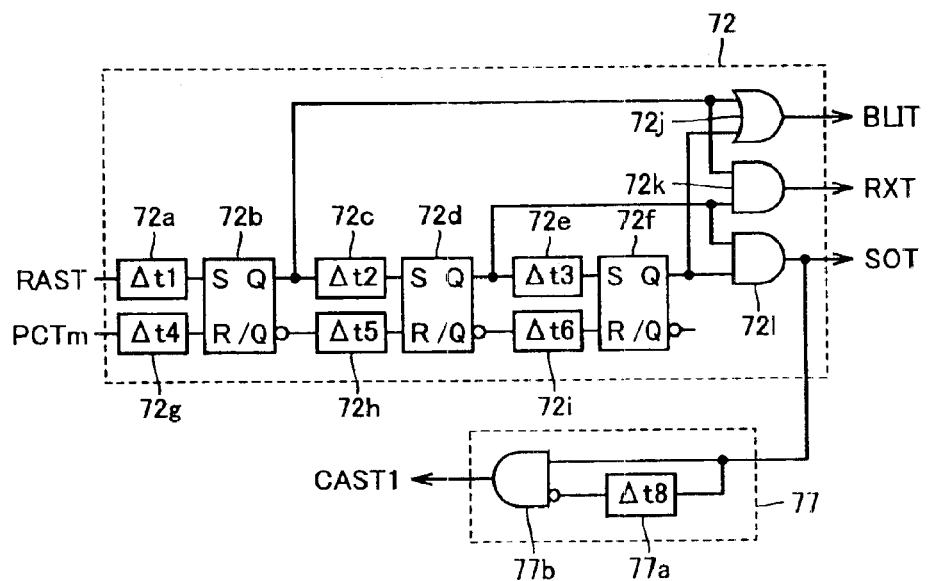
FIG. 19 shows, by way of example, a row-related timing control circuit and a normal row-related precharge trigger signal generating circuit shown in FIG. 12.

FIG. 19 shows an example of configurations of row-related timing control circuit 72 and normal operation column-related trigger signal generating circuit 77 shown in FIG. 12. In FIG. 19, row-related timing control circuit 72 includes a delay circuit 72a delaying row-related trigger signal RAST by a predetermined time Δt1, a set/reset flip-flop 72b set in response to the rising of the output signal of delay circuit 72a, a delay circuit 72c delaying the output signal provided from an output Q of set/reset flip-flop 72b by a predetermined time Δt2, a set/reset flip-flop 72d set in response to the rising of the output signal of delay circuit 72c, a delay circuit 72e delaying the output signal provided from output Q of set/reset flip-flop 72d by a predetermined time Δt3, and a set/reset flip-flop 72f set in response to the rising of the output signal of delay circuit 72e.

Each of set/reset flip-flops 72b, 72d and 72f has complementary outputs Q and /Q and provides a signal at the H level from output Q when set, and provides a signal at the H level from complementary output /Q when reset.

Row-related timing control circuit 72 further includes a delay circuit 72g delaying precharge trigger signal PCTm to a reset input R of set/reset flip-flop 72b by a predetermined time Δt4, a delay circuit 72h delaying the output signal of set/reset flip-flop 72b provided from its complementary output /Q by a predetermined time Δt5 to a reset input R of set/reset flip-flop 72d, and a delay circuit 72i delaying the output signal of set/reset flip-flop 72d provided from its complementary output /Q by a predetermined time Δt6 to a reset input R of set/reset flip-flop 72f.

Therefore, each of set/reset flip-flops 72b, 72d and 72f is set when a predetermined time elapses after row-related trigger signal RAST becomes active, and is reset when a predetermined time elapses and precharge trigger signal PCTm is applied.

Row-related timing control circuit 72 further includes an OR circuit 72j receiving the output signals of set/reset flip-flop 72b and 72f, to produce bit line isolation timing signal BLIT, an AND circuit 72k receiving the output signals provided from outputs Q of set/reset flip-flops 72b and 72d, to produce word line activation timing signal RXT, and an AND circuit 72l receiving the output signals provided from outputs Q of set/reset flip-flops 72d and 72f, to produce sense activation timing signal SOT.

Bit line isolation timing signal BLIT is set to the H level of the active state, to render the bit line isolation gate nonconductive when at least one of set/reset flip-flops 72b and 72f are in the set state. Word line drive timing signal RXT turns active to drive the addressed word line to the selected state when set/reset flip-flops 72b and 72d are both in the set state, and, while active, maintains the selected word line in the selected state. Sense activation timing signal SOT is rendered active to activate the sense amplifiers in the selected sense amplifier band when set/reset flip-flops 72d and 72f are both in the set state, and maintains these sense amplifiers active during activation thereof.

Normal operation column-related trigger signal generating circuit 77 includes a delay circuit 77a delaying sense activation timing signal SOT by a predetermined time Δt8, and a gate circuit 77b receiving the output signal of delay circuit 77a and sense activation timing signal SOT to produce normal mode column-related trigger signal CAST1. Gate circuit 77b sets normal mode column-related trigger signal CAST1 to the H level when sense activation timing signal SOT is at the H level and the output signal of delay circuit 77a is at the L level. Therefore, normal operation column-related trigger signal generating circuit 77 generates a one-shot pulse of a pulse width of Δt8 in response to the activation (rising) of sense activation timing signal SOT.

Figure 20:
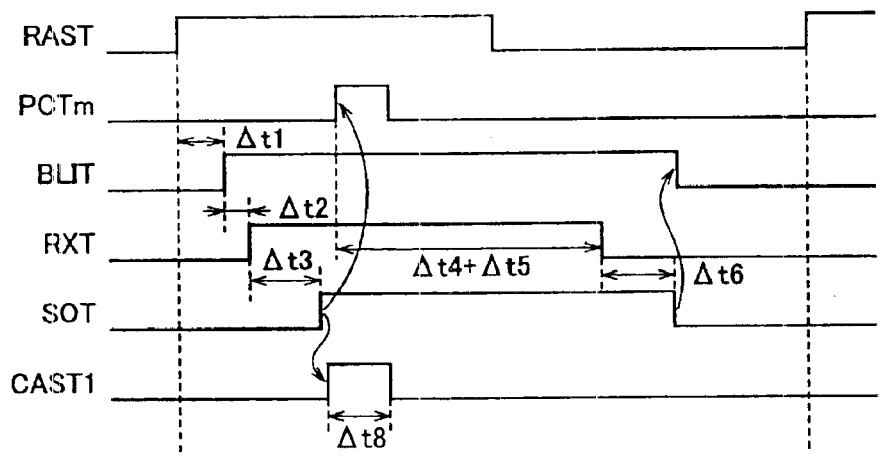
FIG. 20 is a timing chart representing an operation of the circuits shown in FIG. 19.

FIG. 20 is a timing chart representing an operation of the circuits shown in FIG. 19. Referring to FIG. 20, description will now be given on the operations of row-related timing control circuit 72 and normal operation column-related trigger signal generating circuit 77 shown in FIG. 19.

When row-related trigger signal RAST is rendered active, set/reset flip-flop 72b is set after delay time Δt1 of delay circuit 72a elapses, and responsively, bit line isolation timing signal BLIT from OR circuit 72j is driven to the H level. When delay time Δt2 of delay circuit 72c elapses after set/reset flip-flop 72b is set, set/reset flip-flop 72d is set, and word line activation timing signal RXT provided from AND circuit 72k is driven to the H level of the active state. When delay time Δt3 of delay circuit 72e elapses after set/reset flip-flop 72d is set, set/reset flip-flop 72f is set, and sense activation timing signal SOT is activated.

In response to the activation of sense activation timing signal SOT, normal operation column-related trigger signal generating circuit 77 activates normal mode column-related trigger signal CAST1 in a one-shot pulse form.

In the normal operation mode, as shown in FIG. 17, precharge trigger signal PCTm is activated in response to the activation of sense activation timing signal SOT.

When delay time Δt4 of delay circuit 72g elapses after precharge trigger signal PCTm turns active, set/reset flip-flop 72b is reset. Since set/reset flip-flop 72f is still in the set state, bit line isolation timing signal BLIT maintains the H level of the active state. When delay time Δt5 of delay circuit 72h elapses after set/reset flip-flop 72b is reset, set/reset flip-flop 72d is reset, and responsively, word line activation timing signal RXT from AND circuit 72k falls to the L level. Therefore, word line activation timing signal RXT is deactivated when a time period of (Δt4+Δt5) elapses after precharge trigger signal PCTm is applied.

When delay time Δt6 of delay circuit 72i elapses after set/reset flip-flop 72d is reset, set/reset flip-flop 72f is reset, and responsively sense activation timing signal SOT provided from AND circuit 72l is deactivated. In response to the resetting of set/reset flip-flop 72f, bit line isolation timing signal BLIT from OR circuit 72j attains the L level, and the bit line isolation gate in the off state is made conductive.

These set/reset flip-flops are successively set and reset by the delay circuits, so that the row-related control signals can be accurately activated and deactivated in a predetermined sequence.

In the page mode operation, when a precharge command is applied, precharge trigger signal PCTm is activated in accordance with the precharge command. In this case, bit line isolation timing signal BLIT, word line activation timing signal RXT and sense amplifier activation timing signal SOT are deactivated in the same sequence as the deactivation sequence illustrated in FIG. 20. In the page mode operation, as shown in FIG. 17, precharge trigger signal PCTm is maintained in the inactive state, so that set/reset flip-flops 72b, 72d and 72f maintain the set state. Accordingly, the selected word line maintains the selected state, and the sense amplifier maintains the active state. In other words, the open page maintains the open state.

Figure 21:
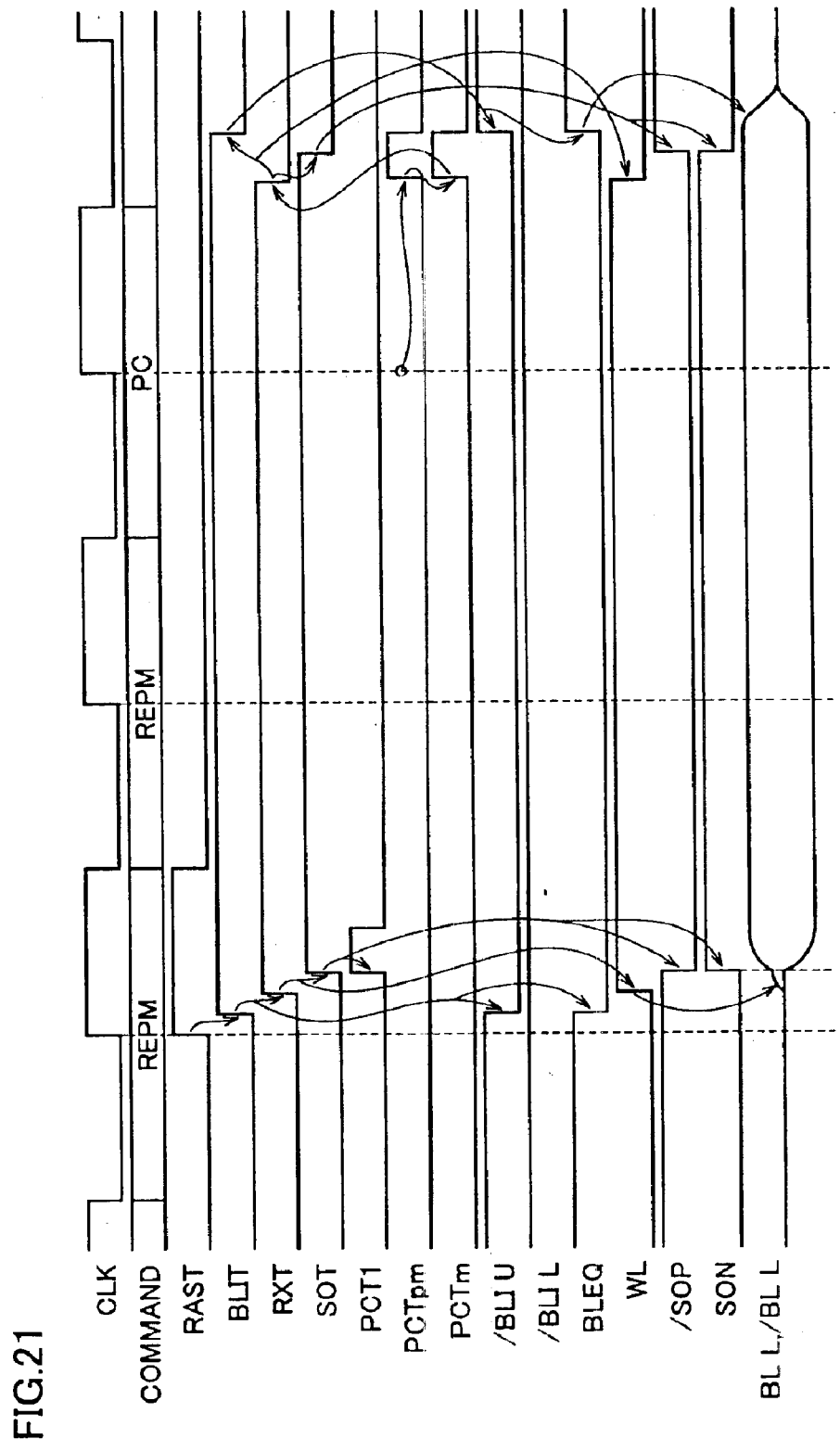
FIG. 21 is a timing chart representing an operation of circuits related to the row selection in a DRAM control circuit shown in FIG. 12.

FIG. 21 is a timing chart representing an operation of DRAM control circuit 13 shown in FIG. 12. Referring to FIG. 21 as well as FIGS. 12, 13, 15, 17 and 19, description will now be given on the row-related circuit control operation of the DRAM control circuit.

When a page mode read command REPM is applied, row-related activating signal intACT from D-flip-flop 81 shown in FIG. 13 turns active, and responsively row-related trigger signal RAST provided from row-related trigger signal generating circuit 71 shown in FIG. 15 attains and keeps the H level for a period of half a clock cycle. In response to this activation of row-related trigger signal RAST, row-related timing control circuit 72 shown in FIG. 19 activates bit line isolation timing signal BLIT, word line activation timing signal RXT and sense activation timing signal SOT at predetermined timings.

In response to the activation of bit line isolation timing signal BLIT, bit line equalize instructing signal BLEQ attains the L level to complete the bit line equalizing operation on the selected row block performed in the sense amplifier band. In accordance with the activation of bit line isolation timing signal BLIT, bit line isolation instructing signal /BLIU for the unselected memory array block falls to the L level, and bit line isolation instructing signal /BLIL maintains the H level (see FIG. 7). In response to the activation of word line activation timing signal RXT, selected word line WL is driven to the selected state. Accordingly, memory cell data is read onto bit lines BLL and /BLL.

Then, sense amplifier activating signals /SOP and SON turn active in response to the activation of sense activation timing signal SOT.

When sense activation timing signal SOT is rendered active, normal mode precharge instructing signal PCT1 provided from normal operation precharge trigger signal generating circuit 73 shown in FIG. 17 becomes active for a predetermined period. At this time, as shown in FIG. 17, the page mode is already designated, and internal page operation instructing signal intPM is at the H level, so that precharge trigger signal PCTm provided from precharge trigger switch circuit 75 maintains the inactive state. Therefore, each of the flip-flops in row-related timing control circuit 72 shown in FIG. 19 maintains the set state.

In the next clock cycle, page mode read command REPM is applied again. In this case, as shown in FIG. 13, internal page mode instructing signal intPM is already at the H level in accordance with the page mode read command applied in the last cycle, so that composite gate 80 shown in FIG. 13 has already fixed its output signal at the L level, and row-related activation instructing signal intACT maintains the L level of the inactive state even if D-flip-flop 81 enters the latching state at the rising of dock signal CLK. Responsively, row-related trigger signal RAST maintains the L level, and row-related timing control circuit 72 maintains the set state when page mode read command REPM is applied for a second time, and the row-related circuitry does not change the state thereof.

When precharge command PC is applied in the next cycle, D-flip-flop 84 shown in FIG. 13 sets internal precharge instructing signal intPC to the H level. Responsively, page operation precharge trigger signal generating circuit 74 shown in FIG. 17 generates page mode precharge instructing signal PCTpm when a predetermined time elapses, and precharge trigger switch circuit 75 activates precharge trigger signal PCTm in accordance with page mode precharge trigger signal PCTpm. In accordance with precharge trigger signal PCTm, row-related timing control circuit 72 successively deactivates bit line isolation timing signal BLIT, word line activation timing signal RXT and sense activation timing signal SOT in a predetermined sequence as shown in FIG. 19.

When sense activation timing signal SOT is deactivated, sense amplifier activating signals /SOP and SON are deactivated. In accordance with the deactivation of word line activation timing signal RXT, the selected word line WL is driven to the unselected state. Thereafter, bit line isolation timing signal BLIT is rendered inactive, bit line isolation instructing signal /BLIU attains the H level and bit line equalize instructing signal BLEQ attains the H level, so that bit lines BLL and /BLL are precharged and equalized.

In the normal operation mode, the row selecting operation and column selecting operation are completed within one clock cycle. In this normal operation mode, precharge trigger signal PCTm is produced according to normal mode precharge trigger signal PCT1 instead of page mode precharge trigger signal PCTpm produced upon application of precharge command PC in the operation timing chart of FIG. 21. Accordingly, row-related timing control circuit 72 is reset.

When the page mode is designated, therefore, resetting in row-related timing control circuit 72 is inhibited until the precharge command is applied. Accordingly, the row can be internally maintained in the selected state, and the column access can be successively made on the open page.

Figure 22:
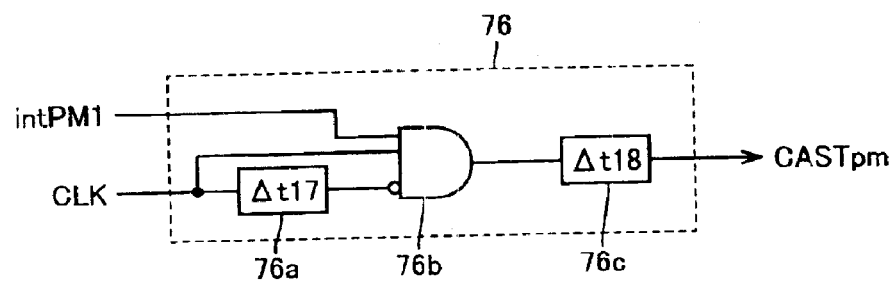
FIG. 22 shows, by way of example, a structure of a column-related trigger signal generating circuit for a page operation shown in FIG. 12.

FIG. 22 shows, by way of example, a configuration of page operation column-related trigger signal generating circuit 76 shown in FIG. 12. In FIG. 22, page operation column-related trigger signal generating circuit 76 includes a delay circuit 76a delaying clock signal CLK by a predetermined time Δt17, a gate circuit 76b receiving the output signal of delay circuit 76a, clock signal CLK and delayed internal page mode instructing signal intPM1, and a delay circuit 76c delaying the output signal of gate circuit 76b by a predetermined time Δt18 to produce page mode column-related trigger signal CASTpm.

Gate circuit 76b provides a signal at the H level when the output signal of delay circuit 76a is at the L level, and clock signal CLK and delayed internal page mode instructing signal intPM1 are both at the H level. An operation of page operation column-related trigger signal generating circuit 76 shown in FIG. 22 will now be described with reference to a timing chart of FIG. 23.

Figure 23:
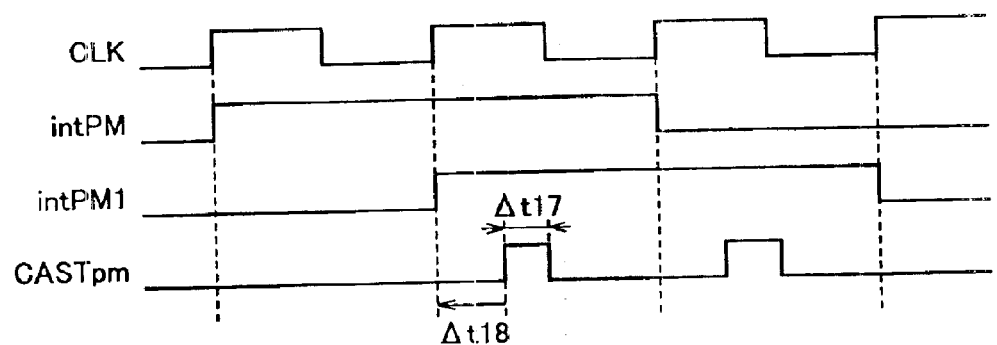
FIG. 23 is a timing chart representing an operation of the column-related trigger signal generating circuit for the page operation shown in FIG. 22.

When the page mode is designated, internal page mode instructing signal intPM maintains the H level during the page mode. In FIG. 23, the page mode is set for a period of two clock cycles, and accordingly, internal page mode instructing signal intPM maintains the H level for two clock cycles.

As shown in FIG. 13, delayed page mode instructing signal intPM1 is produced by delaying internal page mode instructing signal intPM1 by one clock cycle. Therefore, in the clock cycle for designation of the page mode, delayed page mode operation instructing signal intPM1 is at the L level, and accordingly, the page mode column-related trigger signal CSTpm maintains the L level.

In the next clock cycle, delayed internal page mode instructing signal intPM1 rises to the H level. Thus, in response to the rising of clock signal CLK, the output signal of gate circuit 76b attains the H level. The output signal of gate circuit 76b is at the H level for a period of delay time Δt17 of delay circuit 76a. Delay circuit 76c delays the output signal of gate circuit 76b by the time of Δt18. By utilizing delay circuit 76b, the internal operation timings of the column-related circuits in the normal operation mode can be made the same as that in the page mode, to ensure margins for reading and writing data in the page mode as well.

Even when the page mode instructing signal intPM falls to the L level, delayed internal page mode instructing signal intPM1 maintains the H level in the next clock cycle. Upon exit from the page mode operation, page operation column-related trigger signal generating circuit 76 generates page mode column-related trigger signal CASTpm. If the page mode of operation is released in response to the application of the precharge command, then the precharge operation is executed. If neither the read command nor the write command is applied, the column-related circuitry does not operate so that no particular problem occurs.

When the auto-precharge command is applied, internal page mode instructing signal intPM is set to the L level in the same cycle as the cycle of application of the auto-precharge command. The column-related circuits operate in accordance with the read and write commands. In this cycle, since sense activation timing signal SOT is at the H level, normal mode column-related trigger signal CAST1 is kept inactive. Column-related trigger signal CASTpm produced in accordance with delayed internal page mode instructing signal intPM1 is utilized as the trigger signal of the activation of the column-related circuitry. The page mode can be released by utilizing the auto-precharge command designating the data access and precharging.

Figure 24:
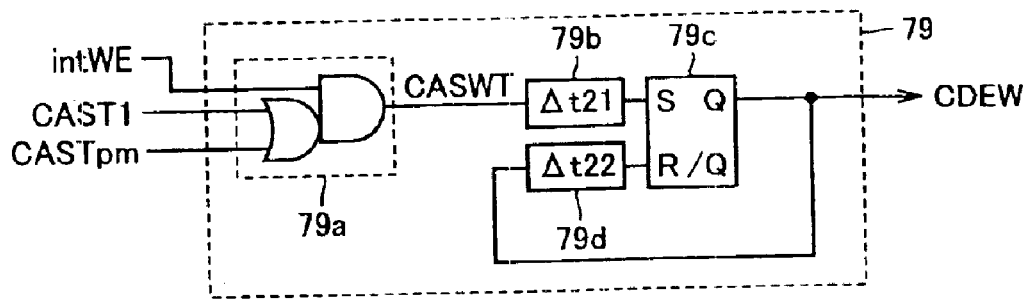
FIG. 24 shows, by way of example, a structure of a column-related write timing control circuit shown in FIG. 12.

FIG. 24 schematically shows an example of the configuration of column-related write timing control circuit 79 shown in FIG. 12. In FIG. 24, column-related write timing control circuit 79 includes a composite gate 79a receiving internal write operation instructing signal intWE and column-related trigger signals CAST1 and CASTpm, to produce a write-related trigger signal CASWT, a delay circuit 79b delaying output signal CASWT of composite gate 79a by a predetermined time Δt21, a set/reset flip-flop 79c set in response to the rising of the output signal of delay circuit 79b, to activate write-related column decoder enable signal CDEW, and a delay circuit 79t delaying write-related column decoder enable signal CDEW by a predetermined time Δt22, to reset the set/reset flip-flop 79c.

In accordance with write column decoder enable signal CDEW, the write column decoder is activated to perform the decoding and produce the write column select signal.

Composite gate 79a equivalently includes an OR gate receiving column-related trigger signals CAST1 and CASTpm, and an AND gate receiving the output of this OR gate and internal write operation instructing signal intWE.

Figure 25:
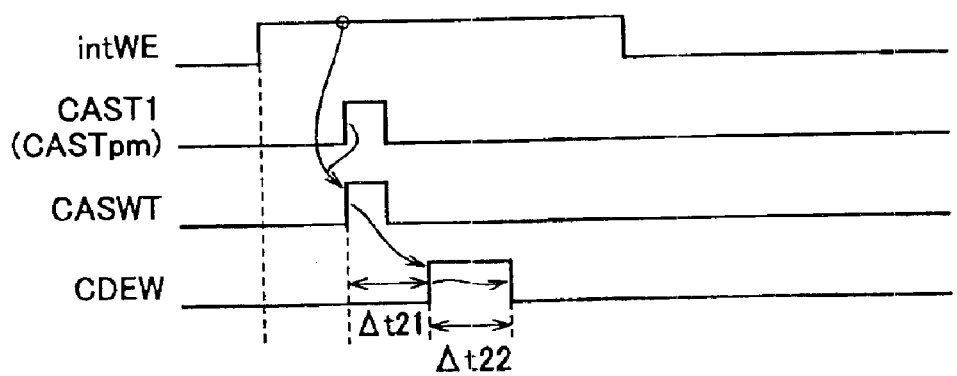
FIG. 25 is a timing chart representing an operation of the circuit shown in FIG. 24.

FIG. 25 is a timing chart illustrating column-related write timing control circuit 79 shown in FIG. 24. Referring to FIG. 25, an operation of column-related write timing control circuit 79 shown in FIG. 24 will now be described.

When the write command is applied, internal write operation instructing signal intWE is set to the H level for a period of one clock cycle. When internal write operation instructing signal intWE rises, the internal row-related circuitry operates, and normal mode column-related trigger signal CAST1 turns active in accordance with the activation of sense activation timing signal SOT. Thereby, write column-related trigger signal CASWT provided from composite gate 79a turns active. After elapsing of delay time Δt21, set/reset flip-flop 79c is set, and write column decoder enable signal CDEW turns active. When delay time Δt22 of delay circuit 79d elapses, set/reset flip-flop 79c is reset, and column decoder enable signal CDEW is deactivated.

In the page mode operation, write column-related trigger signal CASWT is rendered active in accordance with page mode column-related trigger signal CSTpm produced by the circuit 76 shown in FIG. 22 instead of normal mode column-related trigger signal CAST1.

Accordingly, by resetting this set/reset flip-flop after elapsing of a predetermined time determined by delay circuit 79d, write column decoder enable signal CDEW can be active in a self-timed manner for a predetermined time even in the page mode, and the write column select line can be driven to the selected state.

Figure 26A:
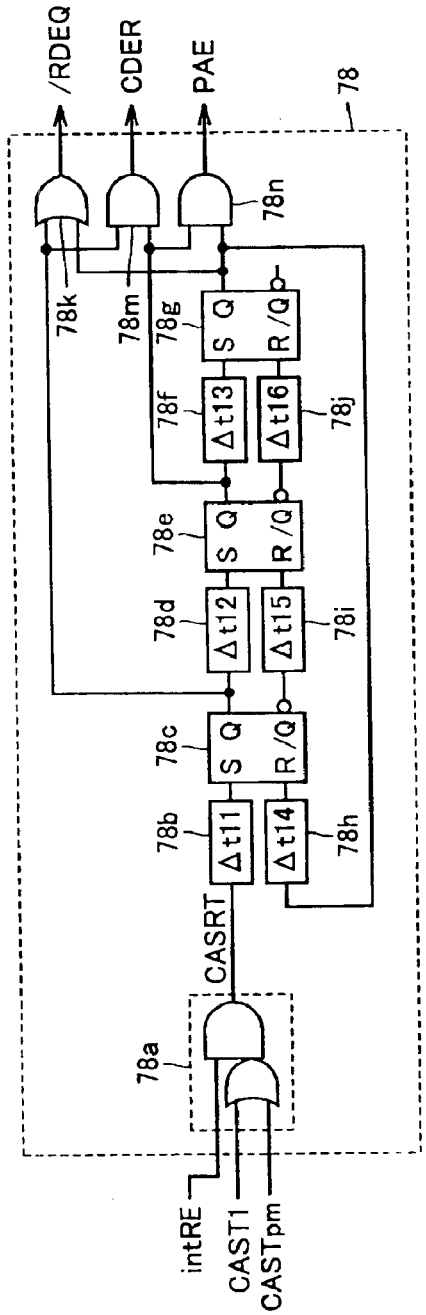
FIG. 26A shows, by way of example, a structure of a column-related read timing control circuit shown in FIG. 12.

FIG. 26A shows, by way of example, a configuration of column-related read timing control circuit 78 shown in FIG. 12. In FIG. 26A, column-related read timing control circuit 78 includes a composite gate 78a receiving column-related trigger signals CAST1 and CASTpm and internal read operation instructing signal intRE, to produce a column-related read trigger signal CASRT, a delay circuit 78b delaying an output signal CASRT of composite gate 78a by a predetermined time Δt11, a set/reset flip-flop 78c set in response to the rising of the output signal of delay circuit 78b, a delay circuit 78d delaying a signal provided from an output Q of set/reset flip-flop 78c by a predetermined time Δt12, a set/reset flip-flop 78e set in response to the rising of the output signal of delay circuit 78d, a delay circuit 78f delaying a signal provided from an output Q of set/reset flip-flop 78e by a predetermined time Δt13, and a set/reset flip-flop 78g set in response to the rising of the output signal of delay circuit 78f.

Set/reset flip-flops 78c, 78e and 78g each set a signal from output Q to the H level when set, and set the signal from output /Q to the H level when reset.

Column-related read timing control circuit 78 further includes a delay circuit 78h delaying the output signal provided from an output Q of set/reset flip-flop 78g by a predetermined time Δt14 to reset set/reset flip-flop 78c, a delay circuit 78i delaying the signal provided from output /Q of set/reset flip-flop 78c by a predetermined time Δt15 to reset set/reset flip-flop 78e, and a delay circuit 78j delaying the signal provided from output /Q of set/reset flip-flop 78e by a predetermined time Δt16 to reset set/reset flip-flop 78g. These set/reset flip-flops 78c, 78e and 78g are successively set, and are then reset upon elapsing of the predetermined times, respectively.

Column-related read timing control circuit 78 further includes an OR circuit 78k receiving signals from outputs Q of set/reset flip-flops 78c and 78g, to produce read data bus equalize instructing signal /RDEQ, an AND circuit 78m receiving signals from outputs Q of set/reset flip-flops 78d and 78e, to produce read column decoder enable signal CDER, and an AND circuit 78n receiving signals from outputs Q of set/reset flip-flops 78e and 78g, to produce preamplifier activating signal PAE.

Figure 26B:
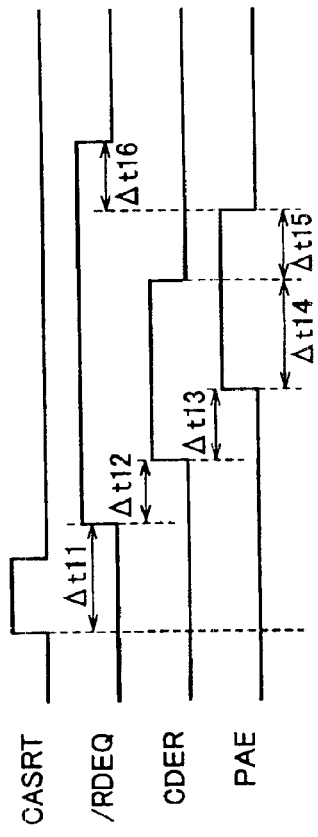
FIG. 26B is a timing chart representing an operation of the circuit shown in FIG. 26A.

Composite gate 78a equivalently includes an OR gate receiving column-related trigger signals CAST1 and CASTpm, and an AND circuit receiving the output signal of this OR gate and internal read operation instructing signal intRE, to produce read column-related trigger signal CASRT. An operation of column-related read time control circuit 78 shown in FIG. 26A will now be described with reference to a timing chart of FIG. 26B.

In performing the data reading, internal read operation instructing signal intRE is rendered active. When the read command, page mode read command or auto-precharge read command is applied, trigger signal CAST1 or CASTpm is activated after activation of the sense amplifier activation timing signal or after elapsing of a predetermined time, and responsively read column-related trigger signal CASRT is rendered active. After read column-related trigger signal CASRT provided from composite gate 78a turns active, set/reset flip-flop 78c is set when delay time Δt11 of delay circuit 78b elapses, and accordingly read data bus equalize instructing signal /RDEQ provided from OR gate 78k attains the H level.

When delay time Δt12 of delay circuit 78d elapses after set/reset flip-flop 78c is set, set/reset flip-flop 78e is set, and responsively read column decoder enable signal CDER provided from AND circuit 78 is activated. In accordance with this activation of read column decoder enable signal CDER, the read column decoder is activated to produce the column select signal.

When delay time Δt13 of delay circuit 78f elapses after set/reset flip-flop 78e is set, set/reset flip-flop 78g is set, and responsively, a preamplifier activation signal PAE provided from AND circuit 78n is rendered active. Responsively, preamplifier circuit 56 shown in FIG. 10 enters the active state to amplify and latch the data on internal data lines RD and /RD.

When delay time Δt14 of delay circuit 78h elapses after preamplifier activating signal PAE turns active, set/reset flip-flop 78c is reset, and the signal provided from output Q of set/reset flip-flop 78c attains the L level. Accordingly, read column decoder enable signal CDER provided from AND circuit 78m is inactivated, and the selected column is driven to the unselected state. When delay time Δt15 of delay circuit 78i elapses after the resetting of set/reset flip-flop 78c, set/reset flip-flop 78e is reset, and the signal provided from output Q of set/reset flip-flop 78e attains the L level, so that preamplifier activating signal PAE turns inactive.

When set/reset flip-flop 78g is reset, the signals on both the inputs of OR circuit 78k attain L level, and read data bus equalize instructing signal /RDEQ attains the L level again, so that the read data lines are equalized and precharged.

In reading data in any of the page mode and the normal mode, as shown in FIG. 26A, read data line equalize instructing signal /RDEQ, read column decoder enable signal CDER and preamplifier activating signal PAE are activated and deactivated in a predetermined sequence when read column-related trigger signal CASRT is made active.

Figure 27:
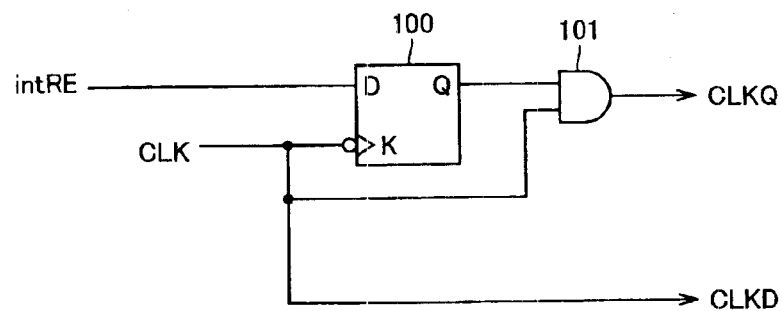
FIG. 27 shows, by way of example, a structure of a clock generating circuit for read and write clocks included in the DRAM control circuit shown in FIG. 2.

FIG. 27 schematically shows a configuration of a portion for generating an internal read clock and an internal write clock. In FIG. 27, an internal write/read clock generating portion includes a D-flip-flop 100 taking in and providing internal operation instructing signal intRE in synchronization with the falling of clock signal CLK, and an AND circuit 101 receiving internal clock signal CLK and the output signal of D-flip-flop 100, to produce read clock signal CLKQ.

Write clock signal CLKD is produced in accordance with internal clock signal CLK. In the configuration shown in FIG. 10, the externally applied write data is fixed at a predetermined voltage level when no data write operation is performed. Accordingly, internal write driver 62 drives the write data bus in accordance with this fixed data when no data writing is performed, and no charging and no discharging of the write data bus are performed, so that no particular problem occur. Alternatively, the write driver may be activated and deactivated in accordance with internal write operation instructing signal intWE. The write data bus can be driven reliably only in the data write operation. Although data writing D-flip-flop 60 in FIG. 10 always operates, the write driver is inactive except the period of data writing, so that the current consumption can be reduced.

D-flip-flop 100 takes in and outputs the signal applied to its input D in synchronization with the falling of clock signal CLK. Therefore, D-flip-flop 100 delays by a half clock cycle and provides internal read operation instructing signal intRE. An operation of the internal clock generating portion shown in FIG. 27 will now be described with reference to FIG. 28.

When the read command is applied, internal read operation instructing signal intRE rises to the H level in synchronization with the rising of clock signal CLK. When clock signal CLK falls to the L level, the signal provided from output Q of D-flip-flop 100 attains the H level. In this state, clock signal CLK is at the L level so that read clock signal CLKQ provided from AND circuit 101 is at the L level. In synchronization with the next rising of clock signal CLK to the H level, read clock signal CLKQ provided from AND circuit 101 attains the H level. While the read operation is repeated, read clock signal CLKQ is produced in synchronization with clock signal CLK.

When the write command is applied, in that cycle internal read operation instructing signal intRE and internal write operation instructing signal intWE attains the L- and H-levels, respectively. In this cycle, D-flip-flop 100 provides the output signal at the H level, so that read clock signal CLKQ is produced in synchronization with clock signal CLK. In accordance with the rising of internal write operation instructing signal intWE to the H level, AND circuit 102 produces write clock signal CLKD. Even when these read and write clock signals CLKQ and CLKD are both produced, data conflict does not occur because the data read path and the data write path are provided separately in the semiconductor memory device.

When clock signal CLK falls to the L level, the output signal of D-flip-flop 100 attains the L level, and generation of read clock signal CLKQ stops. However, write clock signal CLKD is produced in synchronization with clock signal CLK regardless of the state of internal write operation instructing signal intWE.

Read and write clock signals CLKQ and CLKD are applied to D-flip-flops 58 and 60 shown in FIG. 10, respectively, and transfer of data to an outside of the device and of external data to an inside of the device can be performed in synchronization with dock signal CLK.

Figure 29:
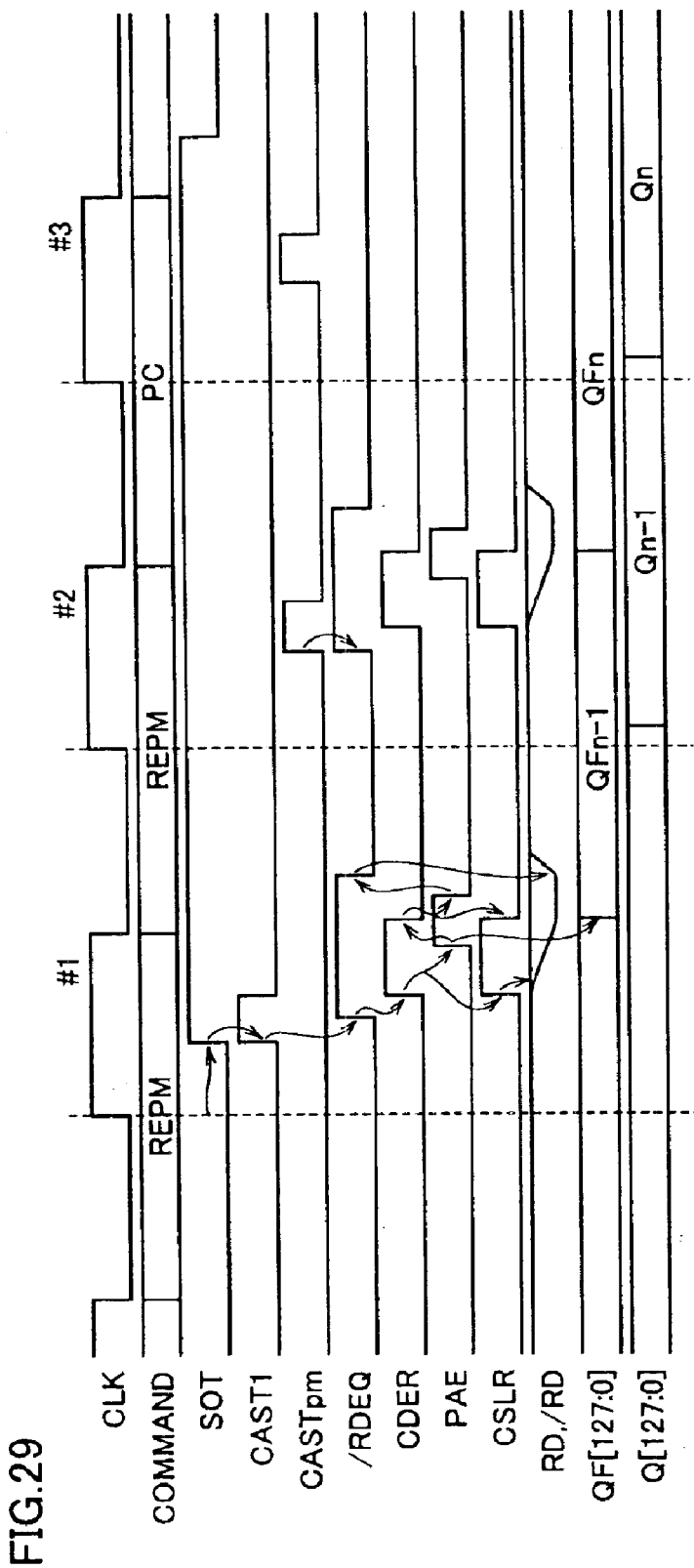
FIG. 29 is a timing chart representing an operation of a portion related to a data reading of the DRAM control circuit shown in FIG. 12.

FIG. 29 is a timing chart representing an operation of a column-related control portion of DRAM timing control circuit 13 shown in FIG. 12. Referring to FIG. 29, description will now be given on an operation of the column-related control portion in DRAM control circuit 13 in data reading.

In clock cycle #1, page mode read command REPM is applied. When page mode read command REPM is applied in clock cycle #1, the row select operation is performed, and sense activation timing signal SOT provided from row-related timing control circuit 72 shown in FIG. 19 is activated at a predetermined timing. In response to the activation of sense activation timing signal SOT, normal mode column-related trigger signal CAST1 provided from normal operation column-related trigger signal generating circuit 77 becomes the H level for a predetermined period, as shown in FIG. 19.

According to normal mode column-related trigger signal CAST1, column-related read timing control circuit 78 shown in FIG. 26A drives read data bus equalize instructing signal /RDEQ to the H level, and then drives read column decoder enable signal CDER to the H level. In accordance with activation of read column decoder enable signal CDER, the read column decoder performs the column selecting operation, and drives a read column select line CSLR corresponding to the selected column to the H level. Accordingly, data is read from the selected memory cell onto read data lines RD and /RD.

Then, column-related read timing control circuit 78 shown in FIG. 26A activates preamplifier activating signal PAE, so that the preamplifier circuit operates, and data QFn–1 is latched.

When a predetermined period elapses after preamplifier activating signal PAE turns active, read column decoder enable signal CDER is inactivated as shown in FIG. 26A, and then preamplifier activating signal PAE becomes inactive.

Even when preamplifier activating signal PAE is inactive, latch circuit 57 continues to latch the output data of preamplifier circuit 56 as shown in FIG. 10. Thereafter, read data bus equalize instructing signal /RDEQ attains the L level, and read data lines RD and /RD are precharged and equalized to the peripheral power supply voltage level again.

Figure 28:
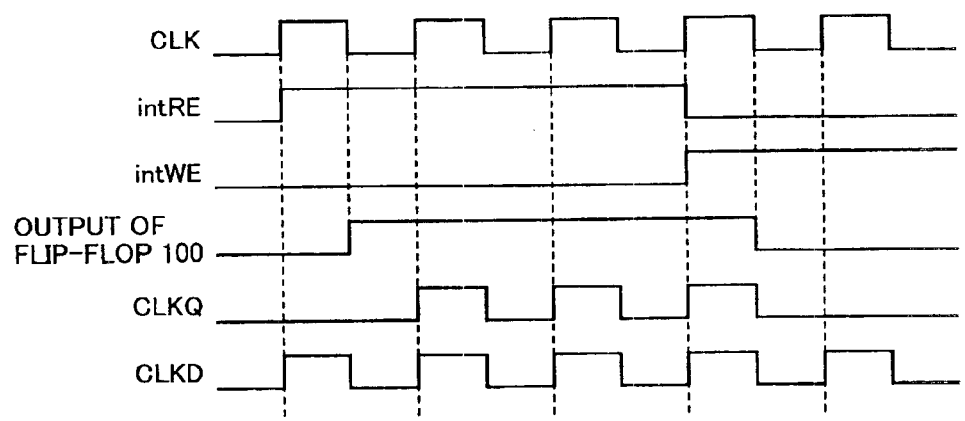
FIG. 28 is a timing chart representing an operation of a circuit shown in FIG. 27.

In clock cycle #2, when clock signal CLK rises to the H level, read clock signal CLKQ attains the H level as shown in FIG. 28, and latched data QFn−1 is output as external data Qn−1.

In parallel with the transfer of data from D-flip-flop 58 shown in FIG. 10, the column select operation and data read operation are internally performed in accordance with page mode read command REPM. In this case, the page mode is designated in clock cycle #1, sense activation timing signal SOT maintains the active state, and normal mode column-related trigger signal CAST1 maintains the L level. Meanwhile, as shown in FIG. 22, page operation column-related trigger signal generating circuit 76 produces page mode column-related trigger signal CASTpm at a predetermined timing, and column-related read timing control circuit 78 shown in FIG. 26A activates or deactivates the signals /RDEQ, CDER and PAER in a predetermined sequence again, so that the column selection and reading of internal data QFn are performed.

In clock cycle #3, when precharge command PC is applied, the selected row is driven to the unselected state, and sense activation timing signal SOT is driven to the inactive state. In the clock cycle #3, page mode column-related trigger signal CASTpm is generated in accordance with delayed internal page mode instructing signal intPM1 (see FIG. 22). In clock cycle #3, however, neither the read command nor the write command is applied, so that no column select operation is performed, and column-related read timing control circuit 78 shown in FIG. 26A maintains the set state.

In clock cycle #3, read clock signal CLKQ is produced as shown in FIG. 27, and read data Qn is transferred from D-flip-flop 58 shown in FIG. 10 in accordance with latched internal read data QFn.

Thereby, data Q[127:0] of 128 bits can be read in each clock cycle according to the page mode.

Figure 30:
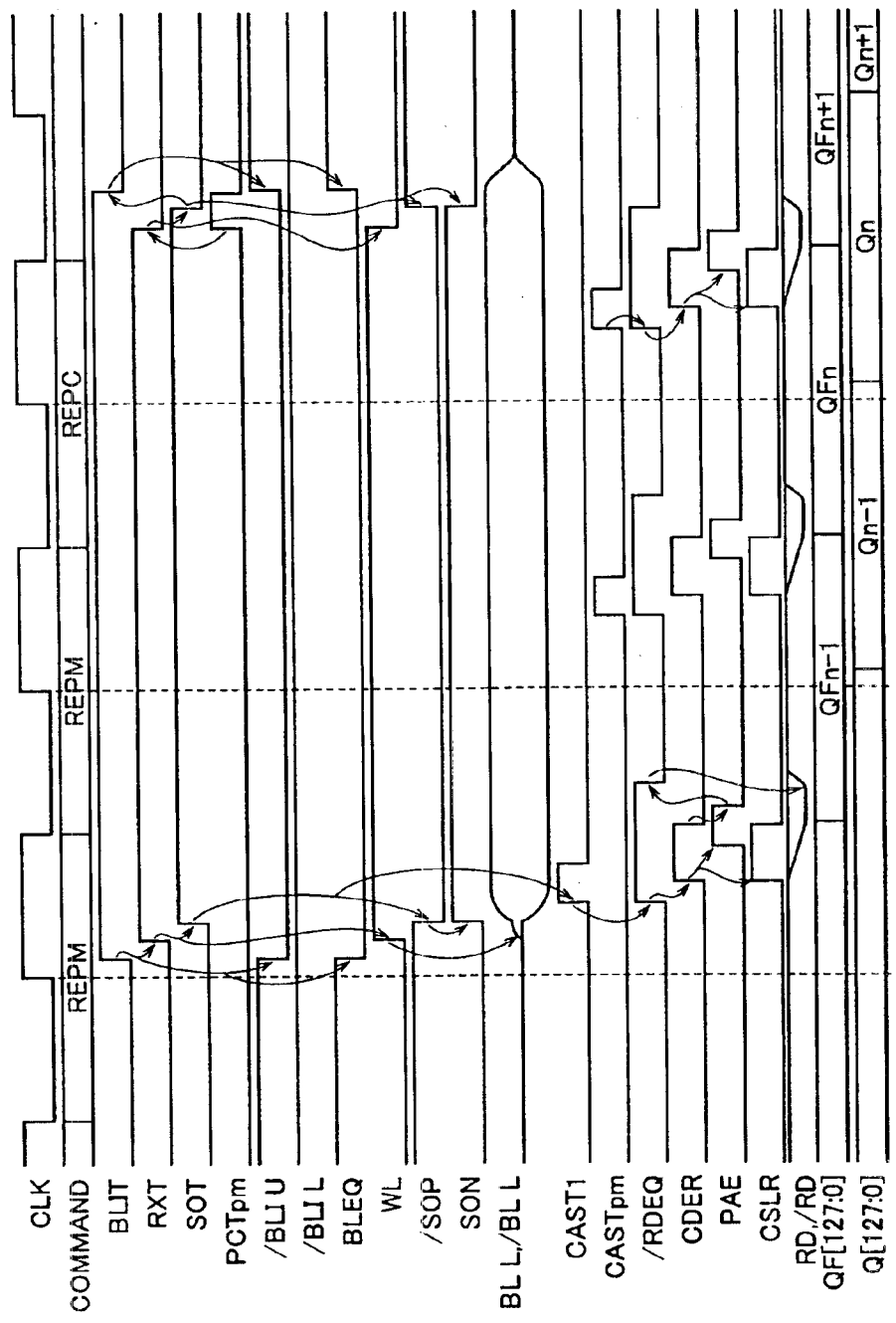
FIG. 30 is a timing chart representing an operation of the whole pseudo-SRAM shown in FIG. 2.

FIG. 30 is a timing chart representing an operation in the case where precharge read command REPC designating the auto-precharge is applied in the last operation of reading data in the page mode. Referring to FIG. 30, the operation of DRAM timing control circuit 13 shown in FIG. 12 will now be described briefly.

When page mode read command REPM is applied, row-related timing control circuit 72 shown in FIG. 12 is set to activate bit line isolation timing signal BLIT, word line activation timing signal RXT and sense activation timing signal SOT in a predetermined sequence. In response to the activation of bit line isolation timing signal BLIT, bit line isolation instructing signal /BLIU shown in FIG. 7 is driven to the L level. In response to the activation of word line activation timing signal RXT, a word line WL is driven to the selected state, and sense amplifier activating signals /SOP and SON are activated in accordance with the activation of sense activation timing signal SOT. Data of memory cell is read onto bit lines BLL and /BLL.

In response to the activation of sense activation timing signal SOT, normal operation column-related trigger signal generating circuit 77 shown in FIG. 12 activates normal mode column-related trigger signal CAST1. Then, column-related read timing control circuit 78 shown in FIG. 12 drives read data bus equalize instructing signal /RDEQ, read column decoder enable signal CDER and preamplifier activating signal PAE to the H level in a predetermined sequence. In accordance with the activation of read column decoder enable signal CDER, the column selection is performed, and read column select line CSLR is driven to the H level so that data is read onto read data lines RD and /RD. In accordance with the activation of preamplifier activating signal PAE, the internal data is amplified to produce latch data QFn−1.

Since the page mode is designated, the row-related circuitry maintains the selected state. When page mode read command REPM is applied again in the next clock cycle, row-related timing control circuit 72 shown in FIG. 12 maintains the set state, so that the circuit portion (row-related circuitry) related to the row selection do not change the states thereof. Meanwhile, page operation column-related trigger signal generating circuit 76 shown in FIG. 12 activates page mode column-related trigger signal CASTpm, and accordingly column-related read timing control circuit 78 is activated to drive the signals /RDEQ, CDER and PAE to the H level in a predetermined sequence so that column selection is performed, and next latch data QFn is produced. In synchronization with the rising of clock signal CLK in this clock cycle, data Qn is produced as data Q[127:0] of 128 bits according to latch data QFn.

When a predetermined period elapses, column-related read timing control circuit 78 drives read column decoder enable signal CDER, preamplifier activating signal PAE and read data line equalize instructing signal RDEQ to the L level. Therefore, read data lines RD and /RD are precharged and equalized to the peripheral power supply voltage level again.

In the next cycle, precharge read command REPC is applied. When precharge read command REPC is applied, page close instructing signal PC and read operation instructing signal RE are both at the H level as shown in FIG. 3. Therefore, in accordance with page close instructing signal PC, page mode precharge trigger signal PCTpm is activated at a predetermined timing after completion of the column select operation, and word line activation timing signal RXT, sense activation timing signal SOT and bit line isolation timing signal BLIT are sequentially driven to the L level so that the row-related circuitry returns to the standby state. Specifically, word line WL is driven to the unselected state in accordance with word line activation timing signal RXT, and then, sense amplifier activating signals /SOP and SON turn inactive in accordance with sense activation timing signal SOT. Thereafter, bit line isolation instructing signal /BLIU and bit line equalize instructing signal BLEQ return to the H level in accordance with bit line isolation timing signal BLIT.

Column-related read timing control circuit 78 shown in FIG. 2 performs the column selecting operation in accordance with page mode column-related trigger signal CAST before the activation of the sense amplifier, and returns to the precharge state after the column selecting operation and the data reading. The preamplifier may be deactivated after the word line changes into the unselected state.

By applying this precharge read command REPC, the row-related circuitry returns to the precharge state after completion of the data read operation. Therefore, it is not particularly necessary to provide a cycle for precharging the row-related circuitry so that the processing efficiency can be improved.

Figures 31, 32, 33:
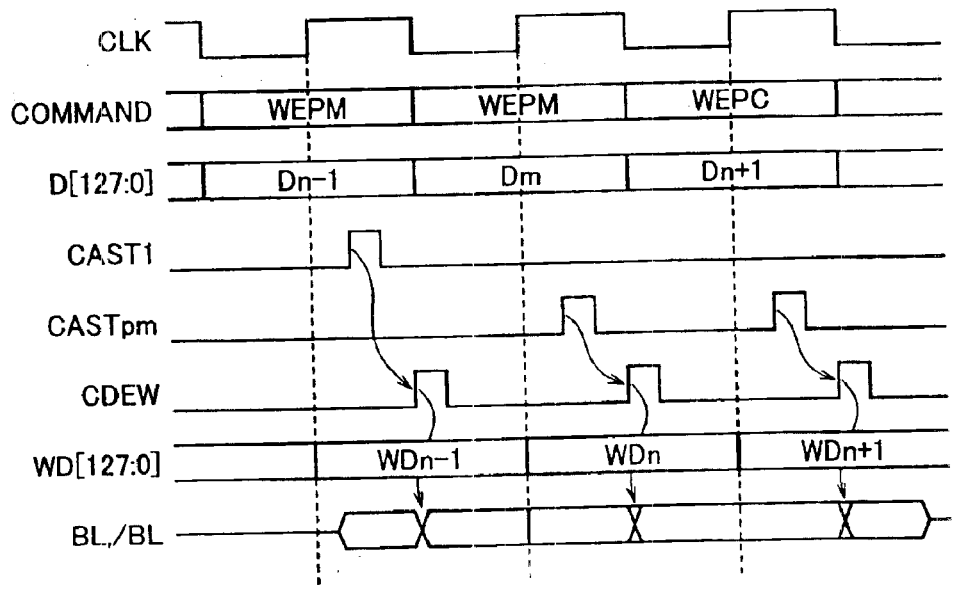
FIG. 31 is a timing chart representing an operation of a portion related to data writing of the DRAM control circuit shown in FIG. 12.
FIG. 32 illustrates truth values of commands of the pseudo-SRAM according to a second embodiment of the invention.
FIG. 33 illustrates a correlation between setting of a page mode and address bits in the second embodiment.

FIG. 31 is a timing chart representing an operation in data writing. Referring to FIG. 31, description will now be given on the operation, which is performed by DRAM timing control circuit 13 shown in FIG. 12 in data writing.

First, page mode write command WEPM is applied together with data Dn−1 (D[127:0]). In synchronization with the rising of clock signal CLK, internal write data WDn−1 is produced. After the row select operation is internally executed, normal mode column-related trigger signal CAST1 is activated in accordance with the activation of sense amplifier activation timing signal SOT, and responsively, column-related write timing control circuit 79 shown in FIG. 12 activates write column decoder enable signal CDEW for a predetermined period. Accordingly, the column select operation is performed, and data is written onto the bit lines in the selected column. In FIG. 31, bit lines BL and /BL indicate representatively bit line pairs of 128 bits.

In the next clock cycle, page mode write command WEPM is applied together with data Dn. In this case, column-related write timing control circuit 79 shown in FIG. 12 is activated in accordance with page mode column-related trigger signal CASTpm, to hold write column decoder enable signal CDEW in an active state for a predetermined period so that the column selecting operation is performed. Onto the selected column, internal write data WDn, which is produced in synchronization with the rising of clock signal CLK, is written via the write driver and the write column select gate.

In the next cycle, precharge write command WEPC is applied. Precharge write command WEPC involves page close instructing signal PC and write operation instructing signal WE both set to the H level, and instructs that the precharge state is internally recovered after completion of the write operation. Therefore, in response to the activation of page mode column-related trigger signal CASTpm, internal write data WDn+1 produced from write data Dn+1 is written onto selected bit lines BL and /BL, and then the row-related circuitry returns to the precharge state as in the data reading.

As described above, the page mode command for performing the data access while maintaining the row in the selected state as well as a precharge command for driving the selected row to the unselected state are prepared in addition to the read command and write command, which in turn complete the operations of activating and deactivating the memory array within one clock cycle. Therefore, the column access can be performed while temporarily stopping the precharging of the row-related circuitry. Accordingly, the power consumption can be significantly reduced in application of image processing, in which successive access to the same page is performed many times. Since the auto-precharge command is prepared, the data access and the precharge can be instructed in the same cycle. Therefore, it is not particularly necessary to prepare the clock cycle for applying a precharge command, and an overhead in page switching can be reduced, so that the processing efficiency can be improved.

Second Embodiment

FIG. 32 illustrates truth values of commands according to a second embodiment of the invention. In the second embodiment, as shown in FIG. 32, when read operation instructing signal RE, write operation instructing signal WE, refresh operation instructing signal REF, page mode operation instructing signal PM and page close instructing signal PC are all set to the H level, a mode register set command MRS is applied. When mode register set command MRS is applied, data for specifying an operation mode can be externally stored in a mode register. By using mode register set command MRS, the page mode operation can be selectively functioned.

Specifically, when address bit A[0] is set to the L level when mode register set command MRS is applied, as shown in FIG. 33, the page mode operation is inhibited. When address bit A[0] is set to the H level, the page mode can be utilized. Other address bits A[16:1] are arbitrary ("don't care" state) when the page mode is set.

In the page mode operation, a logic integrated on the same chip is required to provide a command for designating the page mode operation. The page mode operation is extremely effective in image data processing, in which the address of data to be processed sequentially, successively changes. However, if the access is completely random, and the address sequence is a random sequence, the page must be switched in each clock cycle. For such application, in which the feature of the page mode, i.e., the reduction of the average power consumption cannot be expected, a function of the page mode is not particularly required.

The system LSI generally has a logic portion designed in accordance with an application, and accordingly, the pseudo-SRAM has a different specification for different application. If pseudo-SRAMs with a page mode function are produced separately from and independently of pseudo-SRAMs without a page function, leading to a reduced manufacturing efficiently, and complicated product management. Therefore, such a function is added that a user can select support and non-support of the page mode operation function by using mode register set command MRS. Accordingly, it is possible to achieve the pseudo-SRAM adaptable to different applications with the same configuration, and high in versatility, so that complication of the manufacturing steps and product management can be prevented.

Figure 34:
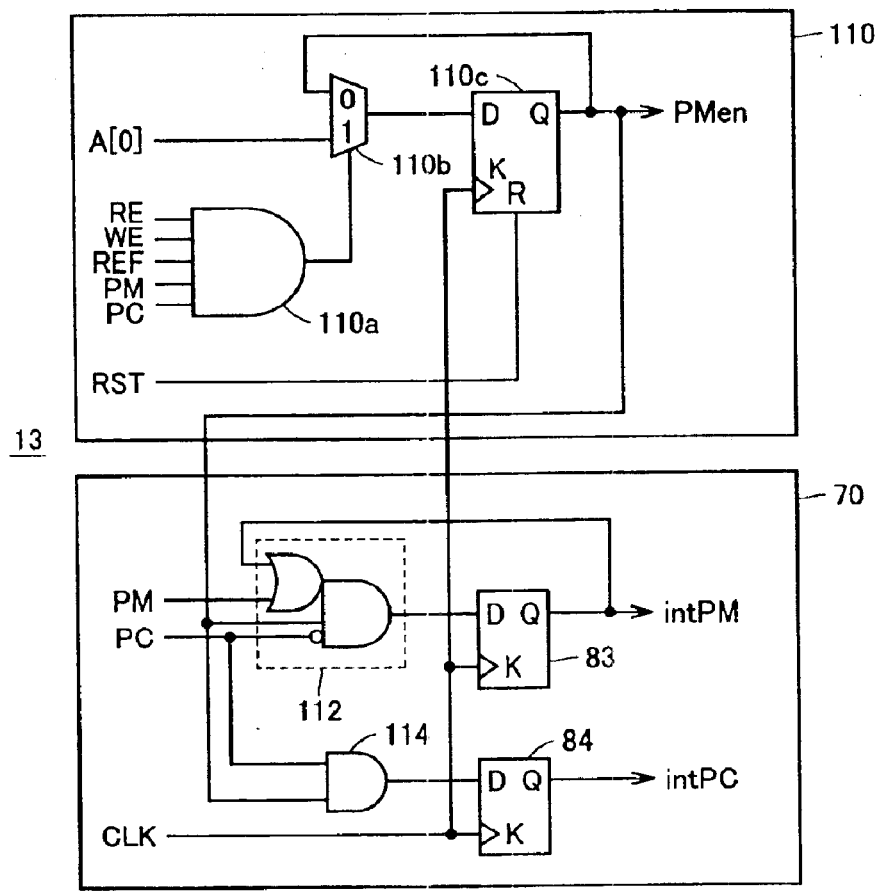
FIG. 34 shows, by way of example, structures of a mode register circuit and a clock synchronous input circuit according to the second embodiment of the invention.

FIG. 34 shows, by way of example, a structure of a portion related to the page mode switching according to the second embodiment of the invention. Referring to FIG. 34, DRAM control circuit 13 includes a mode register circuit 110 and clock-synchronous input circuit 70. Mode register circuit 110 stores information for validating or invalidating the page mode function. Clock-synchronous input circuit 70 produces internal page mode instructing signal intPM and internal precharge instructing signal intPC in accordance with externally applied page mode operation instructing signal PM and page close instructing signal PC, selectively in accordance with the storage data of mode register circuit 110.

Mode register circuit 110 includes an AND circuit 110a receiving externally applied operation mode instructing signals RE, WE, REF, PM and PC, a multiplexer 110b selectively passing externally applied address bit A[0] and an internal page mode enable signal PMen in accordance with the output signal of AND circuit 110a, and a D-flip-flop 110c taking in and providing the output signal of multiplexer 110b in synchronization with the rising of clock signal CLK. D-flip-flop 110c provides from its output Q a page mode enable signal PMen.

D-flip-flop 110c receives a reset signal RST at is reset input R, and sets, in the reset state, page mode enable signal PMen to the L level. Reset signal RST turns active at the time of power-on or system reset. In the default state, therefore, page mode enable signal PMen is set to the L level and page mode disabled state is set.

Clock-synchronous input circuit 70 includes a composite gate 112 receiving externally applied page mode operation instructing signal PM, page close instructing signal PC and page mode enable signal PMen, D-flip-flop 83 taking in the output signal of composite gate 112 in synchronization with the rising of clock signal CLK, to produce internal page mode instructing signal intPM, an AND circuit 114 receiving page mode enable signal PMen and page close instructing signal PC, and D-flip-flop 84 taking in the output signal of AND circuit 114 and clock signal CLK in synchronization with the rising of clock signal CLK, to produce internal precharge instructing signal intPC. Except for these components, clock-synchronous input circuit 70 shown in FIG. 34 has the same structure as clock-synchronous input circuit 70 shown in FIG. 13.

Composite gate 112 equivalently includes an OR gate receiving externally applied page mode operation instructing signal PM and internal page mode instructing signal intPM, and a gate circuit receiving the output signal of the OR gate, page mode enable signal PMen and page close instructing signal PC. This gate circuit provides a signal at the H level when page close instructing signal PC is at the L level, page mode enable signal PMen is at the H level and the output signal of the OR gate is at the H level, and otherwise provides the signal at the L level.

Figure 35:
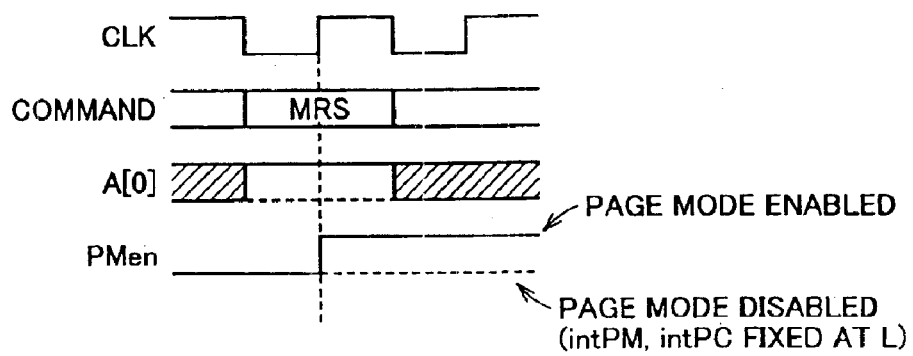
FIG. 35 is a timing chart representing an operation of the mode register circuit shown in FIG. 34.

FIG. 35 is a timing chart representing an operation-of mode register circuit 110 shown in FIG. 34. Referring to FIG. 35, an operation of the circuit shown in FIG. 34 will now be described.

When mode register set command MRS is applied, the output signal of AND circuit 110a attains the H level. In other words, AND circuit 110a functions as a command decoder decoding the mode register set command. When the output signal of AND circuit 110a is at the H level, multiplexer 110b selects externally applied address bit A[0] to D-flip-flop 110c. When clock signal CLK rises to the H level, D-flip-flop 110c takes in and provides the output signal of multiplexer 110b. When address bit A[0] is at the H level, page mode enable signal PMen is set to the H level, and the page mode operation enabled state is set. When address bit A[0] is set to the L level, page mode enable signal PMen is set to the L level, and the page mode disabled state is set.

When page mode enable signal PMen is set to the H level, composite gate 112 in clock-synchronous input circuit 70 sets the state of the output signal thereof according to internal page mode instructing signal intPM, page mode operation instructing signal PM and page close instructing signal PC. Specifically, when page mode operation instructing signal PM is at the H level, and page close instructing signal PC is at the L level, the output signal of composite gate 112 attains the H level, and internal page mode instructing signal intPM attains the H level so that internal page operation, i.e., inhibition of resetting of the row-related circuitry is instructed. When page close instructing signal PC is applied, the output signal of AND circuit 114 changes in accordance with page close instructing signal PC, and accordingly the state of internal precharge instructing signal intPC changes. Therefore, when page mode enable signal PMen is set to the H level, both the page mode command and the precharge command are validated or made available.

When mode register set command MRS is applied and address bit A[0] is set to the L level, page mode enable signal PMen is set to the L level in synchronization with the rising of clock signal CLK. When page mode enable signal PMen is at the L level, the output signal of composite gate 112 is fixed at the L level, and the output signal of AND circuit 114 is likewise fixed at the L level. In this state, therefore, page mode operation instructing signal PM and page close instructing signal PC are invalidated, and it is inhibited to set an internal operation state according to the logical levels thereof.

In a cycle subsequent to application of mode register set command MRS, the output signal of AND circuit 110a is at the L level, and multiplexer 110b selects page mode enable signal PMen provided from D-flip-flop 110c. Therefore, D-flip-flop 110c takes in and provides page mode enable signal PMen applied from multiplexer 110b in synchronization with the rising of clock signal CLK, so that page mode enable signal PMen maintains the same state as the state attained when mode register set command MRS is applied.

When the mode register set command is applied, it may be considered that row-related activation instructing signal intACT, internal read operation instructing signal intRE and internal write operation instructing signal intWE are activated in response to the rising of clock signal CLK. In this case, the output signal of AND circuit 110a shown in FIG. 34 may be used as a signal for inhibiting activation of these signals. This inhibition scheme for the activation can be achieved by the following technique.

An output stage gate of each operation instructing signal is supplied with the output signal of AND circuit 110a as the activation inhibiting signal to inhibit the internal operation. Alternatively, a gate circuit receiving the output signal of AND circuit 110a and an externally applied operation mode instructing signal is arranged at the input stage of each D-flip-flop corresponding to the internal operation instructing signal, and the output signal of this gate circuit is kept inactive when the output signal of AND circuit 110a is active. Further, a gate circuit receiving clock signal CLK and the output signal of AND circuit 110a is arranged for the D-flip-flop producing each operation mode instructing signal, and the output signal of this gate circuit is applied to the clock input to inhibit each D-flip-flop from taking in the corresponding signal. These countermeasures can prevent malfunction of the internal circuitry when the mode register is set.

In the default state, page mode enable signal PMen is in the state inhibiting the page mode. Accordingly, if an application does not require the page mode, the default state is merely maintained, and it is not particularly required to set the contents of mode register circuit 110 in accordance with the mode register set command.

Page mode enable signal PMen, in the default state, may be the state enabling the page mode.

In the structures described above, the mode register circuit sets page mode enable signal PMen. Alternatively, the logical level of page mode enable signal PMen may be set by a fuse program circuit, fixing of a potential on a specific bonding pad or a mask interconnection.

According to the second embodiment of the invention, as described above, the page mode is selectively enabled and disabled (available and non-available) in accordance with the information stored in the mode register, and therefore, a pseudo-SRAM having high versatility can be achieved.

Third Embodiment

Figure 36:
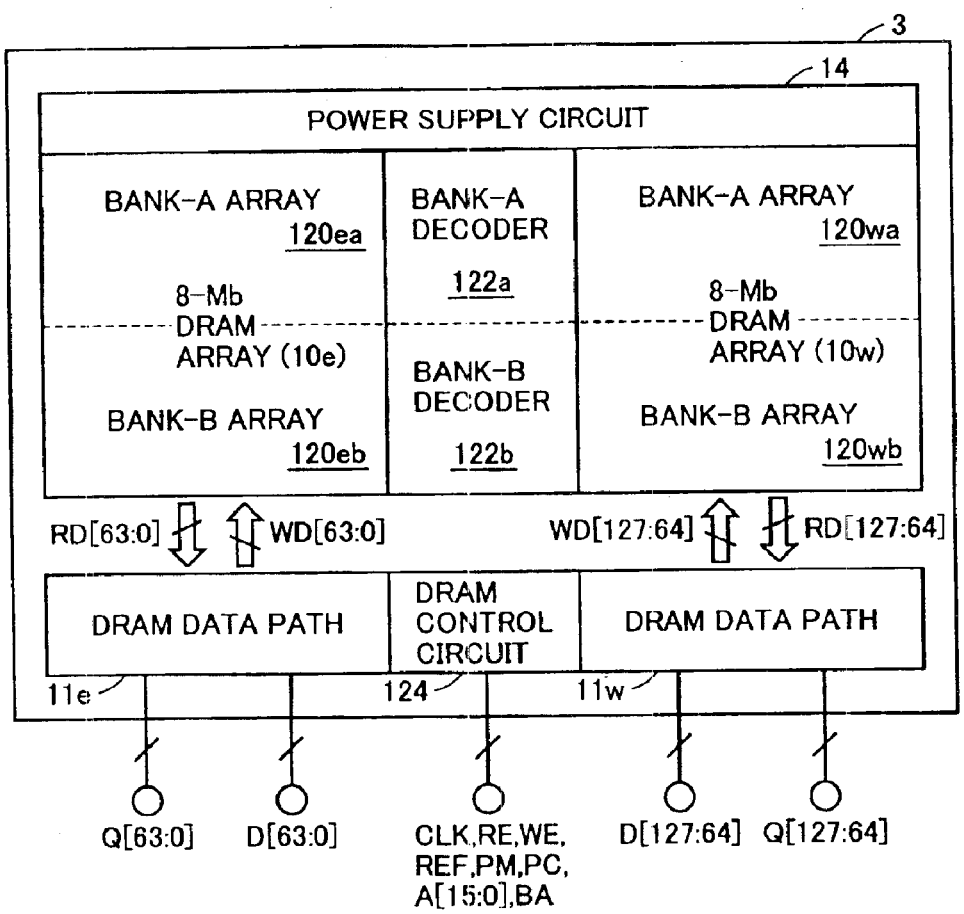
FIG. 36 schematically shows a whole structure of a pseudo-SRAM macro according to a third embodiment of the invention.

FIG. 36 schematically shows a structure of a pseudo-SRAM macro 3 according to a third embodiment of the invention. In pseudo-SRAM macro 3 shown in FIG. 36, 8-Mbit DRAM array 10e is divided into a bank-A array 120*ea* and a bank-B array 120*eb*. Also, 8-Mbit DRAM array 10*w* is divided into a bank-A array 120*wa* and a bank-B array 120*wb*.

A bank-A decoder 122*a* is provided corresponding to bank-A arrays 120*ea* and 120*wa*, and a bank-B decoder 122*b* is provided corresponding to bank-B arrays 120*eb* and 120*wb*. Each of bank-A decoders 122*a* and 122*b* includes a row decoder and a column decoder.

Pseudo-SRAM macro 3 shown in FIG. 36 includes two banks A and B. Therefore, a DRAM control circuit 124 is supplied with 16-bit address signal A[15:0] and a 1-bit bank address signal BA instead of address signal A[16:0]. One of banks A and B is designated in accordance with bank address signal BA.

DRAM control circuit 124 includes a control circuit for bank A, a control circuit for bank B and a control circuit shared between banks A and B. Other configurations of pseudo-SRAM macro 3 shown in FIG. 36 are the same those of the pseudo-SRAM shown in FIG. 2. The corresponding portions are allotted with the same reference numerals, and description thereof is not repeated.

In pseudo-SRAM macro 3 shown in FIG. 36, bank address signal BA designates a target bank when an operation command other than refresh command REF and no-operation command NOP is supplied. With bank address signal BA, a page operation can be enabled for each bank, and the open state of the page can be maintained for each bank so that the page-hit rate can be improved, and an average power consumption can be reduced.

When refresh command REF is applied, the internal address counter designates a refresh row. The refresh address generated by the refresh address counter is formed of 17-bit signal Q[16:0]. In this case, each of banks A and B may be refreshed independently of the other. Alternatively, 1-bit refresh address may be set to a degenerated state, and the refresh may be effected commonly on banks A and B.

Figure 37:
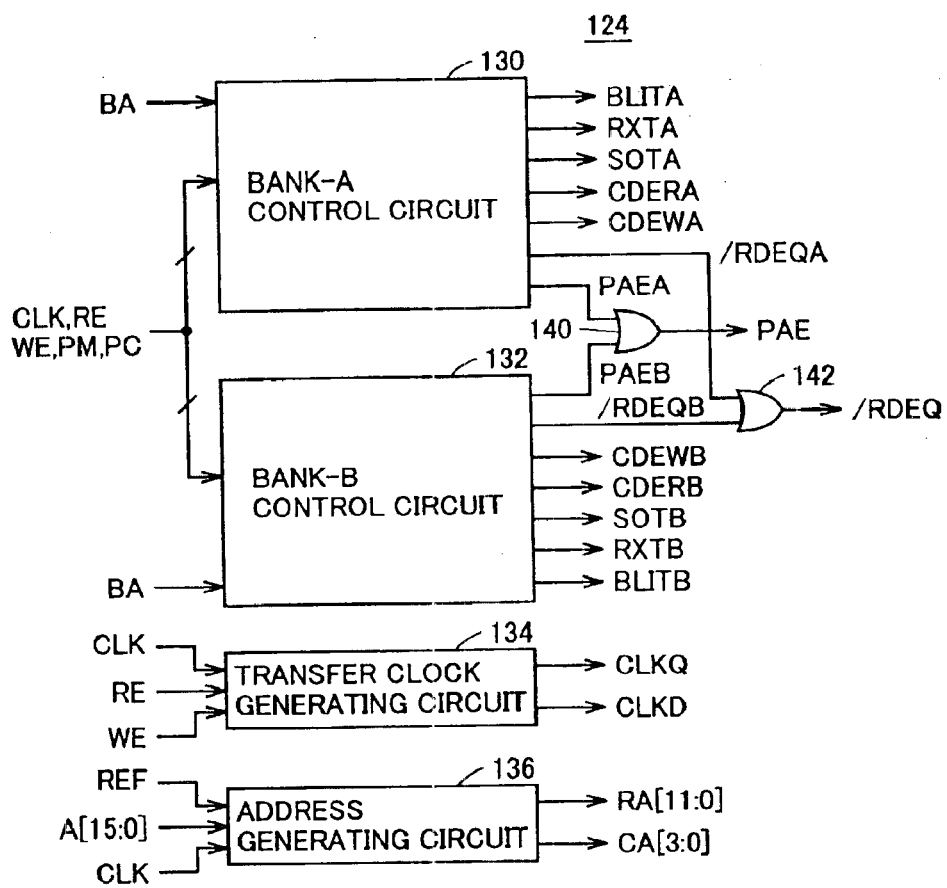
FIG. 37 schematically shows a structure of a DRAM control circuit according to the third embodiment of the invention.

FIG. 37 schematically shows a configuration of DRAM control circuit 124 shown in FIG. 36. In FIG. 37, DRAM control circuit 124 includes bank-A control circuit 130 and bank-B control circuit 132 each receiving bank address signal BA, clock signal CLK, read operation instructing signal RE, write operation instructing signal WE, page mode operation instructing signal PM and page close instructing signal PC, to produce control signals for corresponding bank A or B. Bank-A control circuit 130 is activated when bank address signal BA designates bank A, to produce the signals for bank A, i.e., a bit line isolation timing signal BLITA, a word line activation timing signal RXTA, a sense activation timing signal SOTA, a read column decoder enable signal CDERA, a write column decoder enable signal CDEWA, a bank-A read data bus equalize instructing signal RDEQA and a bank-A preamplifier enable signal PAEA.

Bank-B control circuit 132 is activated when bank address signal BA designates bank B, to produce the signals for bank B, i.e., a bit line isolation timing signal BLITB, a word line activation timing signal RXTB, a sense activation timing signal SOTB, a read column decoder enable signal CDERB, a write column decoder enable signal CDEWB, a bank-B read data bus equalize instructing signal /RDEQB and a bank-B preamplifier enable signal PAEB.

Configurations of these bank-A and bank-B control circuits 130 and 132 are the same as the configuration of DRAM control circuit 13 shown in FIG. 12.

DRAM control circuit 124 further includes an OR circuit 140 receiving bank-A preamplifier enable signal PAEA and bank-B preamplifier enable signal PAEB, to produce preamplifier enable signal PAE, and an OR circuit 142 receiving a bank-A read data lines equalize instructing signal /RDEQA and a bank-B read data line equalize instructing signal /RDEQB, to produce read data line equalize instructing signal /RDEQ.

The preamplifier and read data lines are provided for the read data bus in common to banks A and B. Therefore, when bank-A and bank-B control circuits 130 and 132 produce the control signals for banks A and B in a self-timed manner, respectively, bank-A and bank-B control circuits 130 and 132 activate preamplifier enable signal PAE based on preamplifier enable signals PAEA and PAEB for the respective banks A and B, and produce read data bus equalize instructing signal /RDEQ from read data line equalize instructing signals /RDEQA and /RDEQB for the respective banks A and B.

Likewise, the write data bus is arranged in common to banks A and B, and accordingly the write driver is arranged in common to banks A and B. However, the write driver merely inverts the data received from D-flip-flop on the DRAM data bus to produce the complementary data, as shown in FIG. 10, and the control signal is not particularly used for this write driver. Therefore, bank-A and bank-B control circuits 130 and 132 merely produce write column decoder enable signals CDEWA and CDEWB.

If the write driver is configured to be activated and deactivated in accordance with an internal write operation instructing signal, the write driver control signals from bank-A and bank-B control circuits 130 and 132 are combined to produce the write driver control signal.

DRAM control circuit 124 further includes a transfer clock generating circuit 134 for producing read clock signal CLKQ and write clock signal CLKD in accordance with clock signal CLK, read operation instructing signal RE and write operation instructing signal WE, and an address generating circuit 136 receiving refresh operation instructing signal REF, external address signal A[15:0] and clock signal CLK, to produce internal row address signal RA[11:0] and internal column address signal CA[3:0].

The transfer clock generating circuit 134 corresponds to the clock generating circuit shown in FIG. 27. For producing write clock signal CLKD from clock signal CLK, it is not particularly required to apply write operation instructing signal WE to transfer clock generating circuit 134. Address generating circuit 136 corresponds to a portion for receiving address signals A[12:0] and A[16:13] shown in FIG. 13.

Upon activation of refresh operation instructing signal REF, banks A and B may be simultaneously refreshed, or may be refreshed individually. In accordance with the construction in this refresh operation, a manner of internally producing the refresh bank address is appropriately determined. When banks A and B are to be refreshed commonly, bank address signal BA is set to a degenerated state in the refresh operation, and banks A and B are both activated. When banks A and B are to be refreshed individually, a refresh bank address is provided instead of bank address BA.

Figure 38:
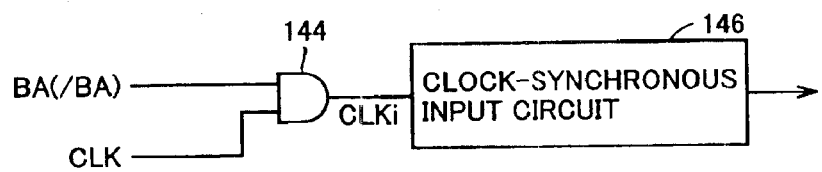
FIG. 38 schematically shows a structure of a main portion of bank-A and bank-B control circuits shown in FIG. 37.

FIG. 38 schematically shows a configuration of a main portion of bank-A and bank-B control circuits 130 and 132. In FIG. 38, the bank-A (or bank-B) control circuit includes an AND circuit 144 receiving a bank address signal BA (or /BA) and clock signal CLK, and a clock-synchronous input circuit 146 latching an externally applied signal in accordance with a clock signal CLKi provided from AND circuit 144, to produce an internal operation instructing signal. Internal clock signal CLKi provided from AND circuit 144 is applied to a clock input K of each D-flip-flop in clock-synchronous input circuit 70 shown in FIG. 13. Therefore, clock signal CLKi is produced in a selected bank, so that the external operation mode instructing signal is taken in, and the internal operation activating signal and the internal operation trigger signal are produced. In the unselected bank, the state of the last cycle is maintained.

Alternatively to the configuration shown in FIG. 38, D-flip-flop may be used to produce internal bank address signal intBA in accordance with clock signal CLK, to selectively activate the output signals of clock-synchronous input circuit 70 in accordance with internal bank address signal intBA (through AND processing between the internal operation instructing signal and the internal bank address signal). In this configuration, the clock-synchronous signal input circuit is shared between the banks A and B.

According to the third embodiment of the invention, as described above, the page mode operation can be performed in each bank, and the page can be kept open in each bank so that it is possible to increase the page mode operation period and to reduce the average power consumption.

Fourth Embodiment

Figure 39:
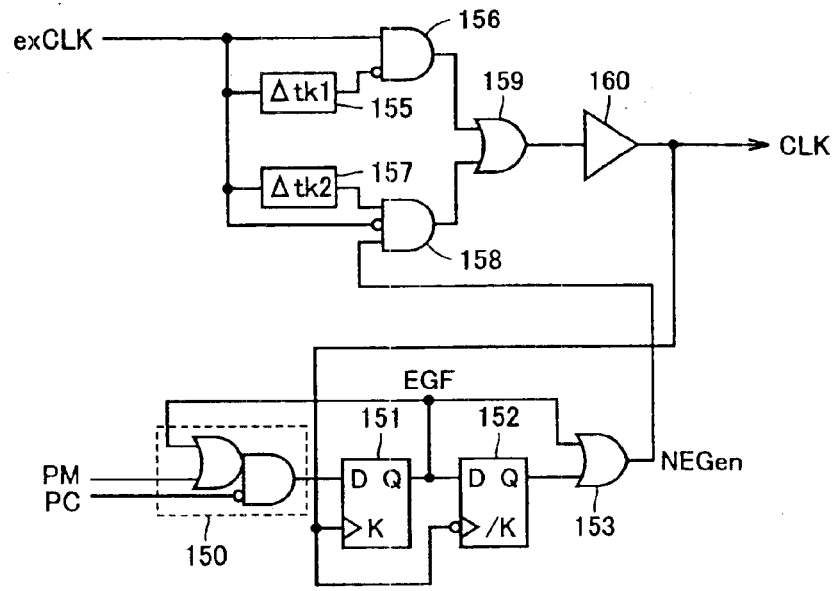
FIG. 39 shows a structure of an internal clock generating portion according to a fourth embodiment of the invention.

FIG. 39 shows a configuration of an internal clock generating circuit according to a fourth embodiment of the present invention. In FIG. 39, the internal clock generating circuit includes a composite gate 150 receiving an internal control signal EGF, page mode operation instructing signal PM and page close instructing signal PC, a D-flip-flop 151 taking in the output signal of composite gate 150 in synchronization with the rising of internal clock signal CLK, to produce internal control signal EGF, a D-flip-flop 152 taking in and providing from an output Q the output signal EGF of D-flip-flop 151 in synchronization with the falling of internal clock signal CLK, and an OR circuit 153 receiving internal control signal EGF and the output signal of D-flip-flop 152, to produce a negative-clock enable signal NEGen.

Composite gate 150 equivalently includes an OR gate receiving internal control signal EGF and page mode operation instructing signal PM, and a gate circuit receiving the output signal of the OR gate and page close instructing signal PC. This gate circuit provides a signal at the L level when page close instructing signal PC is at the H level. When page close instructing signal PC is at the L level, that gate circuit operates as a buffer circuit, to produce an output signal in accordance with the output signal of the OR gate.

The internal clock generating circuit further includes a delay circuit 155 delaying an external clock signal exCLK by a predetermined time Δtk1, a gate circuit 156 receiving the output signal of delay circuit 155 and external clock signal exCLK, a delay circuit 157 delaying external clock signal exCLK by a predetermined time Δtk2, a gate circuit 158 receiving the output signal of delay circuit 157, external clock signal exCLK and negative-clock enable signal NEGen, an OR circuit 159 receiving the output signals of gate circuits 156 and 158, and a buffer circuit 160 buffering an output signal of OR circuit 159 to produce internal clock signal CLK.

Delay circuit 155 and gate circuit 156 form a one-shot pulse generating circuit, which generates a pulse signal having a pulse width of Δtk1 in response to the rising of external clock signal exCLK. Delay circuit 157 and gate circuit 158 form a one-shot pulse generating circuit, which generates a one-shot pulse signal having a pulse width of Δtk2 in response to the falling of external clock signal exCLK when negative-clock enable signal NEGen is at the H level. When negative-clock enable signal NEGen is at the L level, the output signal of gate circuit 158 is fixed at the L level.

Figure 40:
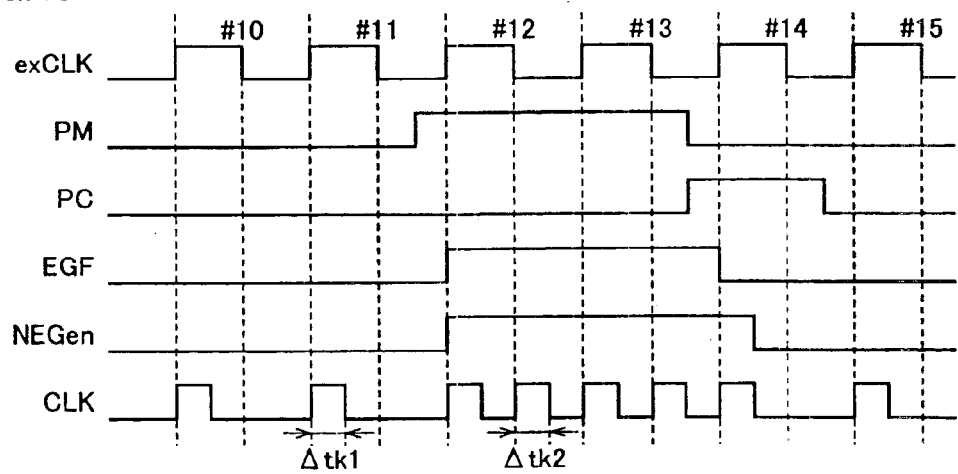
FIG. 40 is a timing chart representing an operation of an internal clock generating portion shown in FIG. 39.

FIG. 40 is a timing chart representing an operation of the internal clock generating circuit shown in FIG. 39. Referring to FIG. 40, an operation of the internal clock generating circuit shown in FIG. 39 will now be described briefly.

When page mode operation instructing signal PM and page close instructing signal PC are at the L level, the output signal of composite gate 150 is at the L level, and negative-clock enable signal NEGen provided from OR circuit 153 maintains the L level. When negative-clock enable signal NEGen is at the L level, the output signal of gate circuit 158 is at the L level, and delay circuit 155 and gate circuit 156 produce internal clock signal CLK in synchronization with the rising of external clock signal exCLK. In clock cycles #10 and #11, therefore, internal clock signal CLK becomes the H level for a period of time Δtk1 in synchronization with the rising of external clock signal exCLK.

In a clock cycle #12, page mode operation instructing signal PM is applied so that the page mode is designated. In clock cycle #12, when clock signal CLK attains the H level, D-flip-flop 151 takes in the output signal of composite gate 150, and internal control signal EGF attains the H level. In accordance with the rising of internal control signal EGF, negative-clock enable signal NEGen applied from OR circuit 153 attains the H level, and gate circuit 158 is enabled.

Therefore, in clock cycles #12 and #13 in which page mode operation instructing signal PM is maintained at the H level, internal clock signal CLK is produced in synchronization with the rising and falling edges of external clock signal exCLK. Internal clock signal CLK, which is produced in synchronization with the falling of external clock signal exCLK, has the H level period determined by delay time Δtk2 of delay circuit 157.

In a clock cycle #14, page mode operation instructing signal PM is set to the L level, and page close instructing signal PC is set to the H level. Accordingly, the output signal of composite gate 150 attains the L level. In synchronization with the rising of internal clock signal CLK in clock cycle #14, D-flip-flop 151 takes in and provides the output signal at the L level of composite gate 150, so that internal control signal EGF attains the L level. At this point of time, D-flip-flop 152 still provides the signal at the H level so that negative-clock enable signal NEGen maintains the H level.

In clock cycle #14, when internal clock signal CLK falls to the L level, D-flip-flop 152 takes in and provides internal control signal EGF, so that the signal provided from output Q of D-flip-flop 152 attains the L level, and accordingly, negative-clock enable signal NEGen attains the L level. In clock cycle #14, therefore, gate circuit 158 is disabled to stop generation of the internal clock signal synchronized with the falling edge of external clock signal exCLK.

When the data reading is performed in the page mode, the read clock signal is produced by delaying internal clock signal CLKQ by one clock cycle. Therefore, the read clock signal is produced even when the precharge operation is performed in clock cycle #14 (see FIG. 27).

Internal clock signal CLK generated from the internal clock generating circuit shown in FIG. 39 is applied to clock-synchronous input circuit 13 shown in FIGS. 12 and 13.

Figure 41:
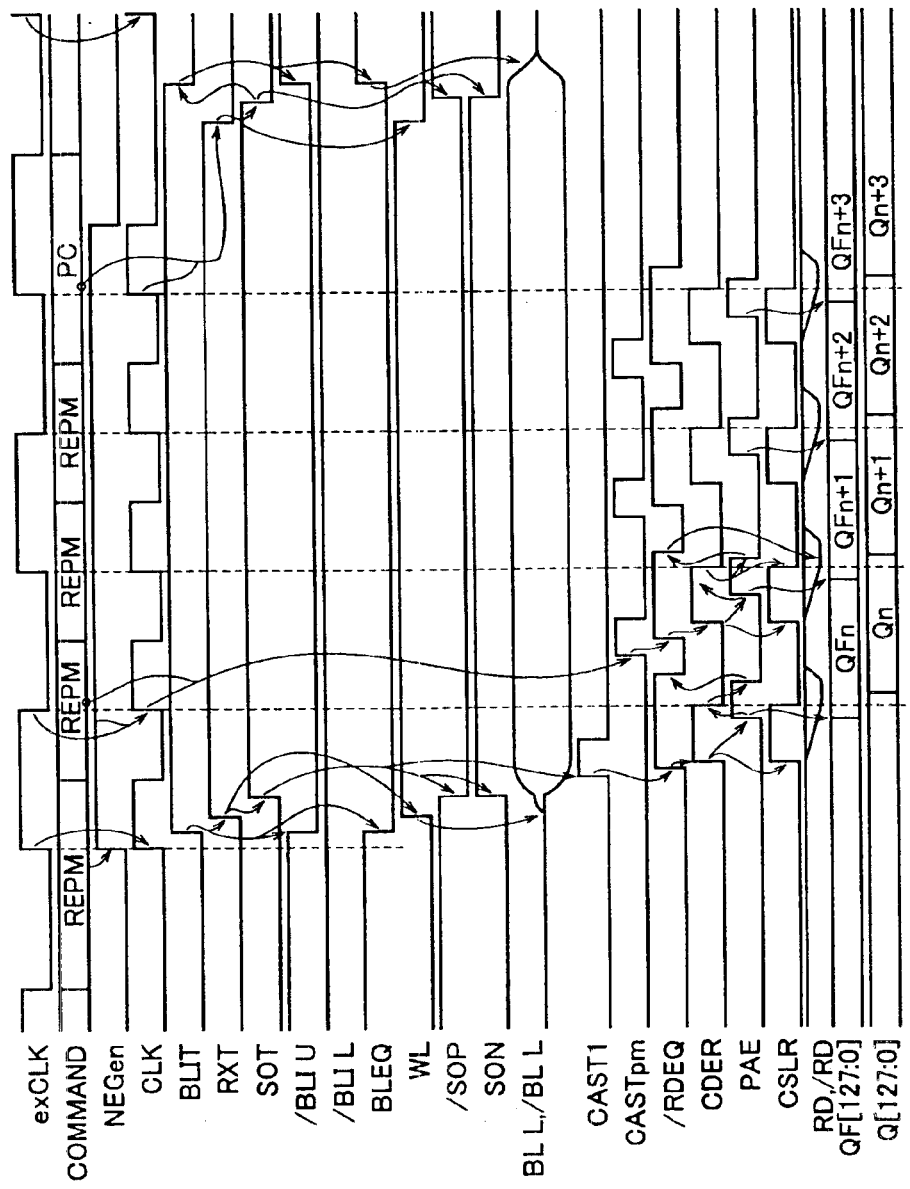
FIG. 41 is a signal waveform diagram representing an operation of the whole pseudo-SRAM according to a fourth embodiment of the invention.

FIG. 41 is a timing chart representing more specifically the data read operation in the fourth embodiment of the invention. The memory array has the array configuration shown in FIG. 7, and the DRAM control circuit has the configuration of DRAM control circuit 13 shown in FIG. 12. Therefore, the respective signals and signal lines in FIG. 41 are indicated by the same reference numerals as those in FIGS. 7 and 12.

In the fourth embodiment of the invention, when page mode read command REPM is applied, negative-clock enable signal NEGen is driven to the H level. While negative-clock enable signal NEGen is at the H level, internal clock signal CLK is produced in synchronization with the rising and falling edges of external clock signal exCLK. The row select operation is performed in accordance with page mode read command REPM applied first, and bit line isolation timing signal BLIT, word line activation timing signal RXT and sense activation timing signal SOT are driven to the active state in a predetermined sequence. Specifically, bit line isolation instruction signal /BLIU is driven to the L level, and bit line equalize instructing signal BLEQ is deactivated. In accordance with the word line activation timing signal RXT, a word line WL is driven to the selected state, and then, sense amplifier activating signals /SOP and SON are activated in accordance with sense activation timing signal SOT. These operations of the row-related circuitry are the same regardless of activation and deactivation of negative-clock enable signal NEGen.

In response to activation of sense activation timing signal SOT, column-related trigger signal CASTi is rendered active to start the column select operation. Specifically, read data bus equalize instructing signal /RDEQ, read column decoder enable signal CDER and preamplifier enable signal PAE are activated in a predetermined sequence so that memory cell data selected by designated column select line CSR is amplified and latched This latched data attains the definite state before the rising of internal clock signal CLK.

Then, page mode read command REPM is applied again in synchronization with the falling of external clock signal exCLK. In this case, page mode column-related trigger signal CASTpm is activated so that the column select operation is performed again, and the data is read and latched internally. Even if the last column select operation in the page mode is not yet completed at the time of rising of internal clock signal CLK, this is accepted provided that the precharging of the column-related circuitry is completed before the activation of page mode column-related trigger signal CASTpm. Accordingly, the operation period of the row-related circuitry can be utilized as the precharge period of the column-related circuitry, and a sufficiently long operation period can be ensured for the column-related circuitry.

Thereafter, page mode read command REPM is applied in synchronization with the falling and rising edges of external clock signal exCLK, and data QFn, QFn+1, QFn+2 and QFn+3 are internally and latched respectively. These latched data attain the definite state before rising of internal clock signal CLK. Therefore, these latched data are outputted as external read data Qn, Qn+1, Qn+2 and Qn+3 in synchronization with the rising of internal clock signal CLK.

In this case, internal clock signal CLK is produced in synchronization with the rising and falling edges of external clock signal exCLK, and external data Q[127:0] is transferred in synchronization with the rising edge of internal clock signal CLK so that the data can be transferred at double rate of external clock signal exCLK.

When precharge command PC is applied, negative-clock enable signal NEGen attains the L level in synchronization with the falling of internal clock signal CLK, and generation of internal clock signal CLK in synchronization with the falling edge of external clock signal exCLK is stopped. In accordance with precharge command PC, the row-related control signals BLIT, RXT and SOT in the selected state are driven to the inactive state in a predetermined sequence so that word line WL and sense amplifier activating signals /SOP and SON are driven to the inactive state. In addition, bit line equalize instructing signal BLEQ and bit line isolation instructing signal /BLIU are driven to the H level.

Upon application of precharge command PC, negative-clock NEGen is deactivated in accordance with internal clock signal CLK in the same clock cycle as the precharge command so that external read data Qn+3 can be transferred in accordance with read data CLKQ.

When the data is read in the double data rate mode, it may be considered that the latching of the output data of the preamplifier circuit is delayed behind the rising edge of internal clock signal CLK, and latch data QF become definite while external clock signal exCLK is at the L level. In this case, it might be impossible to transfer all the internal data at the double data rate in synchronization with the rising and falling of the external clock signal. In this case, a clock signal synchronized with the rising and falling edges of external clock signal exCLK is produced by using a signal produced by delaying negative-clock enable signal NEGen by a period of a column latency, and is utilized as the read clock signal. Thereby, required data can be accurately read out in the page mode in accordance with the column latency. The read clock signal may be produced by delaying the generation period of read clock signal CLKQ by the column latency period, i.e., the one clock cycle period of the internal clock signal or the half a clock cycle of the external clock signal in the present embodiment.

In the normal operation mode, the row-related circuitry operates, and then the column-related circuitry operates in each clock cycle. In the page mode, in view of the period of the operation of the row-related circuitry in each clock cycle, the column-related circuitry operates in accordance with page mode column-related trigger signal CASTpm. During the page operation, therefore, the row-related circuitry is maintained active so that there is a time period during which no circuit internally operates. Such time period is adapted to be utilized to perform data read operation also at the falling edge of the external clock signal. Thereby, it is possible to double the rate of data transfer to and from the logic portion, and to achieve the high speed data transfer so that the system performance can be improved.

Fifth Embodiment

Figure 42:
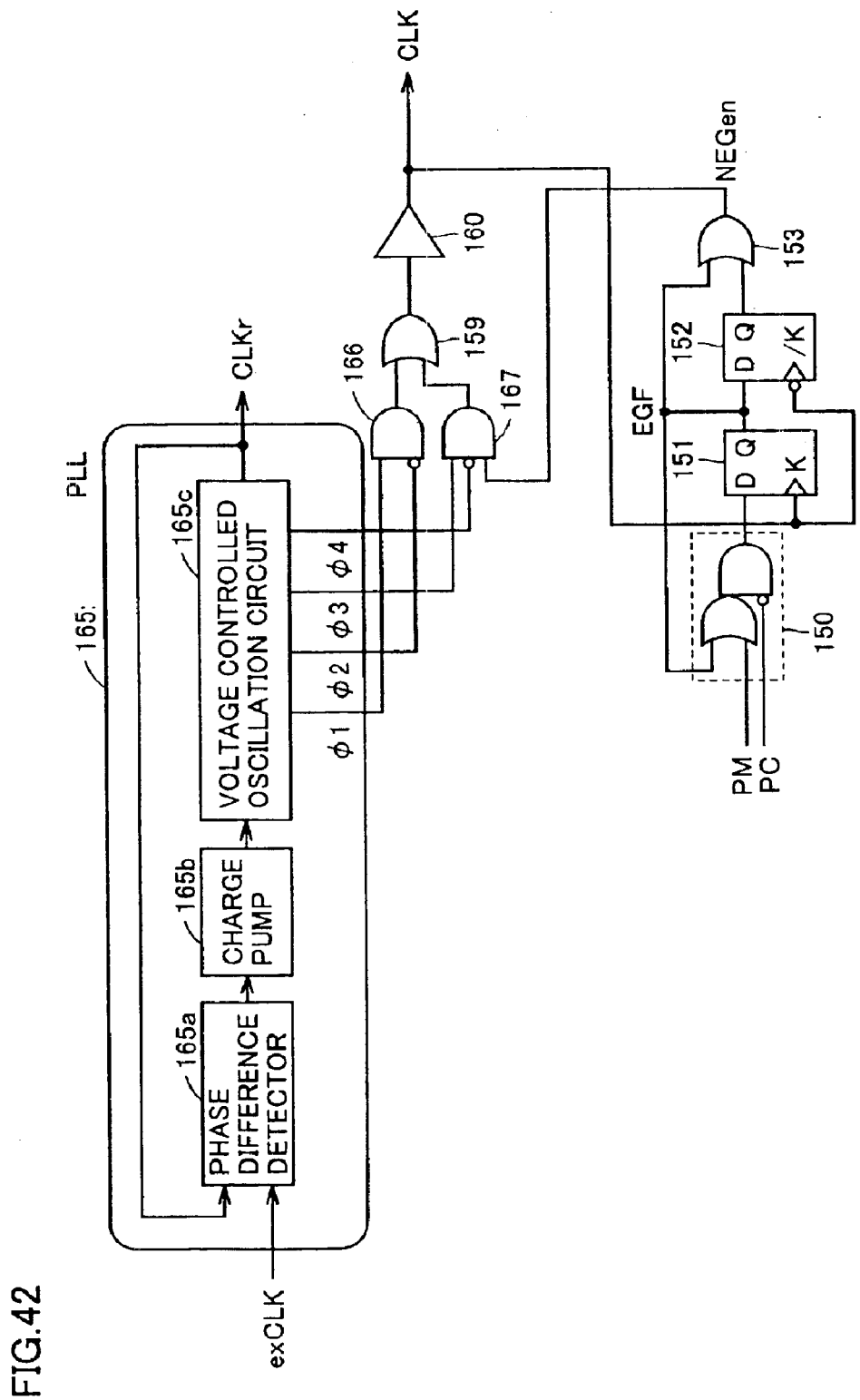
FIG. 42 shows a structure of an internal clock generating portion according to a fifth embodiment of the invention.

FIG. 42 schematically shows a configuration of an internal clock generating portion according to a fifth embodiment of the invention. The internal clock generating portion shown in FIG. 42 differs in configuration from the internal clock generating circuit shown in FIG. 39 in the following points. For producing internal clock signal CLK, the internal clock generating portion in FIG. 42 includes a PLL (Phase-Locked Loop) 165 for producing a reference clock signal CLKr synchronized in phase with external clock signal exCLK, and a clock producing portion for producing internal clock signal CLK in accordance with negative-clock enable signal NEGen and four-phase clock signals $\phi1$–$\phi4$ shifted in phase by a quarter of the cycle from each other provided from PLL 165.

The circuit portion producing negative-clock enable signal NEGen has the same configuration as that shown in FIG. 39. The same portions are allotted with the same reference numerals, and detailed description thereof is not repeated.

PLL 165 includes a phase difference detector 165a for detecting a phase difference between external clock signal exCLK and reference clock signal CLKr, a charge pump 165b for producing a control voltage through a charge-pump operation in accordance with the output signal of phase difference detector 165a, and a voltage controlled oscillation circuit 165c having an oscillation frequency adjusted in accordance with the control voltage provided by charge pump 165b to produce reference clock signal CLKr. From voltage controlled oscillation circuit 165c, four-phase clock signals $\phi1$–$\phi4$ are extracted in synchronization with reference clock signal CLKr.

The clock generating portion includes a gate circuit 166 receiving clock signals $\phi1$ and $\phi2$ shifted in phase by ¼ cycle from each other, a gate circuit 167 receiving negative-clock enable signal NEGen as well as clock signals $\phi3$ and $\phi4$ shifted in phase by ¼ cycle from each other, OR circuit 159 receiving the output signals of gate circuit 166 and 167, and a buffer circuit 160 buffering the output signal of OR circuit 159 to produce internal clock signal CLK.

By utilizing PLL 165, it is possible to produce reference clock signal CLKr, which has a phase synchronized with external clock signal exCLK and a duty ratio of 50%. Therefore, even when the period of the H- or L-level of external clock signal exCLK varies due to jitter or the like, reference clock signal CLKr having constant periods of H- and L-levels can be accurately produced. Therefore, it is not necessary to set the minimum clock cycle in view of jitters of external clock signal exCLK, and the pseudo-SRAM can be operated stably at high speed.

Figure 43:
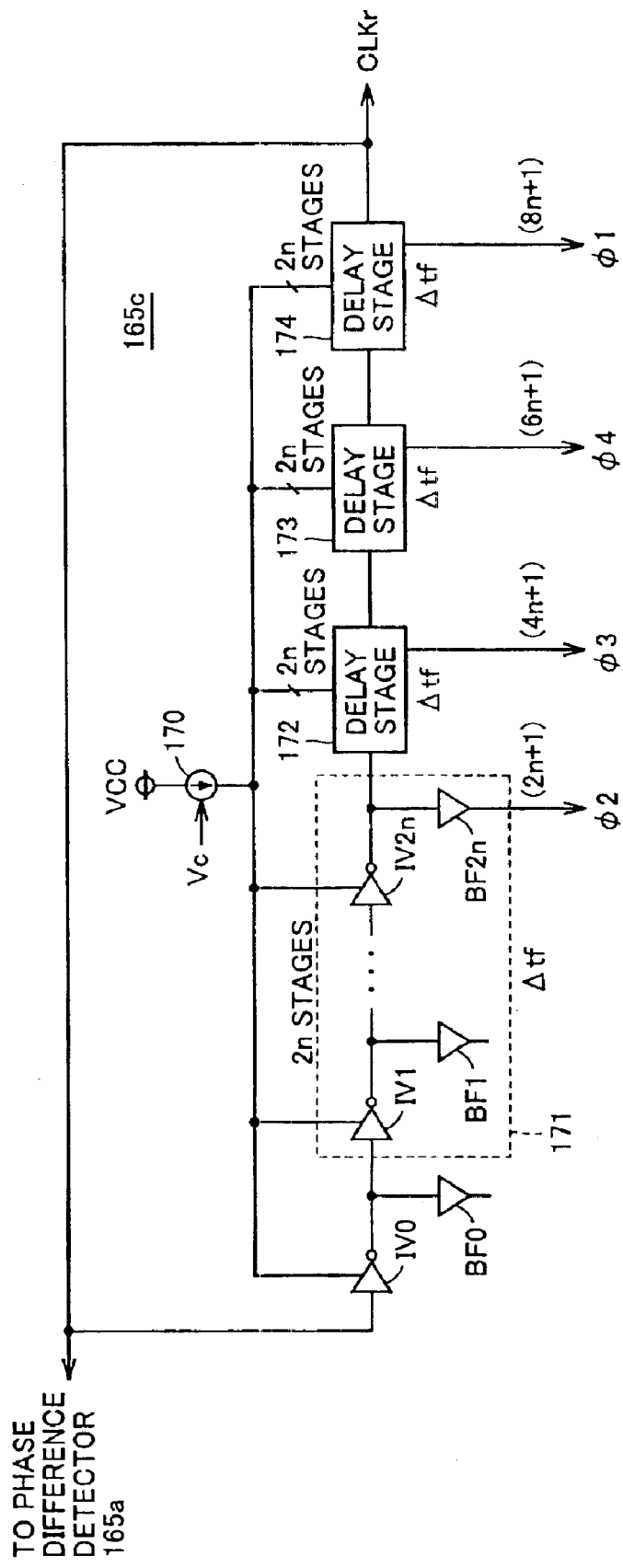
FIG. 43 schematically shows a structure of a voltage controlled oscillator circuit shown in FIG. 42.

FIG. 43 schematically shows an example of a configuration of voltage controlled oscillation circuit 165c shown in FIG. 42. In FIG. 43, voltage control oscillation circuit 165c includes a current source 170 having a driving current adjusted in accordance with a control voltage Vc supplied from charge pump 165b shown in FIG. 42, cascaded delay stages 171–174 each delaying a received signal by a time of $\Delta$tf, and an inverter IV0 inverting reference clock signal CLKR provided from delay stage 174, to provide the inverted signal to delay stage 171. Delay stages 171–173 provide clock signals $\phi2$–$\phi4$, respectively, and delay stage 174 provides clock signal $\phi1$.

Delay stages 171–174 have the same configurations, and FIG. 43 shows a specific configuration of delay stage 171. Delay stage 171 includes cascaded inverters IV1–IV2n, and buffers BF1–BF2n connected to the output nodes of inverters IV1–IV2n, respectively. Buffer BF2n receiving the output signal of the inverter at the final stage provides clock signal $\phi2$.

Inverter IV0 has an output connected to buffer BF0. Delay stages 172–174 provide clock signal $\phi3$, $\phi4$ and $\phi1$ from the buffers arranged corresponding to the inverters in the respective final stages, respectively. Delay stages 171–174 each including an inverter train of 2n inverter stages and inverter IV0 form a ring oscillator formed of (8n+1) inverters connected in a ring form. By increasing the number of the inverters in delay stages 171–174, the delay time per inverter can be substantially reduced down to a negligible value, as compared with delay time $\Delta$tf. Delay stages 171–174 have the same delay time, and therefore, the delay time of each of delay stages 171–174 is equal to a quarter of a cycle time T of reference clock signal CLKr. Thus, it becomes possible to produce accurately four-phase clock signals $\phi1$–$\phi4$ synchronized with reference clock signal CLKr and shifted in phase by T/4 from each other.

Further, the buffers are connected to the respective outputs of inverters IV0 and others, so that the inverter IV0 and the inverters in the inverter trains of delay stages 171–174 can be made uniform in output load. Accordingly, the clock signals of the duty ratio of 50% can be accurately produced, and the respective inverters can also have the same operation characteristics so that delay stages 171–174 can have the same delay time.

The buffers are arranged for the respective inverters, and interconnections are made so as to select and output the output signals from the buffers (BF2n) at the tap positions of the (2n+1)-th, (4n+1)-th, (6n+1)-th and (8n+1)-th stages in the entire inverter train. Since the outputs from the taps at the positions quadrisecting the entire inverter train, are merely selected, the 4-phase clock signals can be easily and accurately produced.

Reference clock signal CLKr is supplied to phase difference detector 165a shown in FIG. 42. In accordance with the phase difference between external clock signal exCLK and reference clock signal CLKr, control voltage Vc is produced. The delay times of inverter IV0 and others can be adjusted by adjusting the operation currents of inverter IV0 and the inverters in delay stages 171–174 in accordance with control voltage Vc, and an oscillation frequency of the ring oscillator formed of this inverter train can be adjusted to produce reference clock signal CLKr having a phase synchronized with external clock signal exCLK.

In the configuration shown in FIG. 43, current source 170 commonly supplies an operation current to inverter IV0 and the inverters of delay stages 171–174. However, a current source transistor having a driving current controlled in accordance with control voltage Vc, may be arranged for each of inverter IV0 and the inverters of delay stages 171–174 so that each of the driving currents of these inverters may be adjusted individually. The current source transistor may be arranged on each of the charging side and the discharging side.

Figure 44:
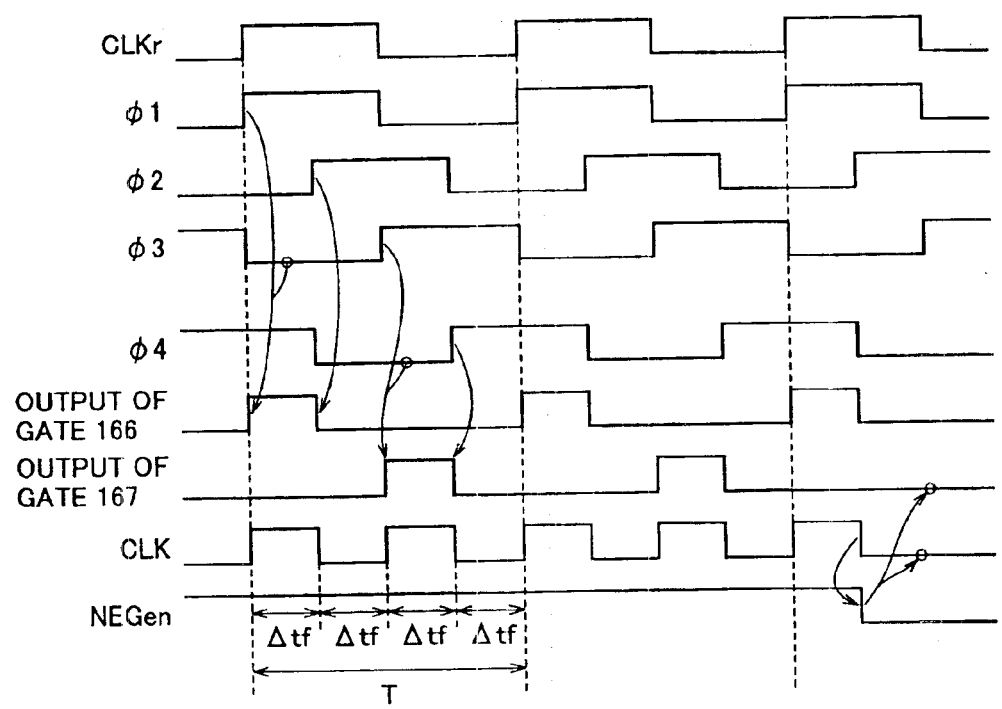
FIG. 44 is a timing chart representing an operation of an internal clock generating portion shown in FIG. 42.

FIG. 44 is a timing chart representing an operation of the internal clock generating portion shown in FIGS. 42 and 43. Referring to FIG. 44, operations of the circuits shown in FIGS. 42 and 43 will now be described.

An operation of the circuit portion generating negative-clock enable signal NEGen is the same as that of the circuit portion shown in FIG. 39. When the page mode operation is designated, a control signal EFG attains the H level in synchronization with the rising of clock signal CLK, and responsively, negative-clock enable signal NEGen is set to the H level. When page close instructing signal PC is applied, control signal EFG attains the L level in synchronization with the rising of clock signal CLK, and negative-clock enable signal NEGen falls to the L level in synchronization with the next falling of internal clock signal CLK.

The circuit including voltage controlled oscillation circuit 165c shown in FIG. 43 is a PLL circuit, and produces reference clock signal CLKr of a duty ratio of 50%. In accordance with reference clock signal CLKr, delay stages 171–174 produce clock signals $\phi1$–$\phi4$ shifted in phase by a quarter of the cycle from each other. Gate circuit 166 provides a signal at the H level while clock signal $\phi1$ is at the H level and clock signal $\phi2$ is at the L level. Therefore, gate circuit 166 provides a signal, which is at the H level for a period of time of $\Delta$tf, in synchronization with the rising of reference clock signal CLKr.

When negative-clock enable signal NEGen is at the H level, gate circuit 167 provides a signal, which becomes the H level when clock signals $\phi3$ and $\phi4$ are at the H- and L levels, respectively. Therefore, gate circuit 167 provides a signal, which becomes the H level for a period of time $\Delta$tf in synchronization with the falling of reference clock signal CLKr, when negative-clock enable signal NEGen is at the H level.

OR circuit 159 and buffer circuit 160 combine the output signals of gate circuits 166 and 167. Therefore, internal clock signal CLK becomes the H level for a period of time Δtf in synchronization with the rising and falling of reference clock signal CLKr.

When negative-clock enable signal NEGen is set to the L level in synchronization with the falling of clock signal CLK, the output signal of gate circuit 167 is fixed at the L level, and thereafter, internal clock signal CLK becomes the H level for a period of time Δtf in synchronization with only the falling of reference clock signal CLKr until negative-clock enable signal NEGen is set to the H level.

By using clock signals φ1–φ4 of four phases provided from PLL 165, it is possible to produce stably internal clock signal CLK having a duty ratio of 50% in the operation at a double data rate under the page mode.

Figure 45:
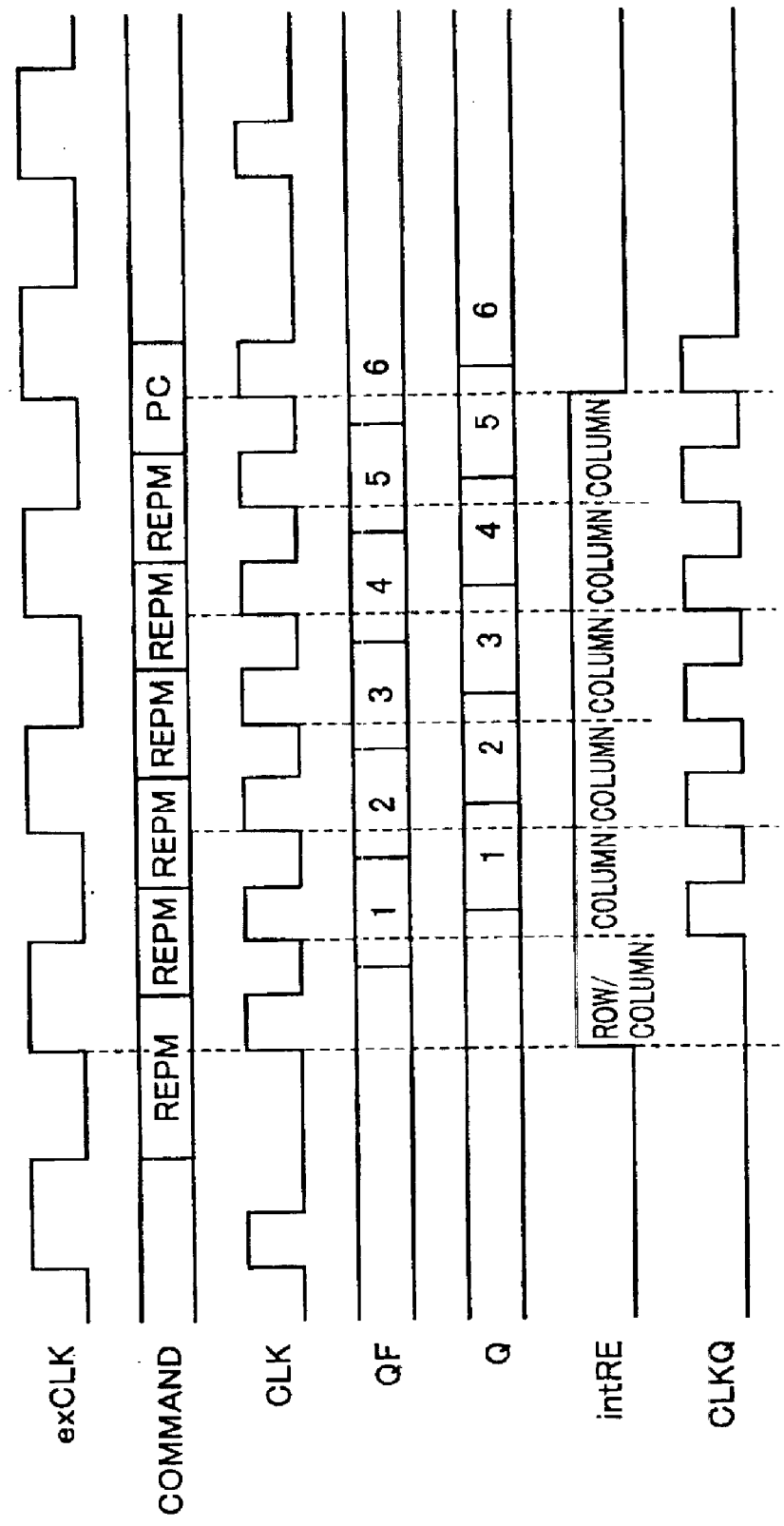
FIG. 45 is a timing chart representing a page mode read operation of the pseudo-SRAM according to the fifth embodiment of the invention.

FIG. 45 is a timing chart representing a page mode read operation at a double data rate. FIG. 45 shows internal clock signal CLK and output clock signal CLKQ. Output clock signal CLKQ is produced from the output clock producing circuit shown in FIG. 27. Internal clock signal CLK is produced from the internal clock generating circuit shown in FIG. 42.

In the operation sequence represented in FIG. 45, page mode read command REPM is repetitively applied. When page mode read command REPM is first applied, internal read operation instructing signal intRE is activated in accordance with the rising of clock signal CLK. In and after this clock cycle, internal clock signal CLK shown in FIG. 42 is produced at the double data rate. Read clock signal CLKQ is produced from this internal clock signal CLK with a delay of one clock cycle of internal clock signal CLK (see FIG. 27). In accordance with the first page mode read command REPM, the page selection (row selection) and column selection are internally performed. The internal read data is read out within half a clock cycle of external clock signal exCLK, and the state of internal read latch data QF is made definite before the rising edge of internal clock signal CLK. In response to each subsequent page mode read command REPM, only the column selecting operation is performed. Therefore, in the column selection operation, it is not necessary to wait for the completion of the row selecting operation, and page mode column-related trigger signal CASTpm is produced in accordance with the clock signal and delayed internal page mode signal intPM1. The operation period of the row-related circuitry is used as the precharge time for the column-related circuitry. One clock cycle period of internal clock signal CLK is utilized as a period for activating and deactivating the column-related circuitry. Even when the precharging of the column-related circuitry is performed in the next cycle, it is merely required to activate the page mode column-related trigger signal CASTpm after completion of the precharging, to allow a new column selecting operation.

In each cycle of internal clock signal CLK, the state of internal read latch data QF is made definite before the rising edge of internal clock signal CLK in accordance with page mode read command REPM, and external read data Q can be produced at the double data rate in accordance with read clock signal CLKQ.

In the final cycle, precharge command PC is applied, whereby internal read operation instructing signal intRE attains the L level, and generation of read clock signal CLKQ stops after read clock signal CLKQ is produced. Therefore, after the data to be read in accordance with the final page mode read command REPM is outputted, the output circuit stops the data read operation.

In the column selecting operation, as shown in FIG. 45, when output data QF of the latch circuit latching the output data of the preamplifier is in the definite state within a period of half a clock cycle of external clock signal exCLK, the circuits already described can be used to operate at the double data rate in the page mode. In this case, CAS latency is 0.5 with respect to external clock signal exCLK.

When an auto-precharge command (precharge read command) is applied in the final cycle of the page mode, it may be considered that page close instructing signal PC may deactivate negative-clock enable signal NEGen in accordance with the falling of internal clock signal CLK in the same cycle, and accordingly the data corresponding to this precharge read command could not be transferred externally. In this case, in the negative-clock signal generating portion shown in FIG. 42, a further D flip-flop is arranged at the output of D flip-flop 152 for taking in the output signal of D flip-flop 152 in synchronization with the rising of internal clock signal CLK for transference to OR gate 153. Thereby, even when the auto-precharge command is applied, all the data can be accurately transferred at the double data rate, and the internal row-related circuitry and column-related circuitry can be made to return to the precharge state.

When the row and column selecting operations are performed with fast external clock signal exCLK, a time required till definition of the output data (i.e., latch data QF) of the preamplifier might become longer than half the cycle of external clock signal exCLK. In this case, the following access sequence is utilized.

The column-related circuitry completes the operation within one clock cycle of the internal clock signal even if the internal clock signal is a high speed clock. Even in the page mode operation, page mode column-related trigger signal CASTpm is activated taking into account the timing of activation of sense amplifier activation timing signal in the normal operation. In each clock cycle, therefore, internal read latch data QF is made definite after the rising of internal clock signal CLK. Accordingly, external read data Q is output with a delay of one clock cycle of internal clock signal CLK, as compared with the timing represented in FIG. 45. Therefore, the column latency is equal to one with respect to external clock signal exCLK. Therefore, deactivation of negative-clock enable signal NEGen is delayed by one clock cycle, and read clock signal CLKQ is produced with a delay of one clock cycle of the internal clock signal, relative to the timing shown in FIG. 45.

Negative-clock enable signal NEGen and internal read clock signal CLKQ are produced in accordance with the column latency so that the internal data can be accurately transferred in synchronization with the fast clock signal.

In the above configuration, the four-phase clock signals are produced utilizing the PLL. However, for the circuit for producing reference clock signal CLKr for the four-phase clock signals, a phase synchronization circuit of any configuration can be employed, provided that it can produce a clock signal of a duty ratio of 50%. Instead of the voltage controlled oscillation circuit, it is possible to use a current controlled oscillation circuit having an operation current thereof adjusted in accordance with a phase difference.

In the data write operation, the page mode write command is likewise applied, and write clock signal CLKD is produced in accordance with internal clock signal CLK, whereby the data can be written at the double data rate.

According to the fifth embodiment of the invention, as described above, the operation in the page mode is performed at the double data rate so that the data access can be performed at high speed with reduced average power consumption.

The PLL is used to produce the four-phase clock signals, and internal clock signal CLK for the double data rate is produced utilizing these four-phase clock signals. Accordingly, it is possible to produce the internal clock signal having an H level period of a quarter of the cycle period of external clock signal exCLK, in both the operations at the double data rate mode and the normal mode. In the double data rate operation, the internal clock signal can be produced at the duty ratio of 50% so that the data can be transferred fast and stably.

The pseudo-SRAM according to the invention employs the DRAM cells as the memory cells. For the DRAM cell, a cell construction of a single cell mode DRAM, in which one memory cell stores one bit of data, or a cell construction of a DRAM, in which two DRAM cells stores one bit of data.

In the system LSI, it is merely required to integrate at least the logic and the pseudo-SRAM on a semiconductor chip, and other unit, such as an analog/digital converting circuit and a nonvolatile semiconductor memory device, may be integrated on the same semiconductor chip.

According to the invention, as described above, the page mode command as well as the precharge command or auto-precharge command are prepared for the pseudo-SRAM, and the pseudo-SRAM can be operated in the page mode. Accordingly, it is not necessary to charge and discharge both the row-related circuitry and column-related circuitry in each clock cycle, and therefore the average power consumption can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device operating like a static memory, comprising:
    a plurality of dynamic memory cells arranged in rows and columns;
    signal input circuitry taking in an external operation control signal in synchronization with a basic clock signal, and producing an internal operation instructing signal;
    row select circuitry for selecting, when activated, a row of the memory cells in accordance with an external row address signal;
    column-related circuitry for selecting, when activated, a column of the memory cells in accordance with an external column address signal, and performing data access to a selected column; and
    control circuitry operating for activating and deactivating sequentially said row select circuitry and said column-related circuitry in a predetermined sequence in accordance with a first internal operation instructing signal provided from said signal-input circuitry, for inhibiting deactivation of said row select circuitry to maintain said row select circuitry in an active state in accordance with a second internal operation instructing signal provided from said signal input circuitry, and for deactivating said row select circuitry maintained in the active state in accordance with a third internal operation instructing signal provided from said signal input circuitry.

2. The synchronous semiconductor memory device according to claim 1, wherein
    said external operation control signal includes a write instructing signal instructing data writing, a read instructing signal instructing data reading, a page mode instructing signal instructing a page mode operation, and a precharge instructing signal instructing completion of the page mode operation; and
    said signal input circuitry activates said first internal operation instructing signal in accordance with said write instructing signal and said read instructing signal, activates said second internal operation instructing signal when said page mode instructing signal is active, and activates said third internal operation instructing signal in accordance with said precharge instructing signal.

3. The synchronous semiconductor memory device according to claim 2, wherein
    said precharge instructing signal is solely activated.

4. The synchronous semiconductor memory device according to claim 2, wherein
    said precharge instructing signal is activated together with one of said write instructing signal and said read instructing signal.

5. The synchronous semiconductor memory device according to claim 1, further comprising:
    a mode setting circuit for storing data setting said second internal operation instructing signal to either of a valid state and an invalid state.

6. The synchronous semiconductor memory device according to claim 1, further comprising:
    an internal clock producing circuit for producing an internal clock signal having a doubled frequency of said basic clock signal when said second internal operation instructing signal is active, and
    said control circuitry activates said column-related circuitry in accordance with said internal clock signal.

7. The synchronous semiconductor memory device according to claim 6, wherein
    said internal clock producing circuit produces, as said internal clock signal, a pulse signal of a predetermined time width in response to rising and falling of said basic clock signal when said second internal operation instructing signal is active.

8. The synchronous semiconductor memory device according to claim 6, wherein
    said internal clock producing circuit includes
    a synchronous clock producing circuit for producing four-phase clock signals of four phases synchronized with said basic clock signal and shifted in phase by a quarter of a cycle period from each other,
    a clock combining circuit for producing two-phase clock signals of two phases by combining two clock signals identical in phase and shifted in phase by a quarter of the cycle period for each two clock signals included in said four-phase clock signals of four phases,
    a clock control circuit responsive to deactivation of said second internal operation instructing signal, for inhibiting production of a one-phase clock signal of one phase of the two phases of the two-phase clock signals, and
    a clock output circuit producing said internal clock signal in accordance with output signals of said clock combining circuit.

9. The synchronous semiconductor memory device according to claim 1, wherein
    said control circuitry includes a row-related activation control circuit for activating said row select circuitry in accordance with said first internal operation instructing signal, a cycle precharge control circuit for producing a first precharge triggering signal in accordance with a predetermined output control signal of said row-related activation control circuit, a page precharge control circuit for producing a second precharge triggering signal in accordance with said third internal operation instructing signal, a trigger switch circuit for selecting one of the first and second precharge triggering signals in accordance with said second internal operation instructing signal, to provide a precharge instruction signal to said row-related activation control circuit, said row-related activation control circuit deactivating said row select circuitry in response to activation of said precharge instructing signal, and a column-related activation control circuit for activating and subsequently deactivating said column-related circuitry in response to said predetermined control signal provided from said row-related activation control signal, said second internal operation instructing signal and said first internal operation instructing signal.

10. The synchronous semiconductor memory device according to claim 1, wherein said plurality of memory cells are is divided into a plurality of banks, and said control circuitry controls an operation instructed by the internal operation instructing signal provided from said signal input circuitry for a bank designated in accordance with a bank address signal designating the bank.

* * * * *